(12) United States Patent
Agrawal et al.

(10) Patent No.: US 6,181,163 B1
(45) Date of Patent: Jan. 30, 2001

(54) FPGA INTEGRATED CIRCUIT HAVING EMBEDDED SRAM MEMORY BLOCKS AND INTERCONNECT CHANNEL FOR BROADCASTING ADDRESS AND CONTROL SIGNALS

(75) Inventors: Om P. Agrawal, Los Altos; Herman M. Chang, Cupertino; Bradley A. Sharpe-Geisler; Bai Nguyen, both of San Jose, all of CA (US)

(73) Assignee: Vantis Corporation, San Jose, CA (US)

( * ) Notice: Under 35 U.S.C. 154(b), the term of this patent shall be extended for 0 days.

(21) Appl. No.: 09/235,351

(22) Filed: Jan. 21, 1999

(51) Int. Cl.[7] .................................................. H03K 19/177
(52) U.S. Cl. ................................................ 326/41; 326/39
(58) Field of Search .......................................... 326/37–41

(56) References Cited

U.S. PATENT DOCUMENTS 5,550,782   8/1996  Cliff et al. ...................... 365/230.03
5,744,980   4/1998  McGowan et al. ....................... 326/40
6,046,603 * 4/2000  New ........................................ 326/41
6,049,223 * 4/2000  Lytle et al. ............................ 326/41

FOREIGN PATENT DOCUMENTS

WO 98/10517   12/1998   (WO) ........................ H03K/19/177

* cited by examiner

Primary Examiner—Michael Tokar
Assistant Examiner—Don Phu Le
(74) Attorney, Agent, or Firm—Fliesler, Dubb, Meyer & Lovejoy LLP

(57) ABSTRACT

A field-programmable gate array device (FPGA) having plural rows and columns of logic function units (VGB's) further includes a plurality of embedded memory blocks, where each memory block is embedded in a corresponding row of logic function units. Each embedded memory block has an address port for capturing received address signals and a controls port for capturing supplied control signals. Interconnect resources are provided including a Memory Controls-conveying Interconnect Channel (MCIC) for conveying shared address and control signals to plural ones of the memory blocks on a broadcast or narrowcast basis.

17 Claims, 27 Drawing Sheets

FPGA INTEGRATED CIRCUIT HAVING EMBEDDED SRAM MEMORY BLOCKS AND INTERCONNECT CHANNEL FOR BROADCASTING ADDRESS AND CONTROL SIGNALS

BACKGROUND

1. Field of the Invention

The invention is generally directed to integrated circuits, more specifically to on-chip memory provided for run-time use with on-chip logic circuits. The invention is yet more specifically directed to on-chip memory provided for run-time use within Programmable Logic Devices (PLD's), and even more specifically to a subclass of PLD's known as Field Programmable Gate Arrays (FPGA's).

2a. Cross Reference to Related Applications

The following copending U.S. patent applications are owned by the owner of the present application, and their disclosure are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) (A) Ser. No. 08/996,049 filed Dec. 22, 1997 by Om P. Agrawal et al and originally entitled, DUAL PORT SRAM MEMORY FOR RUN-TIME USE IN FPGA INTEGRATED CIRCUITS;

(C) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(D) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(E) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(F) Ser. No. 08/995,612 filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";

(G) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";

(H) Ser. No. 09/235,356 filed concurrently herewith, by inventors Bai Nguyen et al and entitled, MULTI-PORT SRAM CELL ARRAY HAVING PLURAL WRITE PATHS INCLUDING FOR WRITING THROUGH ADDRESSABLE PORT AND THROUGH SERIAL BOUNDARY SCAN;

(I) Ser. No. 09/008,762 filed Jan. 19, 1998 by inventors Om Agrawal et al and entitled, SYNTHESIS-FRIENDLY ARCHITECTURE WITH VARIABLE LENGTH AND VARIABLE TIMING INTERCONNECT; and (J) Ser. No. 09/235,615 filed concurrently herewith by inventors inventors Om Agrawal et al and entitled, FPGA INTEGRATED CIRCUIT HAVING EMBEDDED SRAM MEMORY BLOCKS WITH REGISTERED ADDRESS AND DATA INPUT SECTIONS.

2c. Cross Reference to Related Patents

The disclosures of the following U.S. patents are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

3. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a paradigm known as Complex PLD's or CPLD's. This paradigm is characterized by devices such as the Advanced Micro Devices MACH™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.).

Another evolutionary chain in the art of field programmable logic has branched out along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA device can be characterized as an integrated circuit that has four major features as follows.

(1) A user-accessible, configuration-defining memory means, such as SRAM, EPROM, EEPROM, anti-fused, fused, or other, is provided in the FPGA device so as to be at least once-programmable by device users for defining user-provided configuration instructions. Static Random Access Memory or SRAM is of course, a form of reprogrammable memory that can be differently programmed many times. Electrically Erasable and rePro-grammable ROM or EEPROM is an example of nonvolatile reprogrammable memory. The configuration-defining memory of an FPGA device can be formed of mixture of different kinds of memory elements if desired (e.g., SRAM and EEPROM).

(2) Input/Output Blocks (IOB's) are provided for interconnecting other internal circuit components of the FPGA device with external circuitry. The IOB's' may have fixed configurations or they may be configurable in accordance with user-provided configuration instructions stored in the configuration-defining memory means.

(3) Configurable Logic Blocks (CLB's) are provided for carrying out user-programmed logic functions as defined by user-provided configuration instructions stored in the configuration-defining memory means. Typically, each of the many CLB's of an FPGA has at least one lookup table (LUT) that is user-configurable to define any desired truth table,—to the extent allowed by the address space of the LUT. Each CLB may have other resources such as LUT input signal pre-processing resources and LUT output signal post-processing resources. Although the term 'CLB' was adopted by early pioneers of FPGA technology, it is not uncommon to see other names being given to the repeated portion of the FPGA that carries out user-programmed logic functions. The term, 'LAB' is used for example in U.S. Pat. No. 5,260,611 to refer to a repeated unit having a 4-input LUT.

(4) An interconnect network is provided for carrying signal traffic within the FPGA device between various CLB's and/or between various IOB's and/or between various IOB's and CLB's. At least part of the interconnect network is typically configurable so as to allow for programmably-defined routing of signals between various CLB's and/or IOB's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect. A version of hard wired interconnect wherein a given conductor is dedicatedly connected to be always driven by a particular output driver, is sometimes referred to as 'direct connect'.

In addition to the above-mentioned basic components, it is sometimes desirable to include on-chip reprogrammable memory that is embedded between CLB's and available for run-time use by the CLB's and/or resources of the FPGA for temporarily holding storage data. This embedded run-time memory is to be distinguished from the configuration memory because the latter configuration memory is generally not reprogrammed while the FPGA device is operating in a run-time mode. The embedded run-time memory may be used in speed-critical paths of the implemented design to implement, for example, FIFO or LIFO elements that buffer data words on a first-in/first-out or last-in/first-out basis. Read/write speed, data validating speed, and appropriate interconnecting of such on-chip embedded memory to other resources of the FPGA can limit the ability of a given FPGA architecture to implement certain speed-critical designs.

Modern FPGA's tend to be fairly complex. They typically offer a large spectrum of user-configurable options with respect to how each of many CLB's should be configured, how each of many interconnect resources should be configured, and how each of many IOB's should be configured. Rather than determining with pencil and paper how each of the configurable resources of an FPGA device should be programmed, it is common practice to employ a computer and appropriate FPGA-configuring software to automatically generate the configuration instruction signals that will be supplied to, and that will cause an unprogrammed FPGA to implement a specific design.

FPGA-configuring software typically cycles through a series of phases, referred to commonly as 'partitioning', 'placement', and 'routing'. This software is sometimes referred to as a 'place and route' program. Alternate names may include, 'synthesis, mapping and optimization tools'.

In the partitioning phase, an original circuit design (which is usually relatively large and complex) is divided into smaller chunks, where each chunk is made sufficiently small to be implemented by a single CLB, the single CLB being a yet-unspecified one of the many CLB's that are available in the yet-unprogrammed FPGA device. Differently designed FPGA's can have differently designed CLB's with respective logic-implementing resources. As such, the maximum size of a partitioned chunk can vary in accordance with the specific FPGA device that is designated to implement the original circuit design. The original circuit design can be specified in terms of a gate level description, or in Hardware Descriptor Language (HDL) form or in other suitable form.

After the partitioning phase is carried out, each resulting chunk is virtually positioned into a specific, chunk-implementing CLB of the designated FPGA during a subsequent placement phase.

In the ensuing routing phase, an attempt is made to algorithmically establish connections between the various chunk-implementing CLB's of the FPGA device, using the interconnect resources of the designated FPGA device. The goal is to reconstruct the original circuit design by reconnecting all the partitioned and placed chunks.

If all goes well in the partitioning, placement, and routing phases, the FPGA configuring software will find a workable 'solution' comprised of a specific partitioning of the original circuit, a specific set of CLB placements and a specific set of interconnect usage decisions (routings). It can then deem its mission to be complete and it can use the placement and routing results to generate the configuring code that will be used to correspondingly configure the designated FPGA.

In various instances, however, the FPGA configuring software may find that it cannot complete its mission successfully on a first try. It may find, for example that the initially-chosen placement strategy prevents the routing phase from completing successfully. This might occur because signal routing resources have been exhausted in one or more congested parts of the designated FPGA device. Some necessary interconnections may have not been completed through those congested parts. Alternatively, all necessary interconnections may have been completed, but the FPGA configuring software may find that simulation-predicted performance of the resulting circuit (the so-configured FPGA) is below an acceptable threshold. For example, signal propagation time may be too large in a speed-critical part of the FPGA-implemented circuit. More specifically, certain address and/or other control signals may need to be broadcast from one section of the FPGA to a plurality of other sections according to a particular sequence and architectural constraints of the FPGA device may impede this from happening in an efficient manner in so far as resource utilization is concerned.

Given this, if the initial partitioning, placement and routing phases do not provide an acceptable solution, the FPGA configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the FPGA-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. FPGA configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the FPGA configuring software a significant amount of time to find a workable solution. Turn around time can take more than 8 hours.

In some instances, even after having spent a large amount of time trying to find a solution for a given FPGA-implementation problem, the FPGA configuring software may fail to come up with a workable solution and the time spent becomes lost turn-around time. It may be that, because of packing inefficiencies, the user has chosen too small an FPGA device for implementing too large of an original circuit.

Another possibility is that the internal architecture of the designated FPGA device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. Another example is 'control logic' which is less random than fully 'random logic' but less regular than 'bus oriented' designs. There may be many more taxonomical descriptions. The point being made here is that some FPGA structures may be better suited for implementing random logic while others may be better suited for implementing bus oriented designs or other kinds of designs. In cases where embedded memory is present, the architecture of the embedded memory can play an important role in determining how well a given taxonomically-distinct design is accommodated. Compatibility between the embedded memory architecture and the architecture of intertwined CLB's and interconnect can also play an important role in determining how well a given taxonomically-distinct design is accommodated.

If after a number of tries, the FPGA configuring software fails to find a workable solution, the user may choose to try again with a differently-structured FPGA device. The user may alternatively choose to spread the problem out over a larger number of FPGA devices, or even to switch to another circuit implementing strategy such as CPLD or ASIC (where the latter is an Application Specific hardwired design of an IC). Each of these options invariably consumes extra time and can incur more costs than originally planned for.

FPGA device users usually do not want to suffer through such problems. Instead, they typically want to see a fast turnaround time of no more than, say 4 hours, between the time they complete their original circuit design and the time a first-run FPGA is available to implement and physically test that design. More preferably, they would want to see a fast turnaround time of no more than, say 30 minutes, for successful completion of the FPGA configuring software when executing on a 80486-80686 PC platform (that is, a so-commercially specified, IBM compatible personal computer) and implementing a 25000 gate or less, design in a target FPGA device.

FPGA users also usually want the circuit implemented by the FPGA to provide an optimal emulation of the original design in terms of function packing density, cost, speed, power usage, and so forth irrespective of whether the original design is taxonomically describable generally as 'random logic', or as 'bus oriented', 'memory oriented', or as a combination of these, or otherwise.

When multiple FPGA's are required to implement a very large original design, high function packing density and efficient use of FPGA internal resources are desired so that implementation costs can be minimized in terms of both the number of FPGA's that will have to be purchased and the amount of printed circuit board space that will be consumed.

Even when only one FPGA is needed to implement a given design, a relatively high function packing density is still desirable because it usually means that performance speed is being optimized due to reduced wire length. It also usually means that a lower cost member of a family of differently sized FPGA's can be selected or that unused resources of the one FPGA can be reserved for future expansion needs.

In summary, end users want the FPGA configuring software to complete its task quickly and to provide an efficiently-packed, high-speed compilation of the functionalities provided by an original circuit design irrespective of the taxonomic organization of the original design.

In the past, it was thought that attainment of these goals was primarily the responsibility of the computer programmers who designed the FPGA configuring software. It has been shown however, that the architecture or topology of the unprogrammed FPGA can play a significant role in determining how well and how quickly the FPGA configuring software completes the partitioning, placement, and routing tasks.

As indicated above, the architectural layout, implementation, and use of on-chip embedded memory can also play a role in how well the FPGA configuring software is able to complete the partitioning, placement and routing tasks with respect to using embedded memory; and also how well the FPGA-implemented circuit performs in terms of propagating signals into, through and out of the on-chip embedded memory.

SUMMARY OF INVENTION

An improved FPGA device in accordance with the invention includes one or more columns of SRAM blocks for holding run-time storage data and a respective one or more special interconnect channels extending in the columnar direction adjacent to a respective column of SRAM blocks for broadcasting address and/or other memory-related control signals to all or a subset of the corresponding column of SRAM blocks.

In accordance with the invention, each SRAM block in the column of SRAM blocks has at least a first port (Port_1) by way of which the SRAM block can receive respective first address signals and can respond to the first address signals by performing at least one of a write operation wherein write data is directed to an address-defined first area of the SRAM block and a read operation wherein read data is fetched from an address-defined second area of the SRAM block.

The bits of the address signals that drive the first port (Port_1) of each SRAM block generally come from a respective set of address-sourcing circuits. One example is a set of registers and logic blocks that define an up/down counter. Such address-sourcing circuits may be situated in different parts of the FPGA array that are either far away from, or relatively closer to each respective SRAM block that is to receive the address signal. As such, it is necessary to provide some means for conveying the address signals from their respective points of origin (the address-sourcing circuits) to their desired destinations (the driven SRAM blocks).

In accordance with the invention, a special interconnect configuration is provided to extend adjacent to a respective column or row of SRAM blocks for conveying address and/or other control signals to the respective address and control receiving terminals of the SRAM blocks in the respective column or row.

In one embodiment, special, vertical interconnect channels (SVIC's) are provides adjacent to embedded SRAM columns for supplying address signals, address-validating strobe signals and data-validating strobe signals to the SRAM blocks as well as providing additional control signals. The control signals may be broadcast via special longlines (SMaxL lines) to all SRAM blocks of the given column or they may be conveyed in a more localized fashion to subsets of the SRAM blocks of the given column by using shorter special vertical lines (S4×L lines).

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1A:
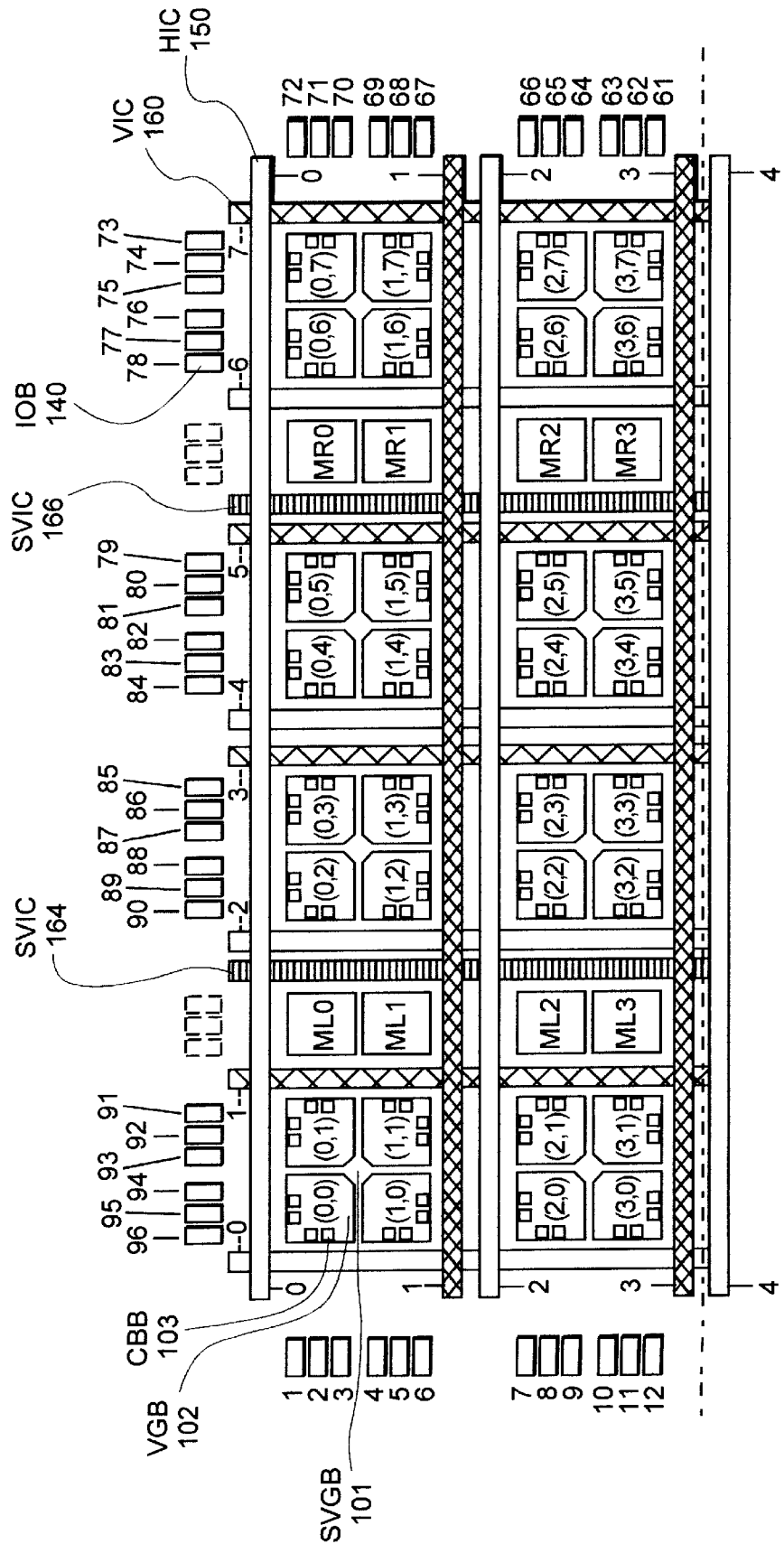
FIG. 1 illustrates a first FPGA having an 8×8 matrix of VGB's (Variable Grain Blocks) with an embedded left memory column (LMC) and an embedded right memory column (RMC) in accordance with the invention.
Figure 1B:
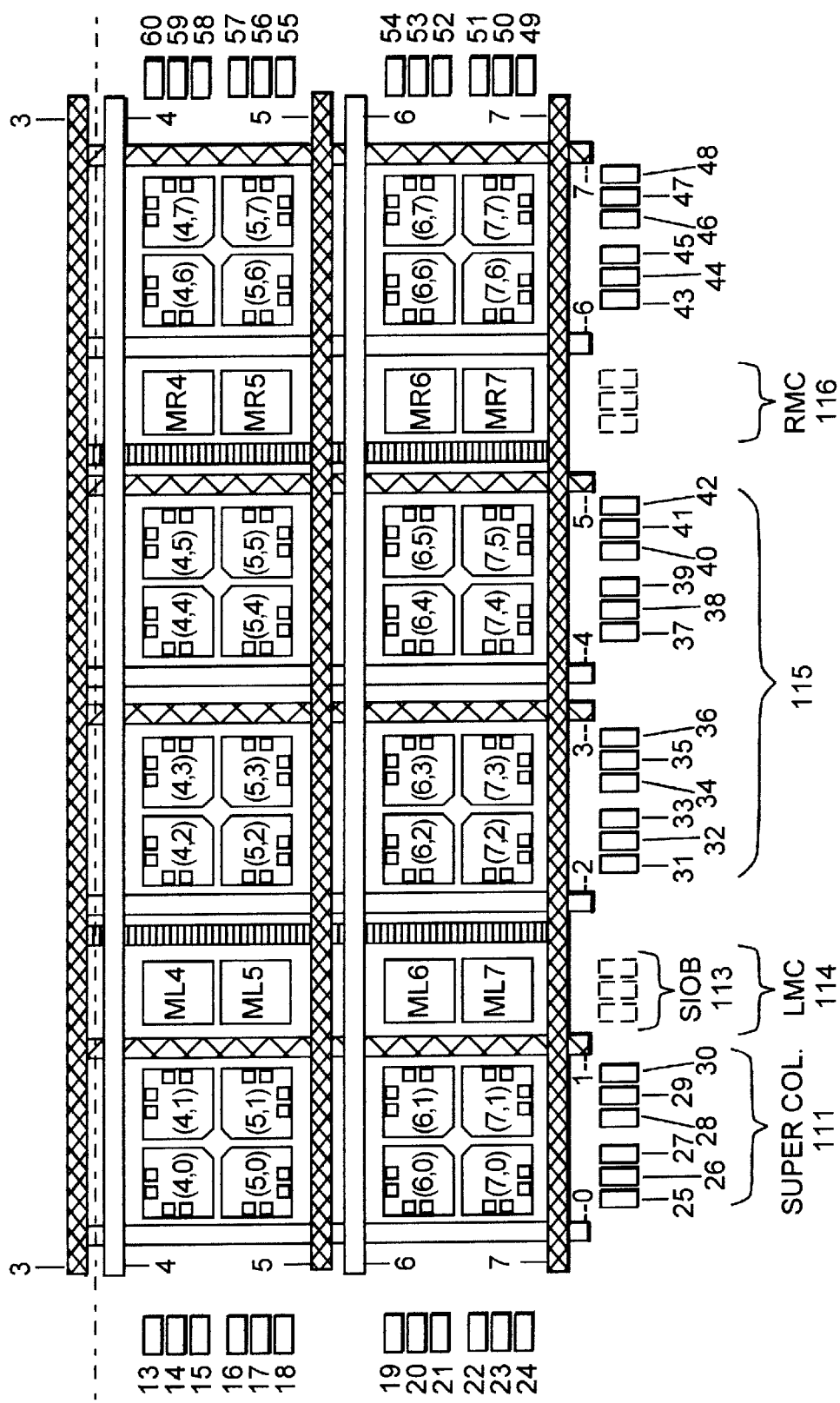

FIG. 1 shows a macroscopic view of an FPGA device 100 in accordance with the invention. The illustrated structure is preferably formed as a monolithic integrated circuit.

The macroscopic view of FIG. 1 is to be understood as being taken at a magnification level that is lower than later-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity. Similarly, the illustration herein of a sample macroscopic view does not limit the possible embodiments into which a microscopically viewed embodiment might be included.

FPGA device 100 comprises a regular matrix of super structures defined herein as super-VGB's (SVGB's). In the illustrated embodiment, a dashed box(upper left corner) circumscribes one such super-VGB structure which is referenced as 101. There are four super-VGB's shown in each super row of FIG. 1 and also four super-VGB's shown in each super column. Each super row or column contains plural rows or columns of VGB's. One super column is identified as an example by the braces at 111. Larger matrices with more super-VGB's per super column and/or super row are of course contemplated. FIG. 1 is merely an example.

There is a hierarchy of user-configurable resources within each super-VGB. At a next lower level, each super-VGB is seen to contain four VGB's. In the illustrated embodiment, identifier 102 points to one such VGB within SVGB 101.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 103 points to one such CBB within VGB 102.

At a next lower level, each CBB has its own hierarchy of user configurable resources. Some of these (e.g., a CSE) will be shown in later figures. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, VARIABLE GRAIN ARCHITECTURE FOR FPGA INTEGRATED CIRCUITS, whose disclosure is incorporated herein by reference.

It is sufficient for the present to appreciate that each CBB includes a clocked flip flop and that each CBB is capable of producing at least one bit of result data and/or storing one bit of data in its flip flop and/or of outputting the stored and/or result data to adjacent interconnect lines. Each VGB (102) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 101).

With respect to the adjacent interconnect lines (AIL's), each SVGB is bounded by two horizontal and two vertical interconnect channels (HIC's and VIC's). An example of a HIC is shown at 150. A sample VIC is shown at 160. Each such interconnect channel contains a diverse set of interconnect lines as will be seen later.

The combination of each SVGB (e.g., 101) and its surrounding interconnect resources (of which resources, not all are shown in FIG. 1) is referred to as a matrix tile. Matrix tiles are tiled one to the next as seen, with an exception occurring about the vertical sides of the two central, super columns, 115. Columns 114 (LMC) and 116 (RMC) of embedded memory are provided along the vertical sides of the central pair 115 of super columns. These columns 114, 116 will be examined in closer detail shortly.

From a more generalized perspective, the tiling of the plural tiles creates pairs of adjacent interconnect channels within the core of the device 100. An example of a pair of adjacent interconnect channels is seen at HIC's 1 and 2. The peripheral channels (HIC0, HIC7, VIC0, VIC7) are not so paired. Switch matrix boxes (not shown, see FIG. 2) are provided at the intersections of the respective vertical and horizontal interconnect channels. The switch matrix boxes form part of each matrix tile construct that includes a super-VGB at its center. See area 465 of FIG. 3.

The left memory column (LMC) 114 is embedded as shown to the left of central columns pair 115. The right memory column (RMC) 116 is further embedded as shown to the right of the central columns pair 115. It is contemplated to have alternate embodiments with greater numbers of such embedded memory columns symmetrically distributed in the FPGA device and connected in accordance with the teachings provided herein for the illustrative pair of columns, 114 and 116. It is also possible to additionally have embedded rows of such embedded memory extending horizontally.

Within the illustrated LMC 114, a first, special, vertical interconnect channel (SVIC) 164 is provided adjacent to respective, left memory blocks ML0 through ML7. Within the illustrated RMC 164, a second, special, vertical interconnect channel (SVIC) 166 is provided adjacent to respective, right memory blocks MR0 through MR7. Each of the first and second SVIC's is also referred to herein as a Memory Controls-conveying Interconnect Channel (MCIC) for reasons that will be understood below.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 114 or RMC 116. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 has an internal SRAM array organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (102) and/or to the nibble-wise organization of each group of four CBB's that line the side of each SVGB (101). Thus, there is a data-width match between each embedded memory block and each group of four CBB's or VGB. As will be seen a similar kind of data-width matching also occurs within the diversified resources of the general interconnect mesh.

At the periphery of the FPGA device 100, there are three input/output blocks (IOB's) for each row of VGB's and for each column of VGB's. One such IOB is denoted at 140. The IOB's in the illustrated embodiment are shown numbered from 1 to 96. In one embodiment, there are no IOB's directly above and below the LMC 114 and the RMC 116. In an alternate embodiment, special IOB's such as shown in phantom at 113 are provided at the end of each memory column for driving address and control signals into the corresponding memory column.

Each trio of regular IOB's at the left side (1–24) and the right side (49–72) of the illustrated device 100 may be user-configured to couple data signals to the nearest HIC. Similarly, each trio of regular IOB's on the bottom side (25–48) and top side (73–96) may be user-configured for exchanging input and/or output data signals with lines inside the nearest corresponding VIC. The SIOB's (e.g., 113), if present, may be user-configured to exchange signals with the nearest SVIC (e.g., 164). Irrespective of whether the SIOB's (e.g., 113) are present, data may be input and/or output from points external of the device 100 to/from the embedded memory columns 114, 116 by way of the left side IOB's (1–24) and the right side IOB's (49–72) using longline coupling, as will be seen below. The longline coupling allows signals to move with essentially same speed and connectivity options from/to either of the left or right side IOB's (1–24, 49–72) respectively to/from either of the left or right side memory columns.

It is sufficient for the present to appreciate that each IOB includes one or more clocked flip flops and that each IOB is capable of receiving at least one bit of external input data from a point outside the FPGA device, and/or outputting at least one bit of external output data to a point outside the FPGA device, and/or storing one bit of input or output data in respective ones of its one or more flip flops, and/or of transferring such external input or output data respectively to or from adjacent interconnect lines. Each set of 24 IOB's that lie adjacent to a corresponding one of the peripheral HIC's and VIC's may therefore transfer in parallel, as many as 24 I/O bits at a time. Such transference may couple to the adjacent one of the peripheral HIC's and VIC's and/or to neighboring VGB's.

Data and/or address and/or control signals may be generated within the FPGA device 100 by its internal VGB's and transmitted to the embedded memory 114, 116 by way of the peripheral and inner HIC's, as will be seen below.

The VGB's are numbered according to their column and row positions. Accordingly, VGB(0,0) is in the top left corner of the device 100; VGB(7,7) is in the bottom right corner of the device 100; and VGB(1,1) is in the bottom right corner of SVGB 101.

Each SVGB (101) may have centrally-shared resources. Such centrally-shared resources are represented in FIG. 1 by the diamond-shaped hollow at the center of each illustrated super-VGB (e.g., 101). Longline driving amplifiers (see FIG. 5) correspond with these diamond-shaped hollows and have their respective outputs coupling vertically and horizontally to the adjacent HIC's and VIC's of their respective super-VGB's.

As indicated above, each super-VGB in FIG. 1 has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB as will be described below. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 114/116. As will be seen, nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by so-called, double-length lines (2×L lines), quad-length lines (4×L lines), octal-length lines (8×L lines) or maximum length longlines (MaxL lines).

In one particular embodiment of the FPGA device, the basic matrix is 10-by-10 SVGB's, with embedded memory columns 114/116 positioned around the central two super columns 115. (See FIG. 2.) In that particular embodiment, the integrated circuit may be formed on a semiconductor die having an area of about 120,000 mils$^2$ or less. The integrated circuit may include five metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have drawn channel lengths of 0.35 microns or 0.25 microns or less. Amplifier output transistors and transistors used for interfacing the device to external signals may be larger, however.

Figure 2:
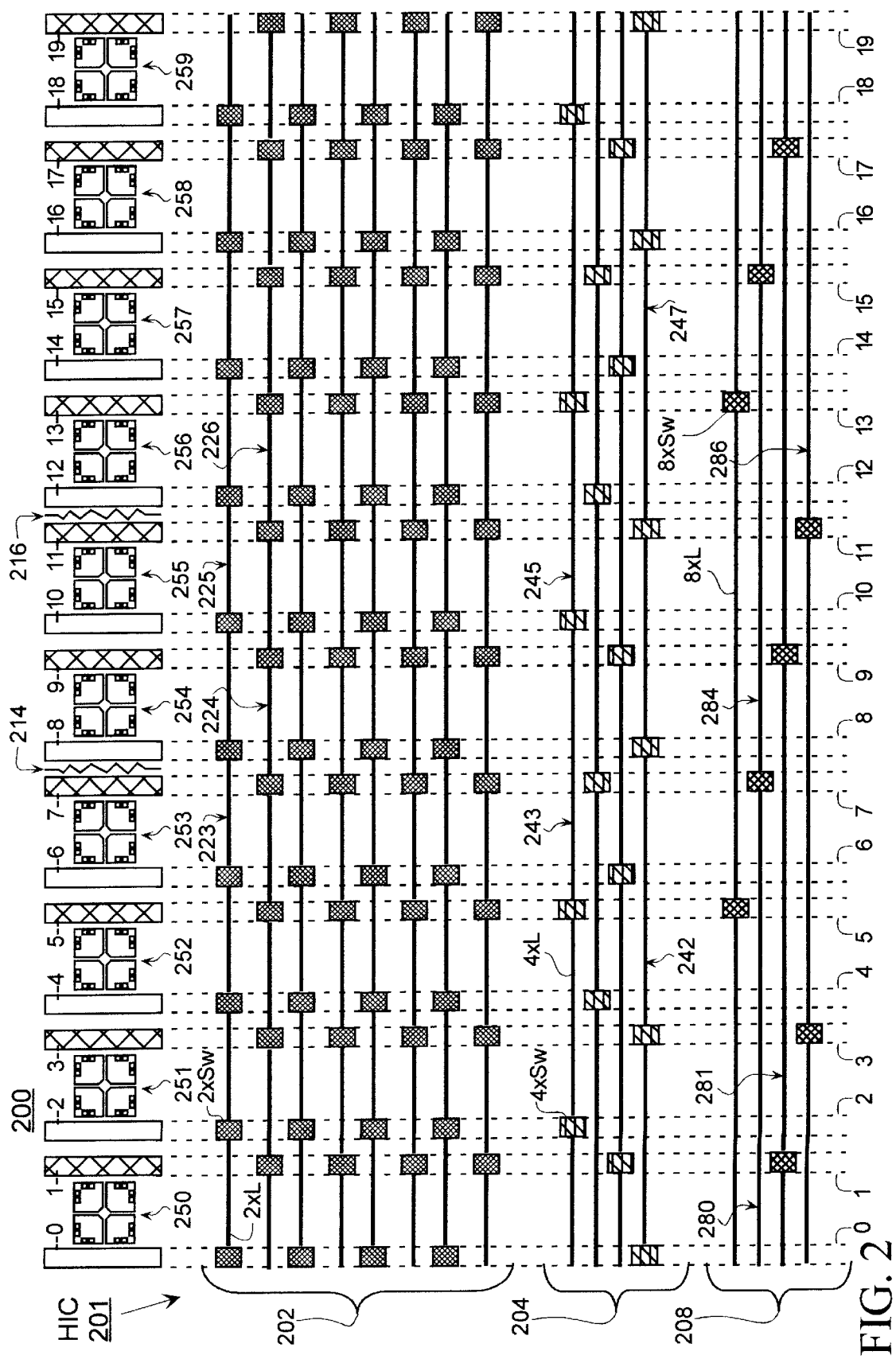
FIG. 2 is a diagram showing the placement of switch boxes along double length, quad length, and octal length lines within normal interconnect channels of another, like FPGA device having a 20×20 matrix of VGB's with embedded LMC and RMC.

As indicated above, the general interconnect channels (e.g., HIC 150, VIC 160 of FIG. 1) contain a diverse set of interconnect lines. FIG. 2 shows a distribution 200 of different-length horizontal interconnect lines (2×L, 4×L, 8×L) and associated switch boxes of a single horizontal interconnect channel (HIC) 201, as aligned relative to vertical interconnect channels in an FPGA of the invention. This particular FPGA has a 10×10 matrix of super-VGB's (or a 20×20 matrix of VGB's). The embedded memory columns (114/116) are not fully shown, but are understood to be respectively embedded in one embodiment, between VIC's 7–8 and 11–12, as indicated by zig-zag symbols 214 and 216.

For an alternate embodiment, symbol 214 may be placed between VIC's 6 and 7 while symbol 216 is placed between VIC's 12 and 13 to indicate the alternate placement of the embedded memory columns 114/116 between said VIC's in the alternate embodiment. For yet another alternate embodiment, zig-zag symbol 214 may be placed between VIC's 8 and 9 while zig-zag symbol 216 is placed between VIC's 10 and 11 to represent corresponding placement of the embedded memory columns 114/116 in the corresponding locations. Of course, asymmetrical placement of the embedded memory columns 114/116 relative to the central pair of SVGB columns (115) is also contemplated. In view of these varying placement possibilities, the below descriptions of which 2×L, 4×L or 8×L line intersects with corresponding columns 214/216 should, of course, be read as corresponding to the illustrated placement of symbols 214 and 216 respectively between VIC's 7–8 and VIC's 11–12 with corresponding adjustments being made if one of the alternate placements of 214/216 is chosen instead.

By way of a general introduction to the subject of interconnect resources, it should be noted that the interconnect mesh of FPGA 100 includes lines having different lengths. It may be said that, without taking into account any length changes created by the imposition of the embedded memory columns 114/116, the horizontally-extending general interconnect channels (HIC's) and vertically-extending general interconnect channels (VIC's) of the FPGA device 100 are provided with essentially same and symmetrically balanced interconnect resources for their respective horizontal (x) and vertical (y) directions. These interconnect resources include a diversified and granulated assortment of MaxL lines, 2×L lines, 4×L lines and 8×L lines as well as corresponding 2×L switch boxes, 4×L switch boxes, and 8×L switch boxes.

In one embodiment, each general channel, such as the illustrated example in FIG. 2 of HIC 201 (the horizontal interconnect channel), contains at least the following resources: eight double-length (2×L) lines, four quad-length (4×L) lines, four octal-length (8×L) lines, sixteen full-length (MaxL) lines, sixteen direct-connect (DC) lines, eight feedback (FB) lines and two dedicated clock (CLK) lines. Vertical ones of the general interconnect channels (VIC s) may contain an additional global reset (GR) longline. Parts of this total of 58/59 lines may be seen in FIGS. 4 and 5 as having corresponding designations AIL0 through AIL57/58 for respective interconnect lines that are adjacent to corresponding VGB's. Not all of the different kinds of lines are shown in FIG. 2. Note that each of the 2×L, 4×L, 8×L and MaxL line sets includes at least four lines of its own kind for carrying a corresponding nibble's worth of data or address or control signals.

In FIG. 2, core channels 1 through 18 are laid out as adjacent pairs of odd and even channels. Peripheral channels 0 and 19 run alone along side the IOB's (see FIG. 1). Although not shown in FIG. 2, it should be understood that each switch box has both horizontally-directed and vertically-directed ones of the respective 2×L, 4×L, and 8×L lines entering into that respective switch box. (See region 465 of FIG. 3.) A given switchbox (X×Sw) may be user-configured to continue a signal along to the next X×L line (e.g., 2×L line) of a same direction and/or to couple the signal to a corresponding same kind of X×L line of an orthogonal direction. A more detailed description of switchboxes for one embodiment may be found in the above-cited, U.S. Ser. No. 09/008,762, filed Jan. 19, 1998 by inventors Om Agrawal et al whose disclosure is incorporated herein by reference.

Group 202 represents the 2×L lines of HIC 201 and their corresponding switch boxes. For all of the 2×L lines, each such line spans the distance of essentially two adjacent VGB's (or one super-VGB). Most 2×L lines terminate at both ends into corresponding 2× switch boxes (2×Sw's). The terminating 2×Sw boxes are either both in even-numbered channels or both in odd-numbered channels. Exceptions occur at the periphery where either an odd or even-numbered channel is nonexistent. As seen in the illustrated embodiment 200, interconnections can be made via switch boxes from the 2×L lines of HIC 201 to any of the odd and even-numbered vertical interconnect channels (VIC's) 0–19.

With respect to the illustrated placement 214/216 of embedded memory columns 114/116, note in particular that 2×L line 223 and/or its like (other, similarly oriented 2×L lines) may be used to provide a short-haul, configurable connection from SVGB 253 (the one positioned to the right of VIC #6) to LMC 214. Similarly, line 224 and its like may be used to provide a short-haul connection from SVGB 254 (the one positioned to the right of VIC #8) to LMC 214. Line 225 and/or its like may be used to provide a short-haul connection from SVGB 255 to RMC 216. Line 226 and/or its like may be used to provide a short-haul connection from SVGB 256 to RMC 216. Such short-haul connections may be useful for quickly transmitting speed-critical signals such as address signals and/or data signals between a nearby SVGB (253–256) and the corresponding embedded memory column 114 or 116.

Group 204 represents the 4×L lines of HIC 201 and their corresponding switch boxes. Most 4×L lines each span the distance of essentially four, linearly-adjacent VGB's and terminate at both ends into corresponding 4× switch boxes (4×Sw's). The terminating 4×Sw boxes are either both in even-numbered channels or both in odd-numbered channels. As seen in the illustrated embodiment 200, interconnections can be made via switch boxes from the 4×L lines of HIC 201 to any of the odd and even-numbered vertical interconnect channels (VIC's) 0–19.

With respect to the illustrated placement 214/216 of embedded memory columns 114/116, note in particular that 4×L line 242 and/or its like (other, similarly oriented 4×L lines that can provide generally similar coupling) may be used to provide a medium-haul configurable connection between LMC 214 and either one or both of SVGB 252 and SVGB 253. Line 243 and/or its like may be used to provide a configurable connection of medium-length between LMC 214 and either one or both of SVGB's 253 and 254. Similarly, line 245 and/or its like may be used to provide medium-length coupling between RMC 216 and either one or both of SVGB's 255 and 256. Moreover, line 247 and/or its like may be used to configurably provide medium-haul interconnection between RMC 216 and either one or both of SVGB's 257 and 256. Such medium-haul interconnections may be useful for quickly propagating address signals and/or data signals in comparatively medium-speed applications.

Group 208 represents the 8×L lines of HIC 201 and their corresponding switch boxes. Most 8×L lines (7 out of 12) each spans the distance of essentially eight, linearly-adjacent VGB's. A fair number of other 8×L lines (5 out of 12) each spans distances less than that of eight, linearly-adjacent VGB's. Each 8×L line terminates at least one end into a corresponding 8× switch box (8×Sw). The terminating 8×Sw boxes are available in this embodiment only in the core odd-numbered channels (1, 3, 5, 7, 9, 11, 13, 15 and 17). Thus, in embodiment 200, interconnections can be made via switch boxes from the 8×L lines of HIC 201 to any of the nonperipheral, odd-numbered vertical interconnect channels (VIC's). It is within the contemplation of the invention to have the 8×Sw boxes distributed symmetrically in other fashions such that even-numbered channels are also covered.

With respect to the illustrated placement 214/216 of embedded memory columns 114/116, note in particular that 8×L line 281 or its like may be used to provide even longer-haul, configurable connection from between LMC 214 and any one or more of SVGB's 251–254. (In one embodiment where 214 places to the left of VIC 7, 8×L line 280 provides configurable interconnection between LMC 214 and any one or more of SVGB's 250–253.) In the illustrated embodiment, 8×L line 282 may be used to provide 8×L coupling between any two or more of: LMC 214 and SVGB's 252–255. Line 283 may be used to provide 8×L coupling between any two or more of: LMC 214, RMC 216, and SVGB's 253–256. Line 284 may be used to provide 8×L coupling between any two or more of: LMC 214, RMC 216, and SVGB's 254–257. Line 285 may be used to provide 8×L coupling between any two or more of: RMC 216 and SVGB's 255–258. Line 286 may be similarly used to provide 8×L coupling between any two or more of: RMC 216 and SVGB's 256–259. Although the largest of the limited-length lines is 8×L in the embodiment of FIG. 2, it is within the contemplation of the invention to further have 16×L lines, 32×L lines and so forth in arrays with larger numbers of VGB's.

In addition to providing configurable coupling between the intersecting memory channel 214 and/or 216, each of the corresponding 2×L, 4×L, 8×L and so forth lines may be additionally used for conveying such signals between their respective switchboxes and corresponding components of the intersecting memory channel.

Referring briefly back to FIG. 1, it should be noted that the two central super columns 115 are ideally situated for generating address and control signals and broadcasting the same by way of short-haul connections to the adjacent memory columns 114 and 116. High-speed data may be similarly conveyed from the memory columns 114/116 to the SVGB's of central columns 115.

Before exploring more details of the architecture of FPGA device 100, it will be useful to briefly define various symbols that may be used within the drawings. Unless otherwise stated, a single line going into a trapezoidal multiplexer symbol is understood to represent an input bus of one or more wires. Each open square box (MIP) along such a bus represents a point for user-configurable acquisition of a signal from a crossing line to the multiplexer input bus. In one embodiment, a PIP (programmable interconnect point) is placed at each MIP occupied intersection of a crossing line and the multiplexer input bus. Each of PIP (which may be represented herein as a hollow circle) is understood to have a single configuration memory bit controlling its state. In the active state the PIP creates a connection between its crossing lines. In the inactive state the PIP leaves an open between the illustrated crossing lines. Each of the crossing lines remains continuous however in its respective direction (e.g., x or y).

PIP's (each of which may be represented herein by a hollow circle covering a crossing of two continuous lines)

may be implemented in a variety of manners as is well known in the art. In one embodiment pass transistors such as MOSFET's may be used with their source and drain respectively coupled to the two crossing lines while the transistor gate is controlled by a configuration memory bit. In an alternate embodiment, nonvolatilely-programmable floating gate transistors may be used with their source and drain respectively coupled to the crossing lines. The charge on the floating gate of such transistors may represent the configuration memory bit. A dynamic signal or a static turn-on voltage may be applied to the control gate of such a transistor as desired. In yet another alternate embodiment, nonvolatilely-programmable fuses or anti-fuses may be provided as PIP's with their respective ends being connected to the crossing lines. One may have bidirectional PIP's for which signal flow between the crossing lines (e.g., 0 and 1) can move in either direction. Where desirable, PIP's can also be implemented with unidirectional signal coupling means such as AND gates, tri-state drivers, and so forth.

Figure 10:
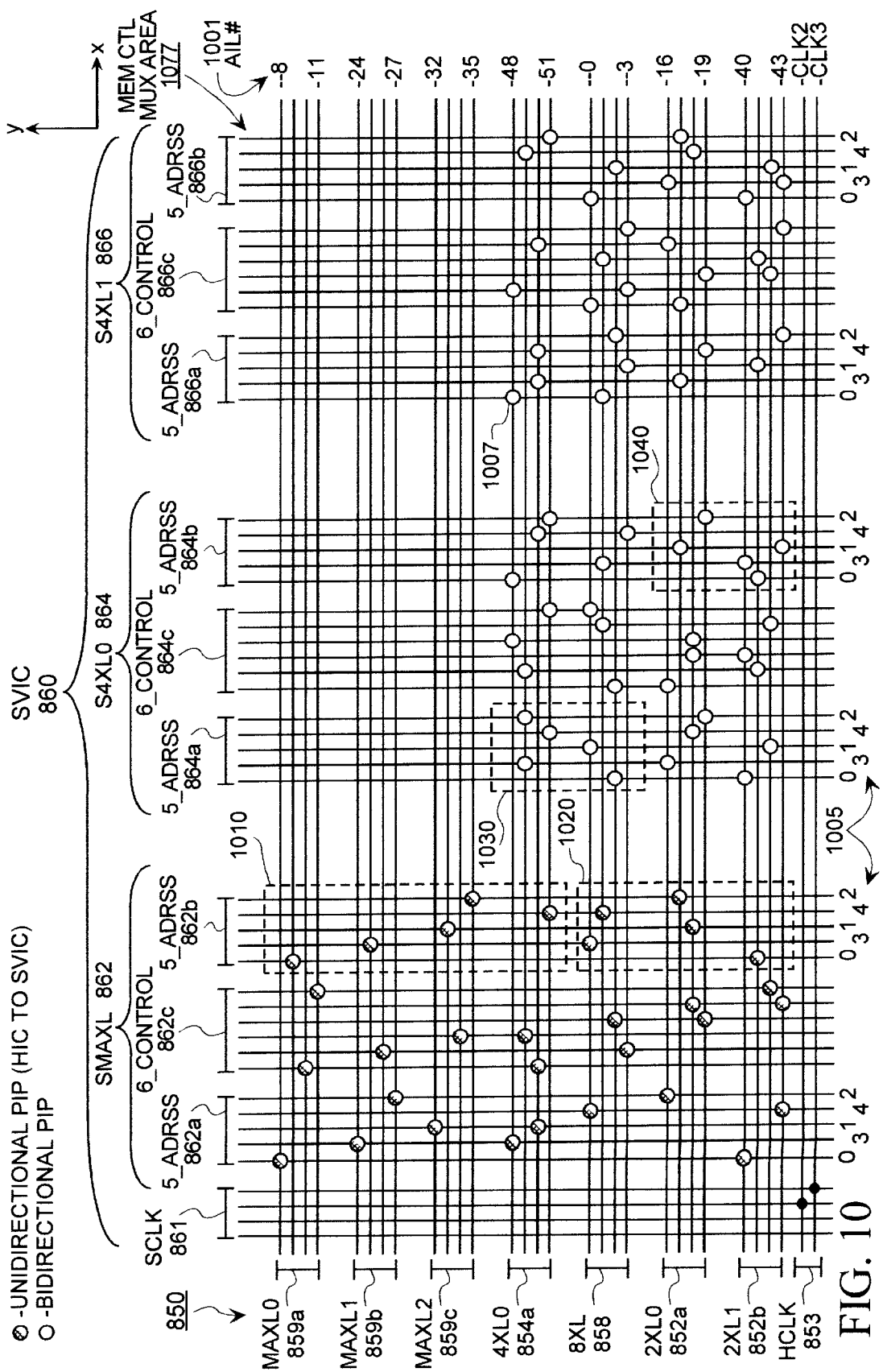
FIG. 10 illustrates an exemplary pattern of PIP's for a controls-acquisition multiplexer area at a crossing of SVIC lines with passing over HIC lines.

An alternate symbol for a group of PIP's is constituted herein by a hollow and tilted ellipse covering a bus such as is seen in FIG. 10.

Another symbol that may be used herein is a hollow circle with an 'X' inside. This represents a POP. POP stands for 'Programmable Opening Point'. Unless otherwise stated, each POP is understood to have a single configuration memory bit controlling its state. In the active state the POP creates an opening between the colinear lines entering it from opposing sides. In the inactive state the POP leaves closed an implied connection between the colinear lines entering it. Possible implementations of POP's include pass transistors and tri-state drivers. Many other alternatives will be apparent to those skilled in the art.

Figure 3A:
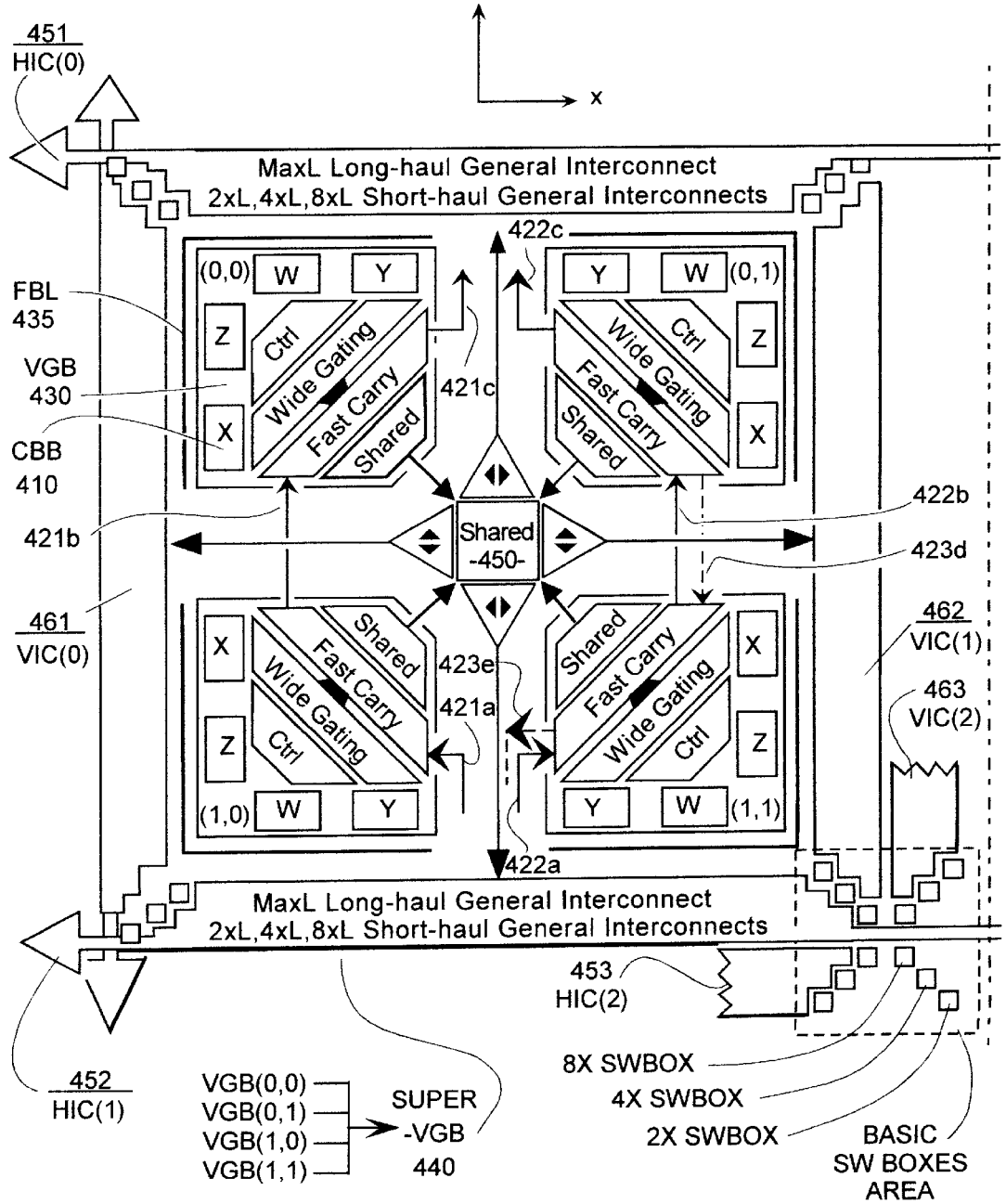
FIG. 3 illustrates more details of a Right Memory Column (RMC), and in particular of two adjacent memory blocks and of the relation of the memory blocks to an adjacent super-VGB core tile and its horizontal interconnect channels (HIC's)
Figure 3B:
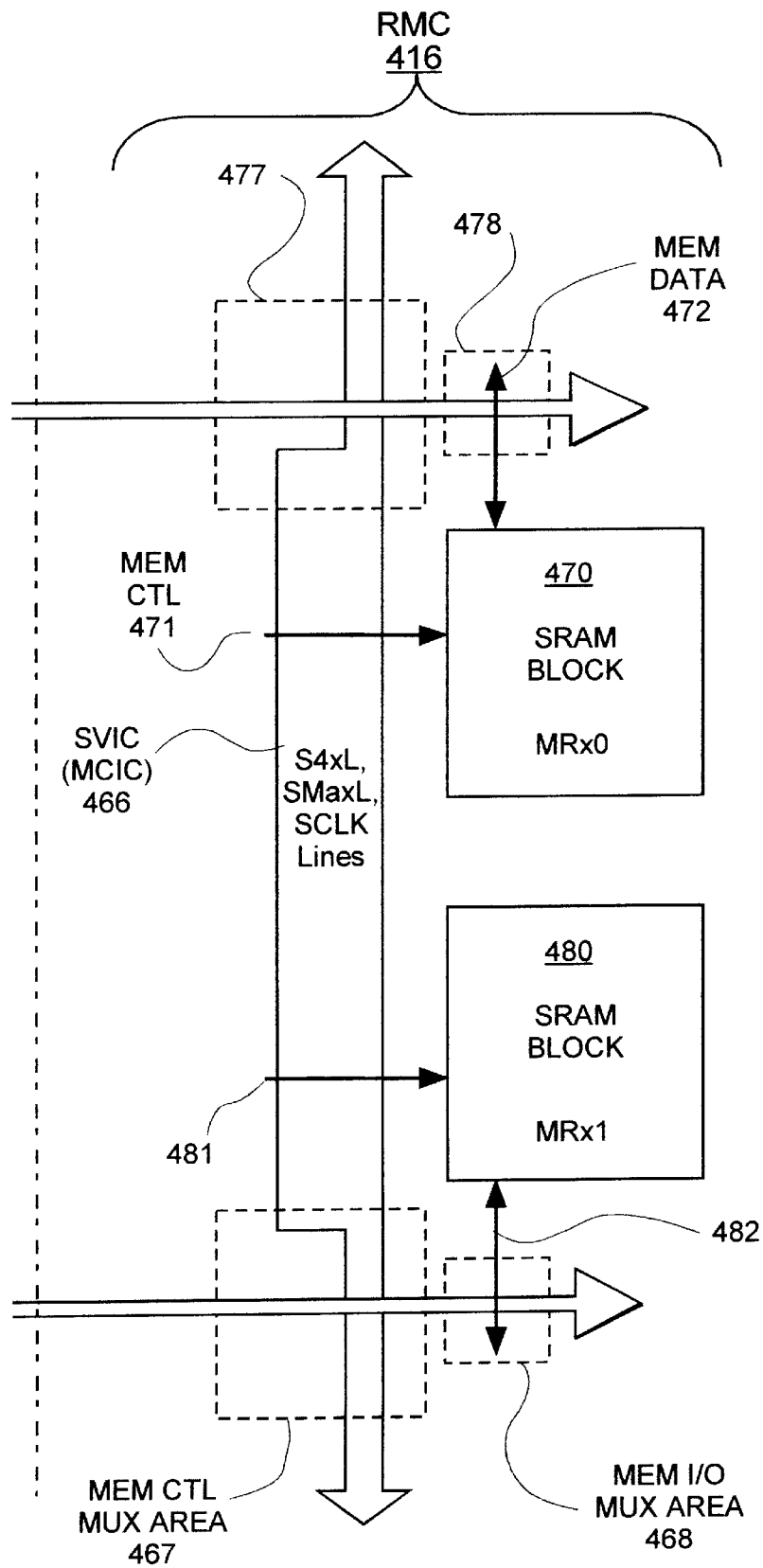

Referring now to FIG. 3, this figure provides a mid-scopic view of some components within an exemplary matrix tile 400 that lays adjacent to embedded memory column, RMC 416. Of course, other implementations are possible for the more macroscopic view of FIG. 1.

The mid-scopic view of FIG. 3 shows four VGB's brought tightly together in mirror opposition to one another. The four, so-wedged together VGB's are respectively designated as (0,0), (0,1), (1,0) and (1,1). The four VGB's are also respectively and alternatively designated herein as VGB_A, VGB_B, VGB_C, and VGB_D.

Reference number 430 points to VGB_A which is located at relative VGB row and VGB column position (0,0). Some VGB internal structures such as CBB's Y, W, Z, and X are visible in the mid-scopic view of FIG. 3. An example of a Configurable Building Block (CBB) is indicated by 410. As seen, the CBB's 410 of each VGB 430 are arranged in an L-shaped organization and placed near adjacent interconnect lines. Further VGB internal structures such as each VGB's common controls developing (Ctrl) section, each VGB's wide-gating supporting section, each VGB's carry-chaining (Fast Carry) section, and each VGB's coupling to a shared circuit 450 of a corresponding super-structure (super-VGB) are also visible in the mid-scopic view of FIG. 3. VGB local feedback buses such as the L-shaped structure shown at 435 in FIG. 3 allow for high-speed transmission from one CBB to a next within a same VGB, of result signals produced by each CBB.

The mid-scopic view of FIG. 3 additionally shows four interconnect channels surrounding VGB's (0,0) through (1,1). The top and bottom, horizontally extending, interconnect channels (HIC's) are respectively identified as 451 and 452. The left and right, vertically extending, interconnect channels (VIC's) are respectively identified as 461 and 462.

Two other interconnect channels that belong to other tiles are partially shown at 453 (HIC2) and 463 (VIC2) so as to better illuminate the contents of switch boxes area 465. Switch boxes area 465 contains an assortment of 2×L switch boxes, 4× switch boxes and 8× switch boxes, which may be provided in accordance with FIG. 2.

In addition, a memory-control multiplexer area 467 is provided along each HIC as shown for configurably coupling control signals from the horizontal bus (e.g., HIC 452) to special vertical interconnect channel (SVIC) 466. Such an SVIC 466 is alternatively referred to herein as a Memory Controls-conveying Interconnect Channel (MCIC). The illustrated placement of multiplexer area 467 to the right of the switch boxes (SwBoxes) of VIC's 462 and 463 is just one possibility. Multiplexer area 467 may be alternatively placed between or to the left of the respective switch boxes of VIC's 462 and 463.

In one embodiment (see FIG. 8), SVIC 466 has sixteen, special maximum length lines (16 SMaxL lines), thirty-two, special quad length lines (32 S4×L lines), and four special clock lines (SCLK0–3). SVIC 466 carries and couples control signals to respective control input buses such as 471, 481 of corresponding memory blocks such as 470, 480.

A memory-I/O multiplexer area 468 is further provided along each HIC for configurably coupling memory data signals from and to the horizontal bus (e.g., HIC 452) by way of data I/O buses such as 472, 482 of corresponding memory blocks such as 470, 480. Again, the illustrated placement of multiplexer area 468 to the right of the switch boxes (SwBoxes) of VIC's 462 and 463 is just one possibility. Multiplexer area 468 may be alternatively placed between or to the left of the respective switch boxes of VIC's 462 and 463.

Memory control multiplexer area 477 and memory I/O multiplexer area 478 are the counterparts for the upper HIC 451 of areas 467 and 468 of lower HIC 452. Although not specifically shown, it is understood that the counterpart, left memory channel (LMC) is preferably arranged in mirror symmetry to the RMC 416 so as to border the left side of its corresponding matrix tile.

As seen broadly in FIG. 3, the group of four VGB's, (0,0) through (1,1) are organized in mirror image relationship to one another relative to corresponding vertical and horizontal centerlines (not shown) of the group and even to some extent relative to diagonals (not shown) of the same group. Vertical and horizontal interconnect channels (VIC's and HIC's) do not cut through this mirror-wise opposed congregation of VGB's. As such, the VGB's may be wedged-together tightly.

Similarly, each pair of embedded memory blocks (e.g., 470 and 480), and their respective memory-control multiplexer areas (477 and 467), and their respective memory-I/O multiplexer areas (478 and 468) are organized in mirror image relationship to one another as shown. Horizontal interconnect channels (HIC's) do not cut through this mirror-wise opposed congregation of embedded memory constructs. As such, the respective embedded memory constructs of blocks MR×0 (in an even row, 470 being an example) and MR×1 (in an odd row, 480 being an example) may be wedged-together tightly. A compact layout may be thereby achieved.

With respect to mirror symmetry among variable grain blocks, VGB (0,1) may be generally formed by flipping a copy of VGB (0,0) horizontally. VGB (1,1) may be similarly formed by flipping a copy of VGB (0,1) vertically. VGB (1,0) may be formed by flipping a copy of VGB (1,1)

horizontally, or alternatively, by flipping a copy of VGB (0,0) vertically. The mirror-wise symmetrical packing-together of the four VGB's (0,0 through 1,1) is referred to herein as a 'Super Variable Grain Block' or a super-VGB 440.

In a preferred embodiment, the mirror symmetry about the diagonals of the super-VGB is not perfect. For example, there is a Fast Carry section in each VGB that allows VGB's to be chained together to form multi-nibble adders, subtractors or counters. (A nibble is a group of 4 data bits. A byte is two nibbles or 8 data bits. A counter generally stores and feeds back its result so as to provide cumulative addition or subtraction.) The propagation of rippled-through carry bits for these Fast Carry sections is not mirror wise symmetrical about the diagonals of each super-VGB 440. Instead it is generally unidirectional along columns of VGB's. Thus, CBB's X, Z, W, and Y are not interchangeable for all purposes.

The unidirectional propagation of carry bits is indicated for example by special direct connect lines 421a, 421b and 421c which propagate carry bits upwardly through the Fast Carry portions of VGB's (0,0) and (1,0). The unidirectional propagation is further indicated by special direct connect lines 422a, 422b and 422c which propagate carry bits upwardly through the Fast Carry portions of VGB's (0,1) and (1,1).

Such unidirectional ripple-through of carry bits may continue across the entire FPGA device so as to allow addition, subtraction or count up/down results to form in bit aligned fashion along respective columns of the FPGA device. Bit aligned results from a first set of one or more columns can be submitted to other columns (or even resubmitted to one or more columns of the first set) for further bit aligned processing. In one embodiment, the X CBB generally produces the relatively least significant bit (LSB) of result data within the corresponding VGB, the Z CBB generally produces the relatively next-more significant bit, the W CBB generally produces the relatively next-more significant bit, and the Y CBB generally produces the relatively most significant bit (MSB) of result data within the corresponding VGB.

In an alternate embodiment, propagation of rippled-through carry bits may be zig-zagged first up and then down through successive columns of VGB's. In such an alternate zig-zagged design, the significance of bits for adder/subtractor circuits would depend on whether the bits are being produced in an odd or even column of VGB's.

The local feedback lines 435 of each VGB may be used to feedback its registered adder outputs to one of the adder inputs and thereby define a counter. The counter outputs can be coupled by way of the adjacent HIC to either an intersecting SVIC (e.g., 466, so as to provide address sequencing) or to an adjacent data port (e.g., 472, 482, so as to store counter results in the embedded memory at designated time points).

FIGS. 4–7H are provided to facilitate the understanding of the coupling that is provided by way of the HIC's (e.g., 451 and 452) between the embedded memory blocks (470) and corresponding inputs and outputs of the super-VGB's (440) and/or IOB's. It is helpful to study the I/O structure of selected components within each super-VGB and IOB to some extent so that the data and control input/output interplay between the embedded memory columns 114/116 and the SVGB's and the IOB's can be appreciated. At the same time, it is to be understood that the description given here for the SVGB's and IOB's may be less extensive than that given in the above-cited Ser. Nos. 08/948,306 and 08/995,615. The description given here for the SVGB's and IOB's are intended to provide no more than a basic understanding of the cooperative structuring of the embedded memory blocks (470/480) and corresponding inputs and outputs of the super-VGB's (440) and IOB's (see FIG. 7A).

Figure 6A:
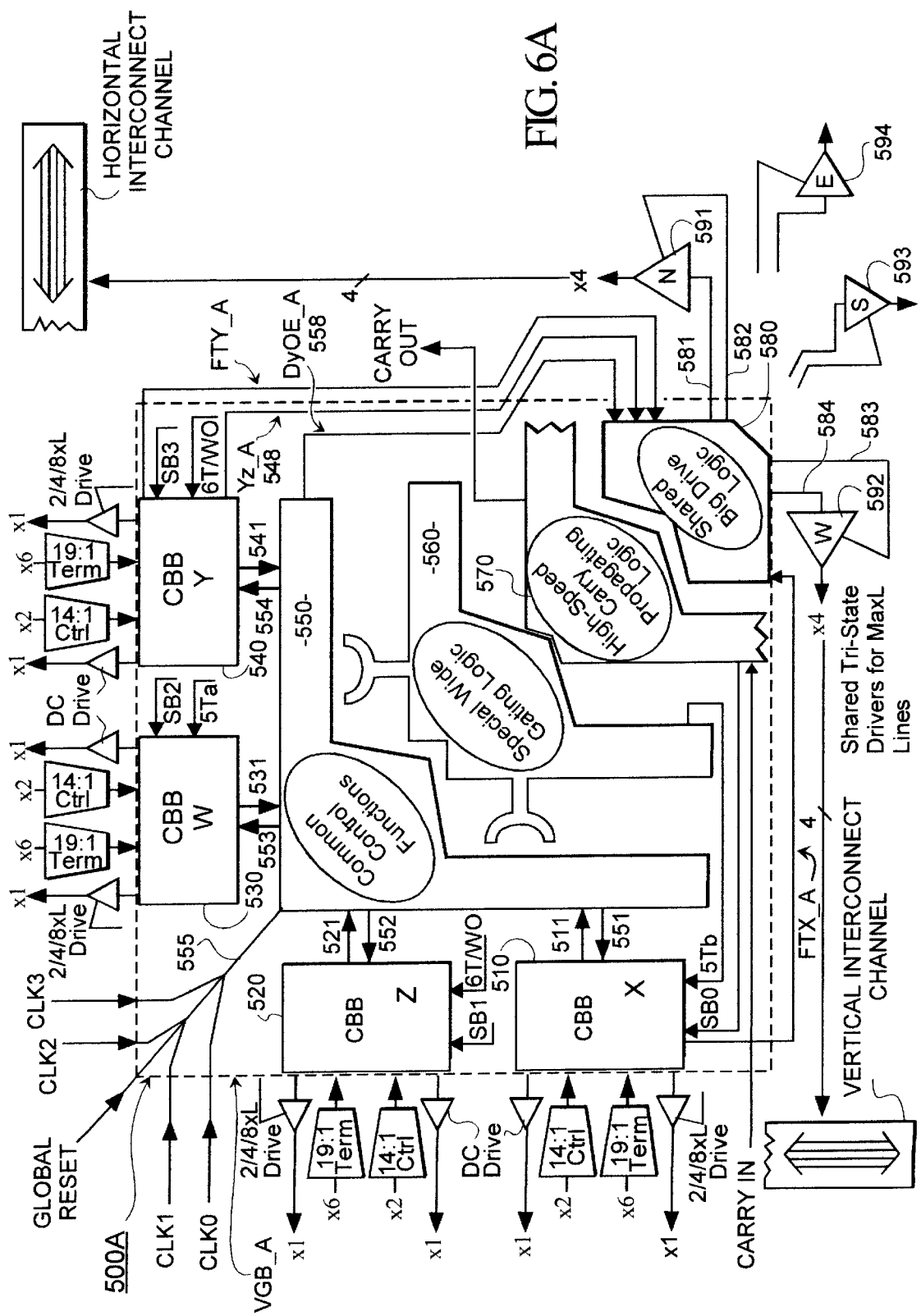
FIG. 6 shows an exemplary CSE (Configurable Sequential Element) having a flip flop that is responsive to a VGB clock signal.

Referring to FIG. 6A, each of the X, Z, W, and Y Configurable Building Blocks of each VGB has six 19:1, input-terms acquiring multiplexers (shown as a single set with an x6 wide input bus) for acquiring a corresponding six input term signals of the CBB from adjacent interconnect lines (AIL's). The CBB can process its respectively acquired signals in accordance with user-configuration instructions to produce result signals. The Yz__A signal 548 output by the Y CBB 540 of FIG. 6A is an example of such a result signal.

Figure 6B:
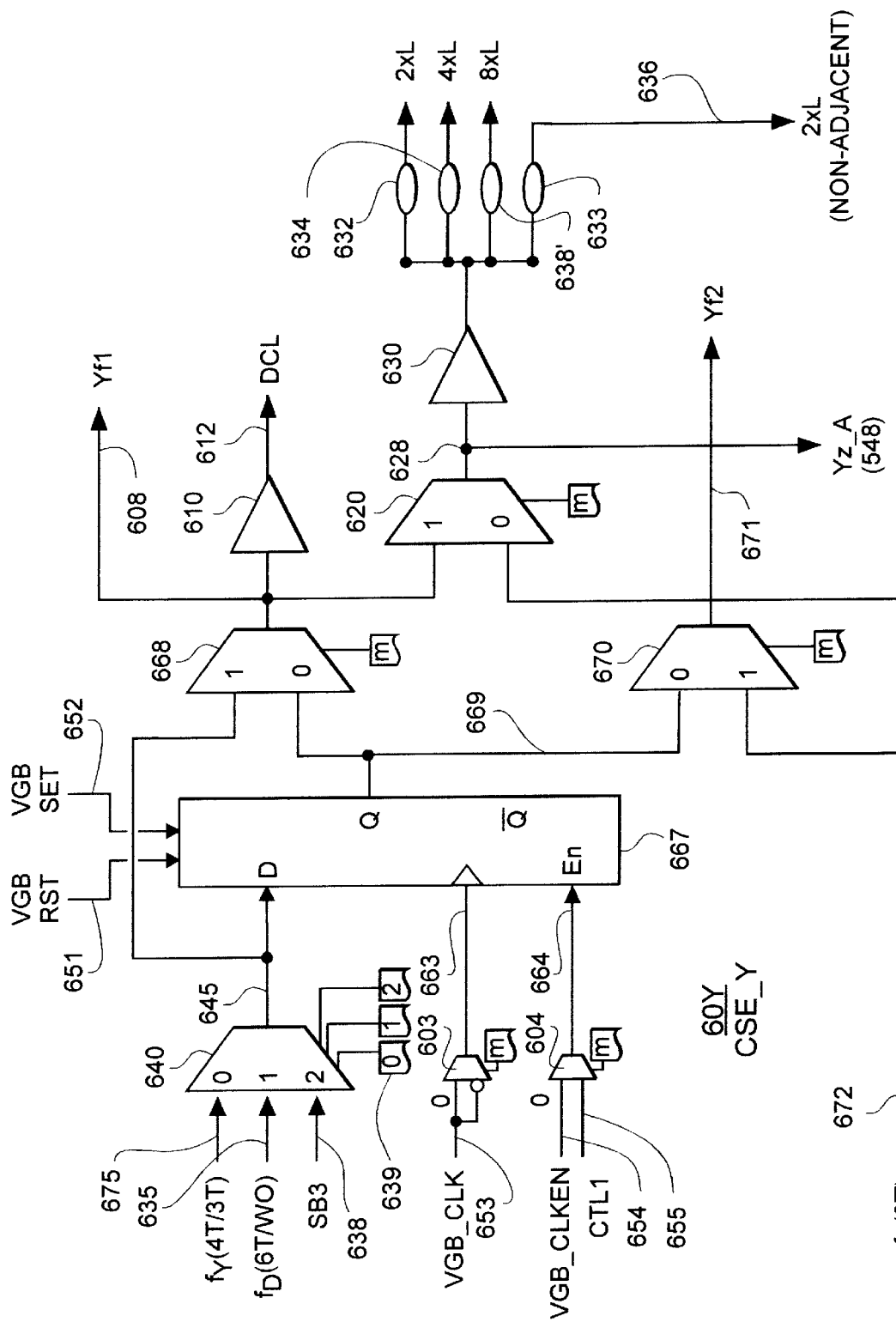

Each of the X, Z, W, and Y CBB's further has a result-signal storing register (e.g., 667 of FIG. 6B) and a 2/4/8xL drive amplifier (e.g., 630 of FIG. 6B). A configurable bypass multiplexer (e.g., 668 of FIG. 6B) allows the CBB to be configured to output either a register-stored version of a CBB result signal or a nonstored (unregistered) result signal of the CBB onto adjacent ones of the 2xL lines, 4xL lines and 8xL lines. Various, dynamic control signals may be used by the CBB for controlling its internal, result-signal storing register (e.g., 667). These control signals are acquired by way of respective, controls input multiplexers (14:1 Ctrl, shown in FIG. 6A) of the respective CBB's X,Z,W,Y. There are two such controls input multiplexers (14:1 Ctrl) provided for each CBB.

In addition to its 2/4/8xL drive amplifier, each of the X, Z, W, and Y CBB's further has a dedicated direct-connect (DC) drive amplifier (shown as DC Drive in FIG. 6A and as 610 in FIG. 6B) which can configurably output either a register-stored version of a CBB result signal or an non-stored (unregistered) result signal of the CBB onto adjacent ones of so-called, direct connect lines. Moreover, each CBB has means for outputting its registered or unregistered result-signals onto feedback lines (FBL's 608 and 671) of the VGB. The DCL's (direct connect lines) and FBL's are not immediately pertinent to operation of the embedded memory blocks (470) but are mentioned here for better understanding of next-described FIG. 4.

Figure 4:
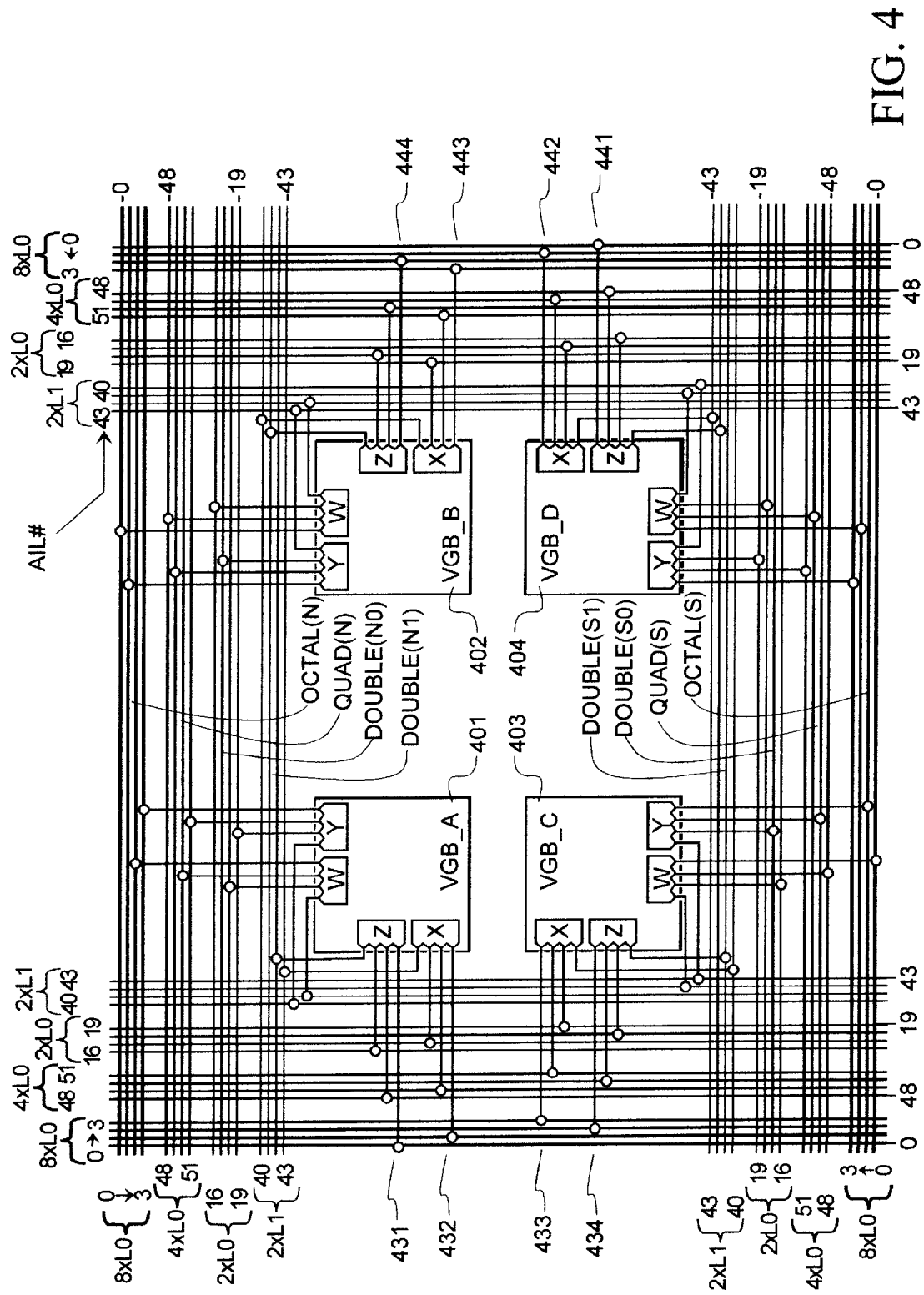
FIG. 4 illustrates how the 2/4/8×L output lines of respective CBB's (X, Z, W, Y) within a SVGB are configurably couplable to surrounding interconnect channels.

FIG. 4 looks at the 2/4/8xL driver output connections for each super-VGB. In FIG. 4, each CBB has four respective output lines for driving nearby 2xL interconnect lines, 4xL interconnect lines and 8xL interconnect lines that surround the encompassing super-VGB. The four respective output lines of each CBB may all come form one internal 2/4/8xL line driving amplifier (e.g., 630 of FIG. 6B) or from different drive amplifiers.

The layout of FIG. 4 is essentially symmetrical diagonally as well as horizontally and vertically. The octal length (8xL) lines are positioned in this embodiment further away from the VGB's 401–404 than are the 4xL and 2xL lines of the respective vertical and horizontal interconnect channels. AIL line 0 of each of the illustrated VIC's and HIC's is at the outer periphery and AIL numbers run generally from low to high as one moves inwardly. The quad length (4xL) lines are positioned in this embodiment further away from the VGB's than are the double length (2xL) lines of the respective VIC's and HIC's. It is within the contemplation of the invention to alternatively position the octal length (8xL) lines closest to VGB's 401–404, the quad length (4xL) lines next closest, and the double length (2xL) lines of the respective VIC's and HIC's furthest away from surrounded VGB's 401–404. The same pattern of course repeats in each super-VGB of the FPGA core matrix.

VGB_A (401) can couple to same AIL's in the northern octals (Octals(N)) as can VGB_D (404) in the southern octals (Octals(S)). A similar, diagonal symmetry relation exists between VGB_B (402) and VGB_C (403). Symmetry for the eastern and western octal connections is indicated by PIP's 431, 432, 433 and 434 moving southwardly along the west side of the tile and by counterposed PIP's 441, 442, 443 and 444 moving northwardly along the east side.

Note that the non-adjacent 2xL connections of this embodiment (e.g., the PIP connection of the Y CBB in VGB 401 to vertical AIL #40) allow for coupling of a full nibble of data from any VGB to the 2xL lines in either or both of the adjacent VIC's and HIC's. Thus, bus-oriented operation may be efficiently supported by the L-organized CBB's of each VGB in either the horizontal or vertical direction. Each CBB of this embodiment has essentially equivalent access to output result signals to immediately adjacent 2xL, 4xL and 8xL lines as well as to nonadjacent 2xL lines (in the AIL 40–43 sets). Each pair of VGB's of a same row or column can output 4 independent result signals to a corresponding 4 lines in any one of the following 4-line buses: (a) the immediately adjacent 2xL0 group (AIL's 16–19), (b) the immediately adjacent 4xL group (AIL's 48–51), (c) the immediately adjacent 8xL group (AIL's 0–3), and (d) the not immediately adjacent 2xL1 group (AIL's 40–43).

Figure 5:
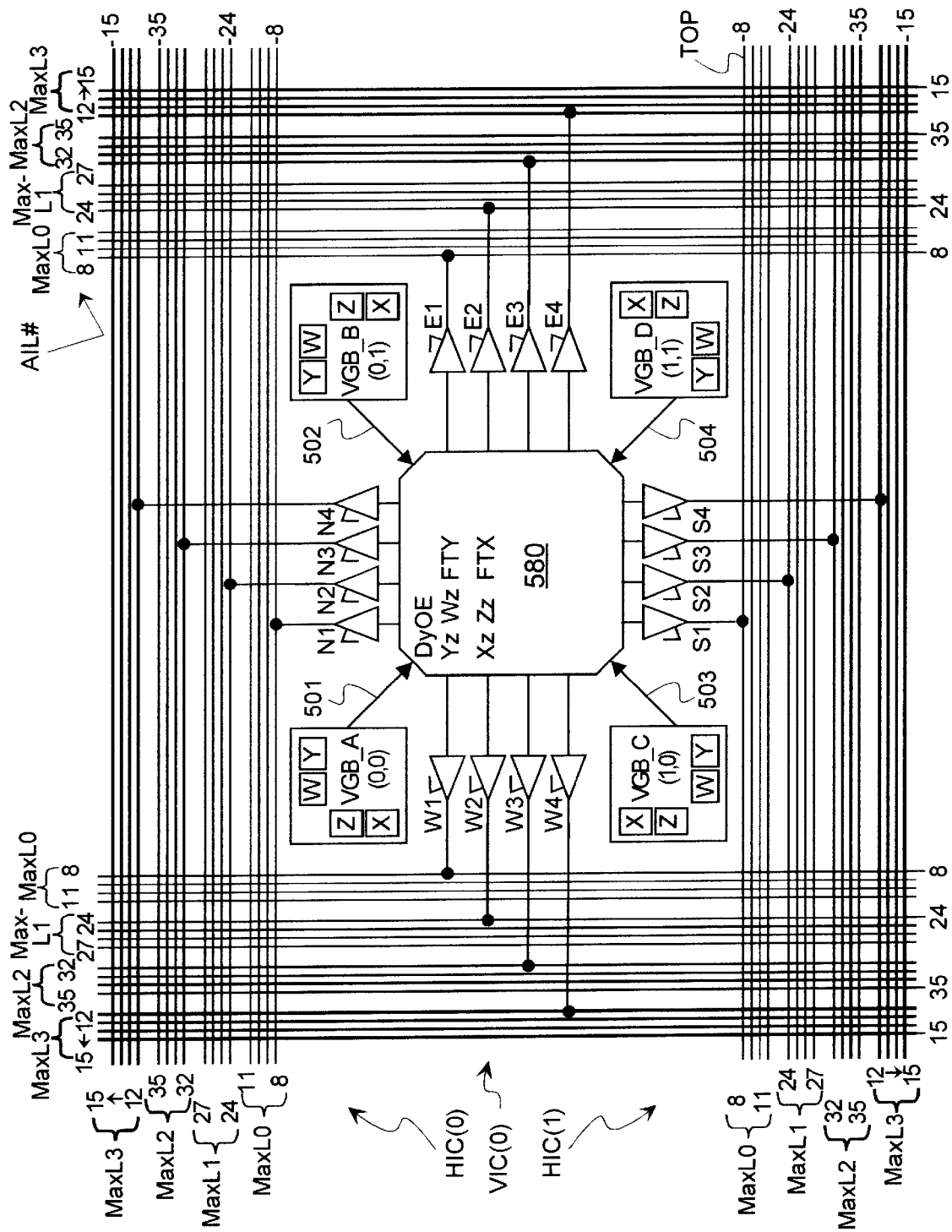
FIG. 5 illustrates how MaxL line drivers of respective SVGB's are coupled to surrounding interconnect channels.

Aside from having dedicated 2/4/8xL drivers in each CBB, there are shared big drivers (tristateable MaxL drivers) at the center of each super-VGB for driving the MaxL lines of the surrounding horizontal and vertical interconnect channels (HIC's and VIC's). Referring to FIG. 5, a scheme for connecting the shared big drivers (MaxL drivers) to the adjacent MaxL interconnect lines is shown for the case of super-VGB (0,0). This super-VGB (also shown as 101 in FIG. 1) is surrounded by horizontal interconnect channels (HIC's) 0 and 1 and by vertical interconnect channels (VIC's) 0 and 1. The encompassed VGB's are enumerated as A=(0,0), B=(0,1), C=(1,0) and D=(1,1). A shared big logic portion of the SVGB is shown at 580. Shared big logic portion 580 receives input/control signals 501, 502, 503, 504 and responsively sends corresponding data and control signals to sixteen, three-state (tristate) longline driving amplifiers that are distributed symmetrically relative to the north, east, south and west sides of the SVGB. The sixteen, tristate drivers are respectfully denoted as: N1 through N4, E1 through E4, S1 through S4, and W1 through W4. Angled line 501 represents the supplying of generically-identified signals: DyOE, Yz, Wz, Xz, Zz, FTY(1,2) and FTX(1,2) to block 580 from VGB_A. DyOE is a dynamic output enable control. Yz, Wz, Xz, Zz are respective result signals from the Y, W, X, Z CBB's of VGB_A. FTY(1,2) and FTX(1,2) are feedthrough signals passed respectively through the Y and X CBB's of VGB_A. Angled lines 502, 503 and 504 similarly and respectively represent the supplying of the above generically-identified signals to block 580 respectively from VGB_B, VGB_C and VGB_D.

Note that the tristate (3-state) nature of the shared big drivers means that signals may be output in time multiplexed fashion onto the MaxL lines at respective time slots from respective, bus-mastering ones of the SVGB's along a given interconnect channel.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. MaxL drivers N1 through N4 respectively connect to the closest to the core, lines of respective groups MaxL0, MaxL1, MaxL2 and MaxL3 of the adjacent north HIC.

MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right to a next super-VGB (not shown), the N1–N4 connections move up by one line in each of the respective groups MaxL0–MaxL3, until the top most line is reached in each group, and then the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1–E4 and W1–W4 connections move outwardly by one line in each of the respective groups MaxL0–MaxL3, until the outer most line is reached in each group, and then the connections wrap around to the inner most line of each group for the next super-VGB down and the scheme repeats. Thus, on each MaxL line, there are multiple tristate drivers that can inject a signal into that given MaxL line.

The group of MaxL lines in each channel that are driven by tristate drivers of FIG. 5 are referred to herein as the 'TOP' set. This TOP set comprises AIL's #8, #24, #32 and #12 of respective groups MaxL0, MaxL1, MaxL2 and MaxL3. (The designation of this set as being TOP is arbitrary and coincides with the label TOP in the right bottom corner of FIG. 5 as applied to the bottom MaxL0 group.)

In similar fashion, the group of MaxL lines in each channel that are driven by tristate drivers of the next to the right SVGB are referred to herein as the '2ND' set. This 2ND set comprises AIL's #9, #25, #33 and #13. The group of MaxL lines in each channel that are driven by tristate drivers of the twice over to the right SVGB are referred to herein as the '3RD' set. This 3RD set comprises AIL's #10, #26, #34 and #14. The group of MaxL lines in each channel that are driven by tristate drivers of the thrice over to the right SVGB are referred to herein as the 'BOT' set. This BOT set comprises AIL's #11, #27, #35 and #15.

Figure 7A:
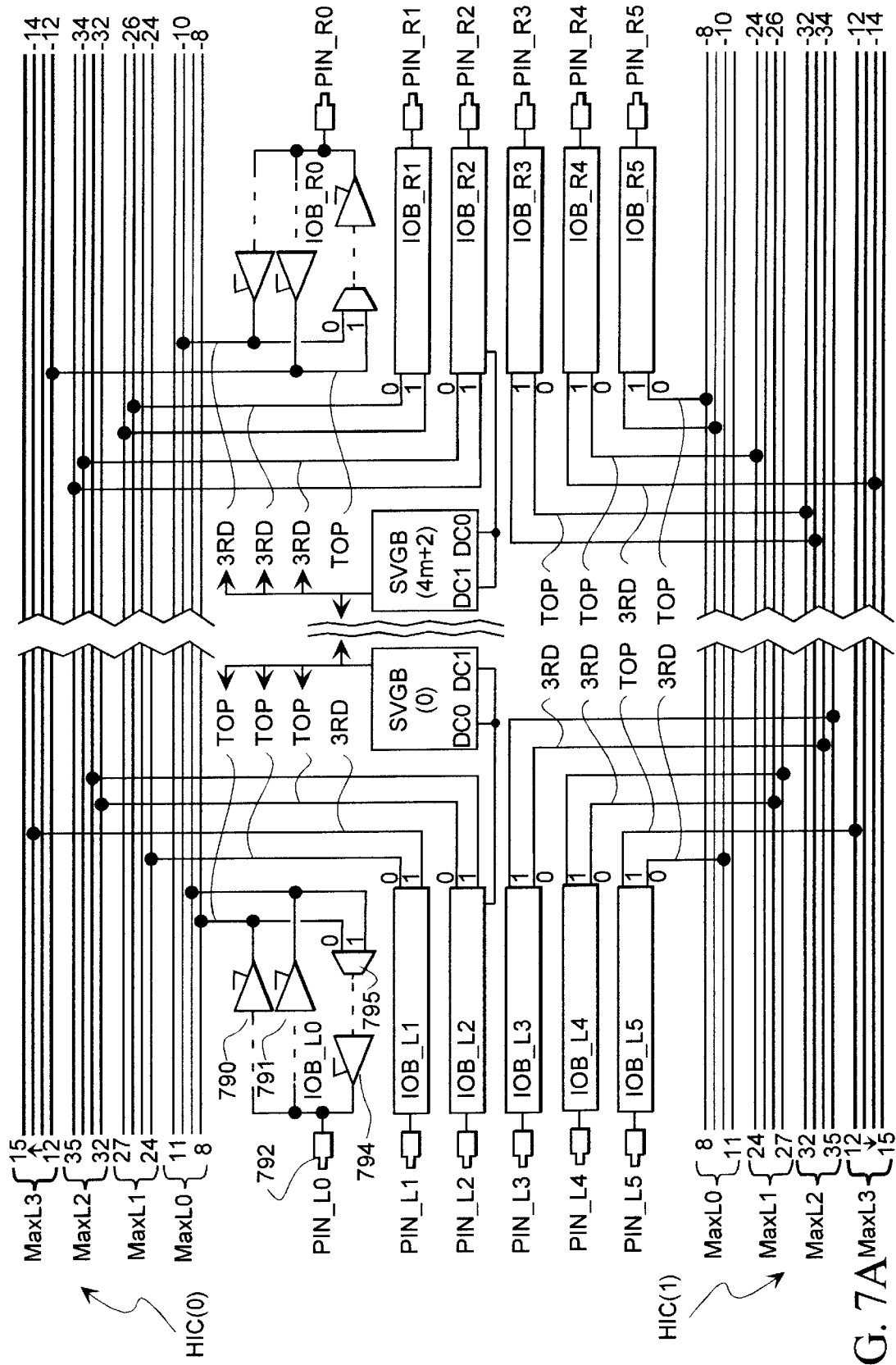
FIG. 7A illustrates how the MaxL line drivers of respective IOB's are coupled to surrounding interconnect channels in one embodiment of the invention.

FIG. 7A illustrates how IOB's interface with the MaxL lines, and in particular the TOP set of AIL's #8, #24, #32 and #12; and the 3RD set of AIL's #10, #26, #34 and #14.

Internal details of each IOB are not germane to the immediate discussion and are thus not fully shown in FIG. 7A. However, as shown in FIG. 7A, each IOB such as IOB_L0 (at the top, left) includes two longline driving tristate drivers 790 and 791 for driving a respective pair of MaxL lines. The illustrated tristate drivers 790 and 791 for example, respectively drive TOP AIL #8 and 2ND AIL #9. Input signals of the respective two longline driving tristate drivers, 790 and 791, may be configurably derived from a number of sources including external I/O pin 792 of the corresponding FPGA device (e.g., 100 of FIG. 1). Other sources include one or both of two bypassable and serially-coupled registers within each IOB as will be seen in FIG. 7B.

Each IOB of FIG. 7A, such as IOB_L0; further includes a pin-driving tristate driver (with configurably-variable slew rate) such as shown at 794. Input signals of the pin-driving tristate driver 794 may be configurably derived from a number of sources including from user-configurable multiplexer 795. Two of the selectable inputs of multiplexer 795 are coupled to the same two longlines driven by that same IOB. In the case of IOB_L0 for example, that would be TOP AIL #8 and 2ND AIL #9.

The remaining IOB's shown in FIG. 7A have similar internal structures. As seen, at the left side of the FPGA device, between even-numbered HIC(0) and odd-numbered HIC(1), there are provided six IOB's respectively identified as IOB_L0 through IOB_L5. At the right side of the FPGA device there are further provided six more IOB's respectively identified as IOB_R0 through IOB_R5. The external I/O pins are similarly identified as PIN_R0 through PIN_R5 on the right side and as PIN_L0 through PIN_L5 on the left side. The same connection pattern repeats between every successive set of even and odd-numbered HIC's. FIG. 7A may be rotated ninety degrees to thereby illustrate the IOB-to-MaxL lines connectivity pattern for the VIC's as well. (References to horizontal lines will of course be changed to vertical and references to left and right IOB's will of course be changed to top and bottom.)

On the left side, IOB_L0, IOB_L1 and IOB_L2 collectively provide bidirectional coupling at least to 3 TOP longlines (AIL's #8, #24, #32) and 1 3RD longline (AIL #14) in the adjacent even-numbered HIC(0). On the right side, IOB_R0, IOB_R1 and IOB_R2 collectively provide bidirectional coupling at least to 3 3RD longlines (AIL's #10, #26, #34) and 1 TOP longline (AIL #12) in the adjacent and same even-numbered HIC(0). The combination of the six IOB's of HIC(0) therefore allow for bidirectional coupling of nibble-wide data either to the TOP set ((AIL's #8, #24, #32 and #12) and/or to the 3RD set (AIL's #10, #26, #34 and #14).

As seen in the bottom half of FIG. 7A, on the left side, IOB_L5, IOB_L4 and IOB_L3 collectively provide bidirectional coupling at least to 3 3RD longlines (AIL's #10, #26, #34) and 1 TOP longline (AIL #12) in the adjacent odd-numbered HIC(1). On the right side, IOB_R5, IOB_R4 and IOB_R3 collectively provide bidirectional coupling at least to 3 TOP longlines (AIL's #8, #24, #32) and 1 3RD longline (AIL #14) in the same odd-numbered HIC(1). The combination of the six IOB's of HIC(1) therefore allow for bidirectional coupling of nibble-wide data either to the TOP set (AIL's #8, #24, #32 and #12) and/or to the 3RD set (AIL's #10, #26, #34 and #14) of the odd-numbered, adjacent HIC.

In addition to the above-described couplings between the IOB's and the MaxL lines of the interconnect mesh, IOB's also couple by way of direct connect wires to peripheral ones of the SVGB's for both input and output. More specifically, there are direct connect wires connecting the left-side IOB's (IOB_L0 through IOB_L5) to adjacent SVGB's of super column number 0. Two such wires are represented as DC1 and DC2 coupling IOB_L2 to the illustrated column-0 SVGB. FIG. 7A indicates that the super column 0 SVGB's can drive the same TOP set of longlines (AIL's #8, #24, #32 and #12) that may be driven by the IOB's, and as will later be seen, by the embedded memory.

There are further direct connect wires connecting the right-side IOB's (IOB_R0 through IOB_R5) to adjacent SVGB's of the rightmost super column. The column number of the rightmost super column is preferably (but not necessarily) equal to an even integer that is not a multiple of four. In other words, it is equal to 4m+2 where m=1, 2, 3, etc. and the leftmost super column is numbered 0. That means there are a total of 4m+3 SVGB's per row. The latter implies that square SVGB matrices will be organized for example as 11×11, 13×13, 19×19, 23×23 SVGB's and so on. (If the same organizations are given in terms of VGB's, they become 22×22, 26×26, 38×38, 46×46 VGB's and so on.) The rightmost SVGB number (4m+2) connects by way of direct connect wires to the right-side IOB's. FIG. 7A indicates that these super column number 4m+2 SVGB's can drive the same 3RD set of longlines (AIL's #10, #26, #34 and #14) that may be driven by the IOB's, and as will later be seen, by the embedded memory.

In alternate embodiments, the extent of direct connect between IOB's to adjacent columns of SVGB's is increased from extending to just the most adjacent super column to extending to at least the first two or three nearest super columns. This allows the right-side IOB's to reach the SVGB's that drive the 3RD longline set with direct connections.

Aside from direct connect wires, IOB's may be further coupled to the SVGB's of the device by 2×L, 4×L, 8×L lines of the adjacent HIC's. Coupling between the IOB's and the 2×L, 4×L, 8×L lines of adjacent HIC's may be provided through a configurable dendrite structure that extends to the multiplexer 795 of each IOB from pairs of adjacent HIC's. It is sufficient to understand that configurable coupling means are provided for providing coupling between the 2×L, 4×L, 8×L lines of the adjacent HIC's and the corresponding IOB's. A more detailed disclosure of dendrite structures may be found in the above-cited, U.S. application Ser. No. 08/995,615.

Figure 7B:
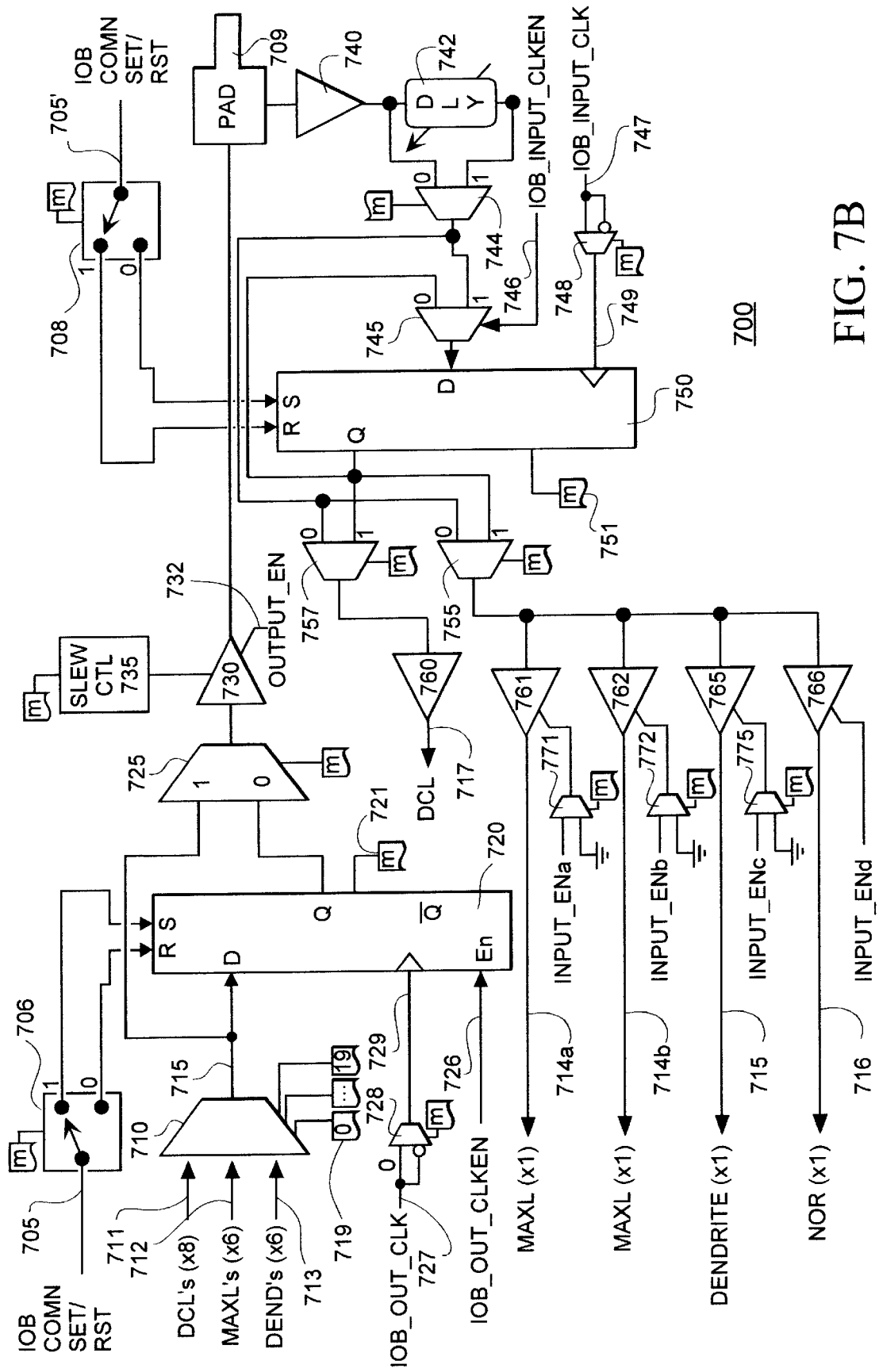
FIG. 7B illustrates internal components of an exemplary IOB (configurable Input/Output Block) having plural flip flops that are respectively responsive to respective IOB input and output clock signals.

FIG. 7B may now be referred to while keeping in mind the input/output structures of the surrounding SVGB's and IOB's as described above for respective FIGS. 1–5 and 7A. In FIG. 7B, control signals for synchronizing various I/O flows are shown in combination with elements that direct the I/O flows.

However, before describing these more complex structures of the IOB's, it will be beneficial to briefly refer to FIG. 6B and to describe data flow structures that can direct various dynamic signals to the D (645), clock (663), clock-enable (664), reset (651) and set (652) input terminals of CSE flip flop 667. It will be beneficial to also briefly describe data flow structures that can direct the Q output (669) of the CSE flip flop and/or register-bypassing alternate signals to various interconnect lines (2×L lines through MaxL lines).

Referring to 6B, an example is shown of a specific CSE 60Y that may be included within each Y CBB of each VGB. CSE 60Y is representative of like CSE's (Configurable Sequential Elements) that may be included in the respective others of the X, W and Z CBB's of each VGB. The signal processing results of the given CBB (e.g., the Y one) may respectively appear on lines 675 and 672 as signals $f_a(3T)$ and $f_b(3T)$. Here, the notation $f_m(nT)$ indicates any Boolean function of up to n independent input bits as produced by a user-programmable LUT (lookup table, not shown) identified as LUT m. The output of a synthesized 4-input LUT may appear on line 675 as signal $f_Y(4T)$. The output of a synthesized 6-input LUT may appear on line 635 as signal $f_D(6T)$. Alternatively, line 635 may receive a wide-gated signal denoted as $f_{WO}(p)$ which can represent a limited subset of functions having up to p independent input bits. In one embodiment, p is 16. A result signal (SB3) produced by an in-CBB adder/subtractor logic (570 of FIG. 6A) appears on line 638. Configuration memory bits 639 are user-programmable so that multiplexer 640 can be instructed to route the result signal of a selected one of lines 675, 635 and 638 to its output line 645. As such, multiplexer 640 defines an example of a user-programmable, result-signal directing circuit that may be found in each CSE of the VGB 500A shown in FIG. 6A. Other result-signal directing circuits may be used as desired.

Each CSE includes at least one data storing flip-flop such as that illustrated at 667. Flip-flop 667 receives reset (RST) and set control signals 651 and 652 in addition to clock signal 663 and clock enable signal 664. A locally-derived control signal CTL1 is presented at line 655 while a VGB common enable is presented on line 654. Multiplexer 604 is programmably configurable to select one or the other of lines 654, 655 for presentation of the selected input signal onto output line 664. As explained above, lines 672, 675, 635 and 638 carry logic block (CBB) result signals. The control signals of lines 651 through 655 are derived from common controls section 550 of FIG. 6A. The common controls section 550 acquires a subset of neighboring signals from AIL's by way of the 14:1 Ctrl multiplexers and defines a further subset or derivative of these as VGB-common control signals. The signals of lines 653, 654 and 655 may be used to control the timing of when states change at the outputs of respective line drivers 610 (DCL driver), 620 (to-tristate driver), 630 (2/8×L driver), 668 (FBL driver) and 670 (FBL driver). A more detailed explanation of such CBB-result signals may be found in at least one of the above-cited, copending applications.

With the three bits of configuration memory shown at 639 in FIG. 6B, a user can control multiplexer 640 to select an appropriate data signal 645 for supply to the D input of flip-flop 667. The selected signal may bypass the flipflop by routing through a user-programmable multiplexer 668 to line 608. Multiplexer 668 may be programmed to alternatively apply the Q output of flip-flop 667 to line 608. Buffer 610 drives a direct-connect line 612. Buffer 630 drives one or more of CBB-adjacent 2×L, 4×L or 8×L lines. Connection 636 is to a non-adjacent 2×L line (see FIG. 4). Items 632, 633, 634 and 638' represent PIP-like, programmable connections for programmably interconnecting their respective co-linear lines. A more detailed explanation of the CSE structure and its other components may be found in at least one of the above-cited, copending applications. For purposes of the present application, it is to be understood that elements 620, 670, 632, 634, 638' and 633 define examples of user-programmable, stored-signal directing circuits that may be found in each CSE of the VGB 500A shown in FIG. 6A and may be used for directing the Q output of flip flop 667 to one or more interconnect resources such adjacent 2×L–8×L lines or MaxL lines. Other stored-signal directing circuits may be used as desired.

Referring to the IOB structure 700 shown in FIG. 7B, this IOB 700 may be used to provide a configurable interconnection between the input/output pin/pad 709 and neighboring, internal interconnect resources. The chip-internal interconnect resources may supply signals for output by IOB 700 to external circuits, where the external circuits (not shown) connect to I/O pin or pad 709. In particular, the internal interconnect resources that can supply such signals to an IOB first multiplexer 710 include a first plurality 711 of 8 direct connect lines (DCL's), a second plurality 712 of 6 MaxL lines, and a third plurality 713 of 6 dendrite lines (Dend's). The signal selected for output on line 715 of the multiplexer may be transmitted by way of register-bypass multiplexer 725 and pad-driving amplifier 730 for output through I/O pin/pad 709.

External signals may also be brought in by way of I/O pin/pad 709 for transfer by the IOB 700 to one or more of a fourth plurality 714a,b of two MaxL lines, and to one dendrite line 715, one NOR line 716, and one direct connect line 717. Lines 714a and 714b are each connected to a respective MaxL line. Line 716 operates in open-collector mode such that it can be resistively urged to a normally-high state and can be pulled low by one or more open-collector drivers such as driver 766. The illustrated INPUT_ENd line couples to a gate of one of plural, in series pull-down MOSFET transistors (not shown) in 766 that can sink current from the NOR line 716.

IOB 700 includes a first register/latch 720 for storing a respective first output signal. This first output signal is supplied to a D input of unit 720 by line 715. A plurality 719 of 20 configuration memory cells determines which interconnect resource will supply the signal to line 715. In an alternate embodiment, a combination (not shown) of a decoder and a fewer number of configuration memory cells may be used to select a signal on one of lines 711–713 for output on line 715.

IOB 700 includes a second register/latch 750 for storing an input signal supplied to a D input thereof by a dynamic multiplexer 745. Input signals may flow from pad 709, through input buffer 740, through user-programmable delay 742 and/or through delay-bypass multiplexer 744 to one input terminal of dynamic multiplexer 745. A second input terminal of dynamic multiplexer 745 couples to the Q output of the second register/latch 750. The selection made by multiplexer 745 is dynamically controlled by an IOB INPUT_CLKEN signal supplied on line 746.

A plurality of control signals may be input to IOB 700 for controlling its internal operations. These include input enable signals, INPUT_ENa, INPUT_ENb, INPUT_ENc, and INPUT_ENd. Input enable signals, INPUT_ENa, INPUT_ENb, and INPUT_ENc respectively drive the output enable terminals of respective tristate drivers 761, 762 and 765. The INPUT_ENd signal selectively enables the pull-down function of open-collector (open-drain) driver 766 as explained above. A respective plurality of four deactivating multiplexers 771, 772, 775 and one more (not shown) for 766 are provided for user-programmable deactivation of one or more of the respective tristate drivers 761, 762 and 765, and of driver 766. In one embodiment, all of input enable signals, INPUT_ENa, INPUT_ENb, INPUT_ENc, and INPUT_ENd are tied together and designated simply as a common INPUT_EN signal. In an alternate embodiment, just the INPUT_ENa and INPUT_ENb enable signals are tied together and designated as a common and dynamically changeable, INPUT_EN signal while each of the INPUT_ENC and INPUT_ENd lines are tied to Vcc (set to logic '1').

Further control signals that may be supplied to IOB 700 include an INPUT CLOCK signal (INPUT_CLK) on line 747, the INPUT_CLKEN signal on line 746, an OUTPUT_EN signal that couples to the OE terminal 732 of tristate driver 730, an OUTPUT_CLOCK signal on line 727, an OUTPUT_CLKEN signal on line 726, and a COMMON SET/RST signal on lines 705 and 705'. These control signals may be acquired from adjacent interconnect lines by one or more IOB control multiplexers such as the one illustrated in FIG. 7C.

As illustrated in FIG. 7B, programmable memory bits in the FPGA configuration memory may be used to control static multiplexers such as 728, 748, etc. to provide programmable polarity selection and other respective functions. Static single-pole double-throw electronic switches 706 and 708 are further controlled by respective configuration memory bits (m) so that the COMMON SET/RST signal of lines 705, 705' can be used to simultaneously reset both of register/latches 720 and 750, or simultaneously set both of them, or set one while resetting the other.

An output of register by-pass multiplexer 725 is coupled to pad driving amplifier 730. The amplifier 730 is controllable by a user-programmable, slew rate control circuit 735. The slew rate control circuit 735 allows the output of pad driving amplifier 730 to either have a predefined, relatively fast or comparatively slow rise time subject to the state of the memory bit (m) controlling that function. The OUTPUT_EN signal supplied to terminal 732 of the pad driving amplifier 730 may be used switch the output of amplifier 730 into a high-impedance state so that other tristate drivers (external to the FPGA chip) can drive pad 709 without contention from driver 730.

External signals may be input to IOB 700 as explained above via pin 709 and input buffer 740. In one embodiment, the user-programmable delay element 742 comprises a chain of inverters each having pull-down transistors with relatively large channel lengths as compared to logic inverters of the same chip. The longer channel lengths provide a higher resistance for current sinking and thus increase the RC response time of the inverter. A plurality of user-programmable, internal multiplexers (not shown) of delay unit 742 define the number of inverters that a delayed signal passes through. The user-programmable delay element 742 may be used to delay incoming signals for the purpose of de-skewing data signals or providing a near-zero hold time for register/latch 750. A global clock signal (GK) of the FPGA array may be used for example as a source for the INPUT_CLOCK signal of line 746. Due to clock skew, the global clock signal may not reach register/latch 750 before a data signal is provided to the D input of register/latch 750. In such a situation, the variable delay function of element 742 may be used to delay incoming data signals acquired by buffer 740 so they can align more closely with clock edges provided on clock input terminal 749 of register 742.

Each of configurable input register/latches 720 and 750 can be configured to operate either as a latch or as a register, in response to a respective memory bit setting (721, 751) in the configuration memory. When the respective register/latch (720 or 740) operates as a register, data at its D input terminal is captured for storage and transferred to the its Q output terminal on the rising edge of the register's CLOCK signal (729 or 749). When the register/latch operates as a latch, any data change at D is captured and seen at Q while the signal on the corresponding CLOCK line (729 or 749) is at logic '1' (high). When the signal on the CLOCK line returns to the logic '0' state (e.g., low), the output state of Q is frozen in the present state, and any further change on D will not affect the condition of Q while CLOCK remains at logic '0'.

A COMMON SET/RST signal may be generated from a VGB to all IOBs or to a subset of IOBs in order to set or reset the respective latches (720, 750) in the affected IOB's. The COMMON SET/RST signal may also be generated by peripheral device that is coupled to the FPGA array by way of a particular IOB.

The Q output of register/latch 750 couples to respective first input terminals of a plurality of user-programmable, register-bypassing multiplexers 755 and 757. Multiplexer 757 drives direct connect amplifier 760 while multiplexer 755 drives amplifiers 761, 762, 765 and 766. Respective second input terminals of register-bypassing multiplexers 755 and 757 receive a register-bypassing signal from the output of delay-enabling multiplexer 744.

Referring to briefly back to FIG. 7A, for one subspecies of this embodiment, elements 790 and 791 respectively correspond to elements 761 and 762 of FIG. 7B while element 794 corresponds to element 730 and element 795 corresponds to element 710. While the specific embodiment of FIG. 7B uses plural flip flops respectively for storing input and output signals, it is also within the contemplation of the invention to use a single flip flop for at different times storing either an input or output signal and for directing respective clock and clock enable control signals to that one flip flop in accordance with its usage at those different times.

Figure 7C:
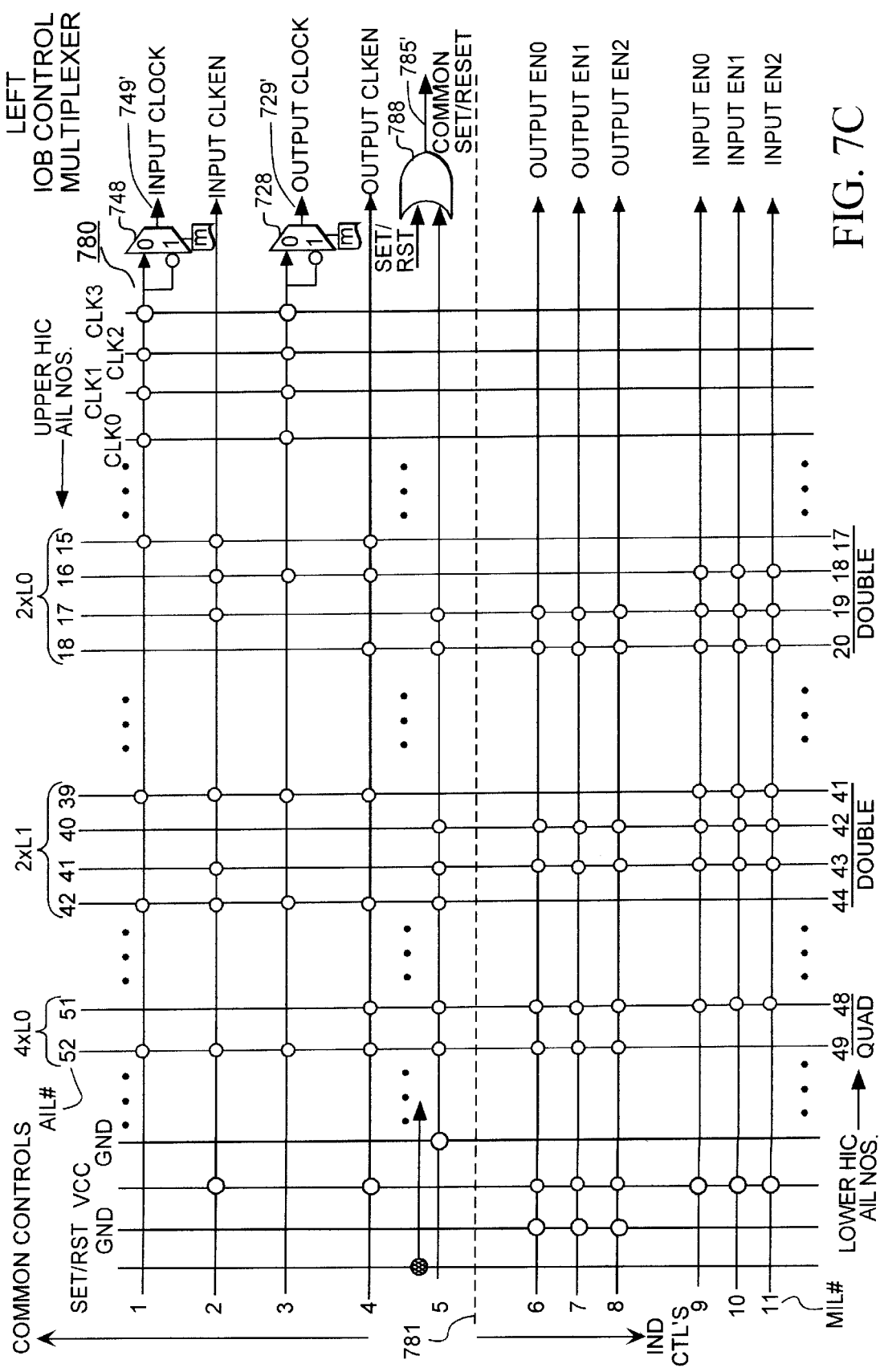
FIG. 7C illustrates an exemplary IOB controls-acquiring multiplexer that may be used for acquiring respective IOB input and output clock signals from neighboring interconnect lines.

Referring to FIG. 7C, the control signals that are used for a plurality of neighboring IOB's (which plurality is at least equal to 3 in one embodiment) may be derived from interconnect channels that extend perpendicular to the array edge on which the corresponding IOB's reside. In the example of FIG. 7C, a plurality of 6 co-controlled IOB's reside on a left edge and are neighbored by an immediately above or upper HIC and by an immediately below or lower HIC. The 6 co-controlled IOB's are divided into two non-overlapping subsets of 3 immediately adjacent IOB's. Each subset of 3 immediately adjacent IOB's has its own 'common' control signals which are shown above dashed line 781 and 'individual' controls which are shown below dashed line 781. For each such subset of 3 immediately adjacent IOB's there is a first stage multiplexer (not shown) which selects whether the immediately upper or immediately lower channel will supply the control signals. The successive second stage multiplexer is illustrated as 780 in FIG. 7C. This second stage multiplexer 780 determines which specific signals from the elected channel will be used.

The illustrated, 'left side', IOB control multiplexer 780 comprises a plurality of eleven multiplexer input lines designated as MILs #1–11. A partially-populating set of PIP's is distributed as shown over the crosspoints of MILs #1–11 and illustrated lines of the elected HIC (upper or lower) for transferring a signal from a desired HIC line to the respective MIL line. Each AIL has 8 PIP's along it for the embodiment of FIG. 7C while each MIL also has 8 PIP's along it. This allows for symmetric loading of lines.

MIL #1 for example, may be used to transfer to multiplexer 748 a control signal from AIL numbers 15, 39, 42 and 52 of the upper HIC when the upper HIC is elected or from AIL numbers 17, 41, 44 and 49 of the lower HIC when the lower HIC is elected. The other four PIP's of MIL #1 are coupled to the four global clock lines, CLK0–CLK3 of the FPGA array. Polarity-selecting multiplexer 748 is essentially the same as that shown in FIG. 7A except that for embodiments that follow FIG. 7C, clock line 749' connects directly to the clock inputs of each corresponding register 750 of the 3 IOB's in the controls-sharing group.

Similarly, for MIL #3, polarity-selecting multiplexer 728 is essentially the same as that shown in FIG. 7A except that for embodiments that follow FIG. 7C, clock line 729' connects directly to the clock inputs of each corresponding register 720 of the 3 IOB's in the controls-sharing group.

MIL #5 can provide a local set or reset signal which is logically ORred in OR gate 788 with the FPGA array's global SET/RST signal. Output 785' of the OR gate connects directly to the common SET/RST lines 705, 705' of each corresponding IOB in the controls-sharing group of IOB's.

If a local set or reset signal is not being used, MIL #5 should be programmably coupled to ground by the PIP crossing with the GND line.

MIL #6, 7, and 8 may be used to define individual IOB control signals OUTPUT_EN0, OUTPUT_EN1, OUTPUT_EN2 respectively to the OUTPUT_EN terminal of each of a first, second, third IOB of the control-sharing group. MILs #9, 10, 11 may be used to define individual IOB control signals INPUT_EN0, INPUT_EN1, INPUT_EN2 respectively to the INPUT_EN terminal of each of the first, second, and third IOB of the control-sharing group. Other means are of course possible for acquiring a subset of signals from the AIL's of each IOB and defining therefrom the control signals of the IOB. The connection between these aspects of the IOB's and the control signals that are used for controlling the embedded memory blocks of the same FPGA array will become apparent below.

Figure 7D:
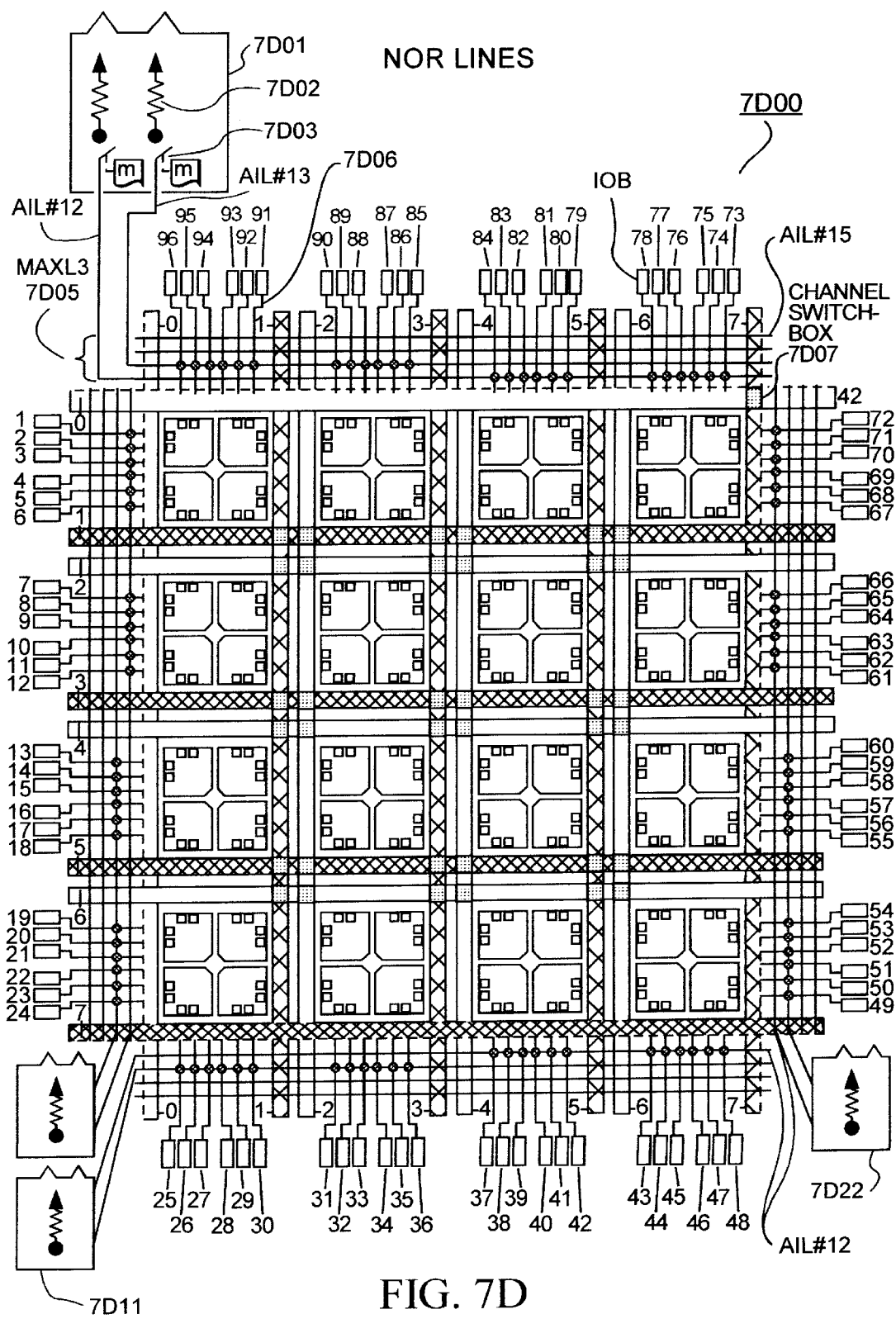
FIG. 7D shows a peripheral NOR lines structure provided in combination with the IOB's.

FIG. 7D illustrates an embodiment 7D00 that includes a specialized set of MaxL lines in the peripheral interconnect channels, which specialized lines are referred to as NOR lines. These NOR lines are defined by lines AIL#12 and AIL#13 in the set of MaxL lines that are referenced as the MaxL3 group or the AIL#12–15 group. When not placed in a NOR-enabled mode, the AIL#12 and AIL#13 lines function essentially the same as do other MaxL lines of the FPGA array. The embedded memory is not shown in FIG. 7D so as to avoid illustrative clutter.

The MaxL3 group of HIC0 is shown separately from the remainder of HIC0 as group 7D05. The same is true for the MaxL3 group of VIC0 and for the extreme right VIC and for extreme bottom HIC. The outer edges of these peripheral interconnect channels are drawn as dashed to indicate they each further encompass their separately shown, MaxL3 group.

Structure 7D01 is used to selectively place one or both of the AIL#12 and AIL#13 lines of the peripheral upper, horizontal interconnect channel (HIC0) in a NOR-enabled mode. As seen, structure 7D01 comprises a first resistive pull-up element 7D02 for pulling respective AIL#13 of HIC0 to logic '1' (high) and a user-programmable switch 7D03 for switching the AIL#13 line between the NOR-enabled mode and a MaxL-only mode. In one embodiment, the resistive pull-up element 7D02 has a variable resistance that responsively increases when corresponding line AIL#13 is sensed as being pulled down while the NOR-enabled mode is active. The variable resistance further responsively decreases when corresponding line AIL#13 is sensed as not being pulled down while the NOR-enabled mode is active. This helps to reduce power consumption when AIL#13 is being pulled down and helps to reduce susceptibility to noise when AIL#13 is being urged to the logic '1' state by element 7D02. A similar combination of elements like 7D02 and 7D03 is provided for AIL#13. Furthermore, each of the remaining three, peripheral interconnect channels is provided with its respective NOR-mode structure like 7D01 as indicated at 7D11 and 7D22.

As is well understood in the art, each of the peripheral AIL#12 and AIL#13 longlines may be used to implement a wired-NOR function when that longline is placed in the NOR-enabled mode. Any one of the IOB's connected to that NOR line may pull it low by way of its respective, open-drain driver (766 of FIG. 7B). If none of the IOB's pulls their respective NOR line low, the line may be urged to the logic '1' state by its respective NOR-mode structure (7D01). SVGB's may also drive the peripheral AIL#12 and AIL#13 longlines by way of their tristate drivers (e.g., N4, S4 of FIG. 5).

One possible use for the NOR-enabled mode is event decoding. The NOR line may be used to flip an SRAM address bit is any one of the IOB's feeding that NOR line pulls the NOR line low. In the embodiment of FIG. 7D, the upper half of the IOB's on the left and right sides of the FPGA array drive AIL#12. The lower half of the IOB's on the left and right sides of the FPGA array drive AIL#13. Thus there is mirror symmetry between the left and right sides. Further in the embodiment of FIG. 7D, the right half of the IOB's on the top and bottom sides of the FPGA array drive AIL#12. The left half of the IOB's on the top and bottom sides of the FPGA array drive AIL#13. Thus there is mirror symmetry between the top and bottom sides. Other patterns of connections between the IOB's and the NOR lines are alternatively possible. In one variation, the connections provide mirror symmetry relative to diagonals of the FPGA array.

Figure 7E:
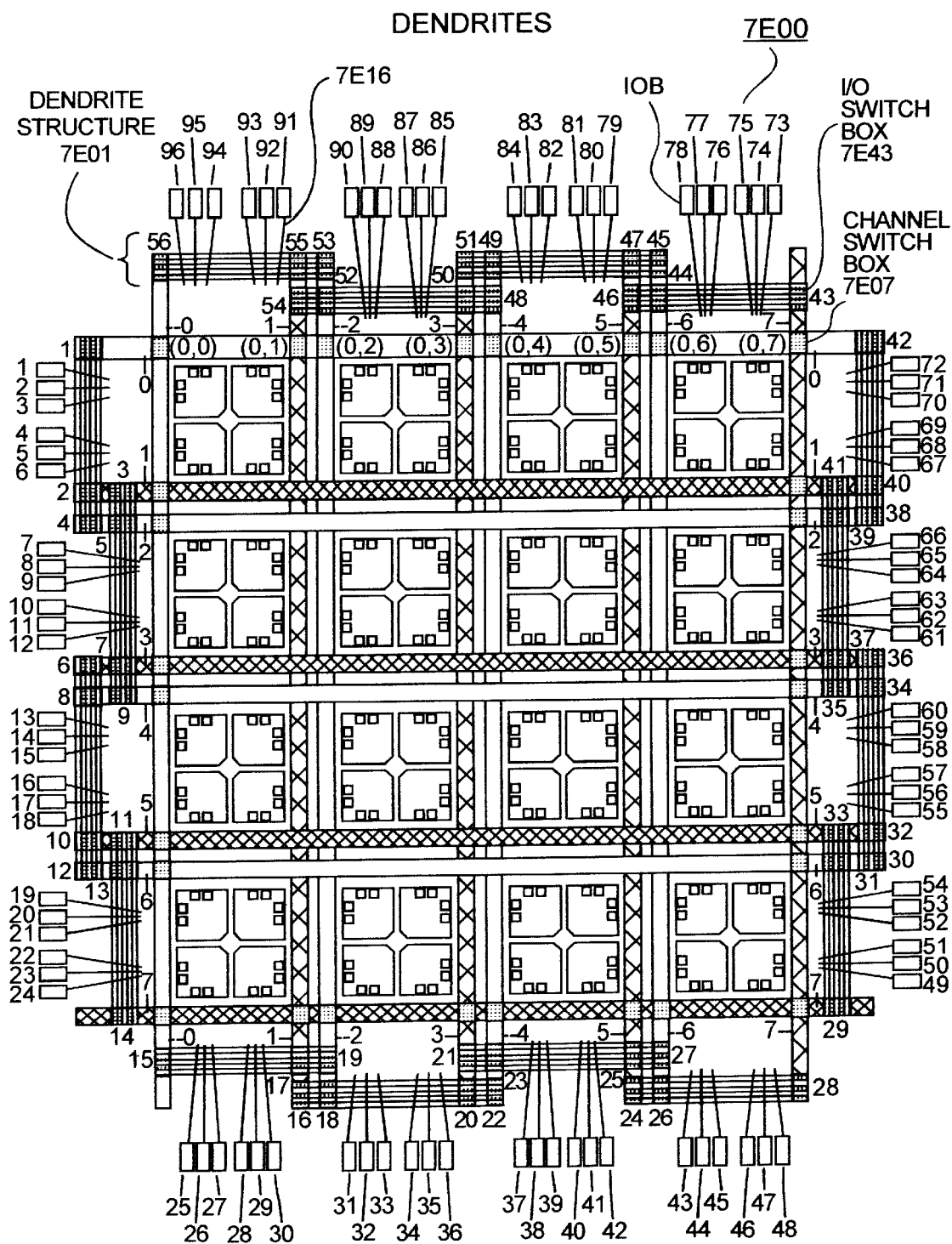
FIG. 7E shows a peripheral plurality of Dendrite structures provided in combination with the IOB's.

FIG. 7E illustrates an embodiment 7E00 that includes a plurality of dendrite structures for coupling IOB's one to another and also to neighboring and orthogonally-extending, interconnect channels. The embedded memory is not shown in FIG. 7E so as to avoid illustrative clutter. The plurality of dendrite structures are interposed between a ring defined by IOBs 1–96 and the peripheral interconnect channels identified as HIC(0), HIC(7), VIC(0), and VIC(7). In the illustrated embodiment 7E00 there are 28 dendrite structures. An example of a dendrite structure is shown at 7E01 and is seen to comprise a plurality of 6, horizontally-extending dendrite lines and a plurality of I/O switchboxes. An example of an I/O switchbox is identified at 7E43.

An example of a channels crosspoint switchbox is identified at 7E07 and is shown to contrast it with the I/O switchboxes. The channels crosspoint switchboxes of HIC (1) (e.g., switchbox 7E07) are identified as SwBxs (0,0), (0,1), (0,2), (0,3), (0,4), (0,5), and (0,6). These provide normal, routing of signals from a first line in one channel to a crossing line of another channel or from the terminal end of a first line in one channel to a starting end of a next line in the same one channel.

Corner dendrite structures such as that referenced by 7E01 have three I/O switchboxes for connecting to the closest three interconnect channels, where those interconnect channels extend orthogonally relative to the corresponding peripheral side of the FPGA array. Core dendrite structures such as the two shown to the immediate right of structure 7E01 have four I/O switchboxes for connecting to the closest four interconnect channels, where those four interconnect channels extend orthogonally relative to the corresponding peripheral side of the FPGA array. Accordingly, in the embodiment of FIG. 7E there is a total of 56 I/O switchboxes positioned at the crossing of dendrite lines and corresponding ones of the orthogonally extending channels for providing programmable interconnection between the crossing dendrite lines and corresponding lines in the orthogonally extending, interconnect channels.

In structure 7E01, each of the six angled lines (e.g., 7E16) that extends respectively from IOB's 91–96 to intersect with the six horizontal dendrite lines represents a bidirectional bus. Each bidirectional bus such as 7E16 allows its respective IOB to either source a signal onto one or more of the dendrite lines or to receive a signal from a selected one of the dendrite lines. The dendrites part of the architecture therefore advantageously allows signals to be routed between IOBs or from a given IOB to plural, general channels without utilizing the general interconnect resources for such cross-coupling. For example, IOB 90 may be receiving an external data signal from its pad. It may be desirable to have this one signal sampled at different times by multiple logic or memory circuits scattered through the FPGA array. By use of its dendrite structure, IOB 90 can broadcast its received signal to all four of VIC's 1, 2, 3 and 4 with substantially same delay. In a similar way, IOB 10 can broadcast its received signal to all four of HIC's 1, 2, 3 and 4. Thus an external signal may be propagated with substantially same delay from a given I/O pin (and through its given IOB) to multiple parts of the FPGA array by way of the dendrite lines.

Another advantage of the dendrites architecture may be referred to as the pin-retention feature. Because the dendrites can be used to propagate a given I/O signal with substantially same delay between a given I/O pin (and through its given IOB) and multiple parts of the FPGA array, a specific pin (package lead) may be assigned a fixed functionality while at the same time, the internal configuration of the FPGA array may be varied such that different placements are used for implementing the logic and/or memory that processes the given I/O signal. To the outside world it may appear as if no changes have been made to the functionality of the given I/O signal even though the placement of its function-implementing VGB's or SRAM blocks has changed significantly inside the chip. The dendrites-based architecture gives FPGA configuring software freedom to optimize the FPGA configuration by rerouting the paths that various I/O signals take between corresponding, but fixedly-positioned I/O pins, and the interchangeable VGB's that will ultimately each implement a variably-placeable circuit chunk.

Figure 7F:
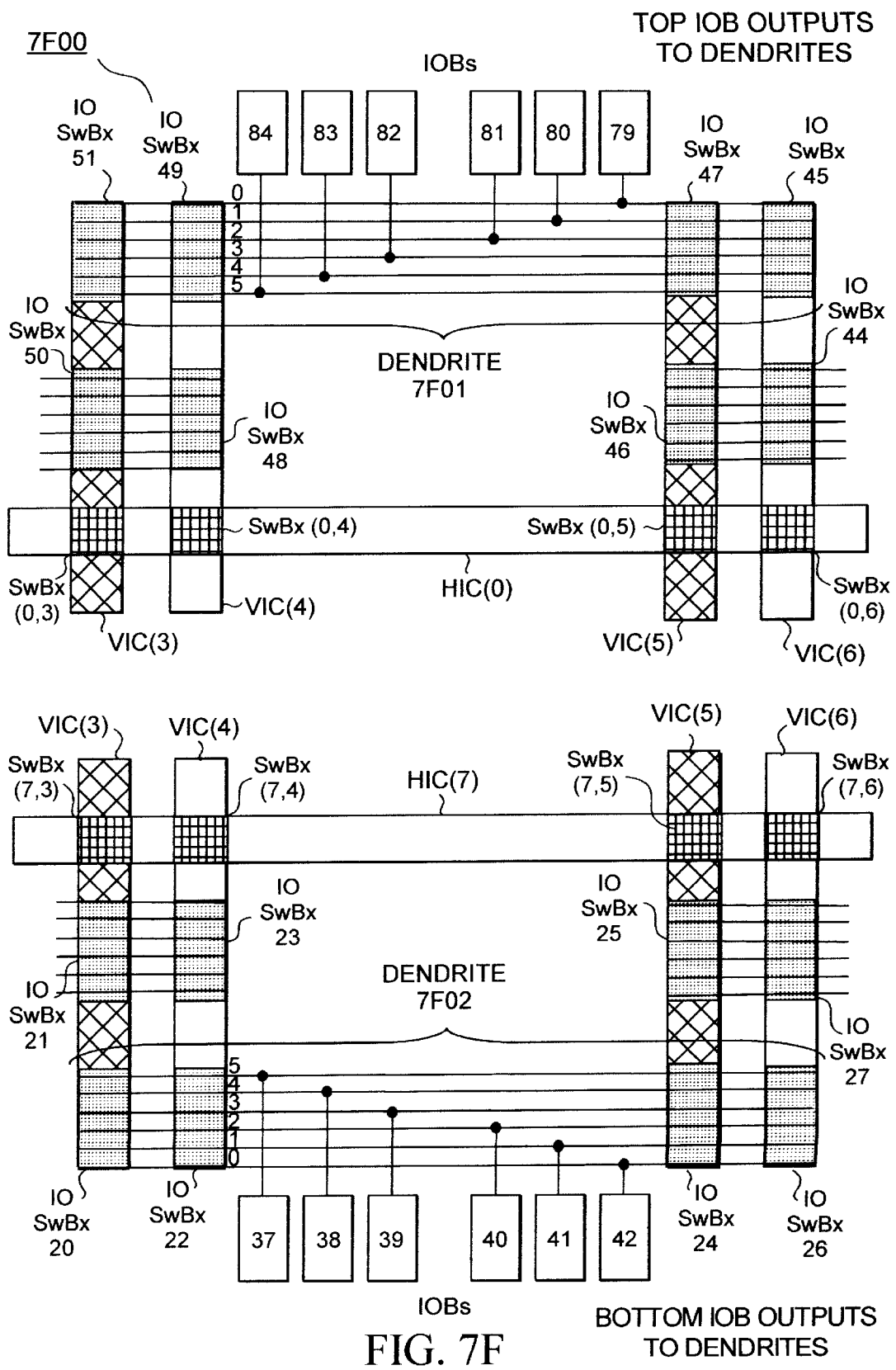
FIG. 7F illustrates an exemplary connection pattern for the dendrite line drivers of the IOB's to respective dendrite lines.

FIG. 7F illustrates an example of an embodiment 7F00 wherein each IOB in a group of six IOB's such as 79–84 is assigned to drive a respective one of the six dendrite lines, 0–5. In other words, each respective dendrite driver (765 of FIG. 7B) connects to one dendrite line. FIG. 7F shows the mirror symmetry of connections between the top and bottom portions of the FPGA array. A similar mirror (not shown) may be provided for the left and right sides.

Figure 7G:
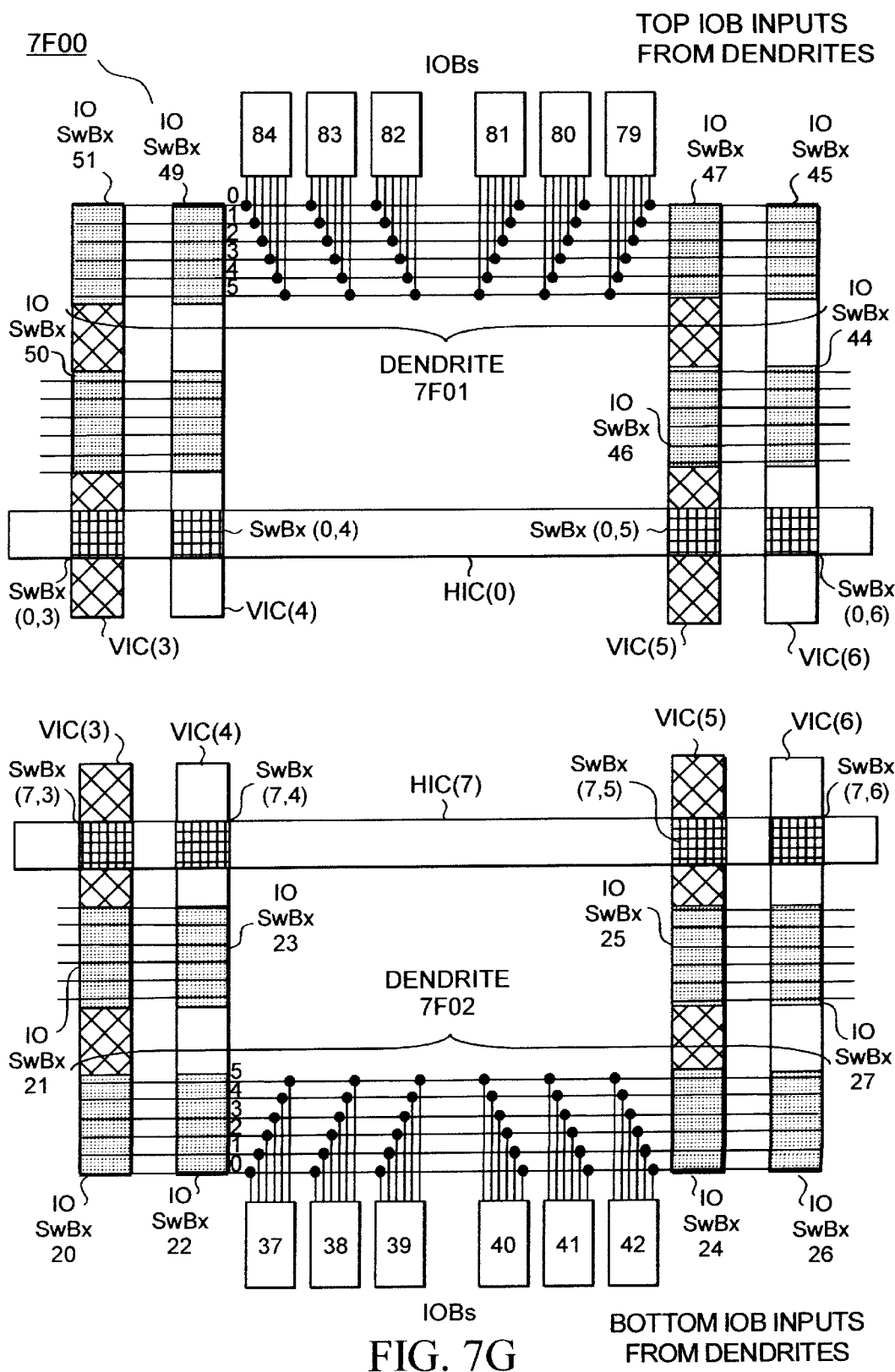
FIG. 7G illustrates an exemplary connection pattern for the dendrite-line multiplexer-inputs of the IOB's and the respective dendrite lines.

FIG. 7G illustrates a further aspect of embodiment 7F00 wherein each IOB in a group of six IOB's such as 79–84 is able to selectively receive six signals from each respective one of the six dendrite lines, 0–5. In other words, each respective IOB input multiplexer (710 of FIG. 7B) connects to six dendrite lines. FIG. 7G shows the mirror symmetry of connections between the top and bottom portions of the FPGA array. A similar mirror (not shown) may be provided for the left and right sides.

Figure 7H:
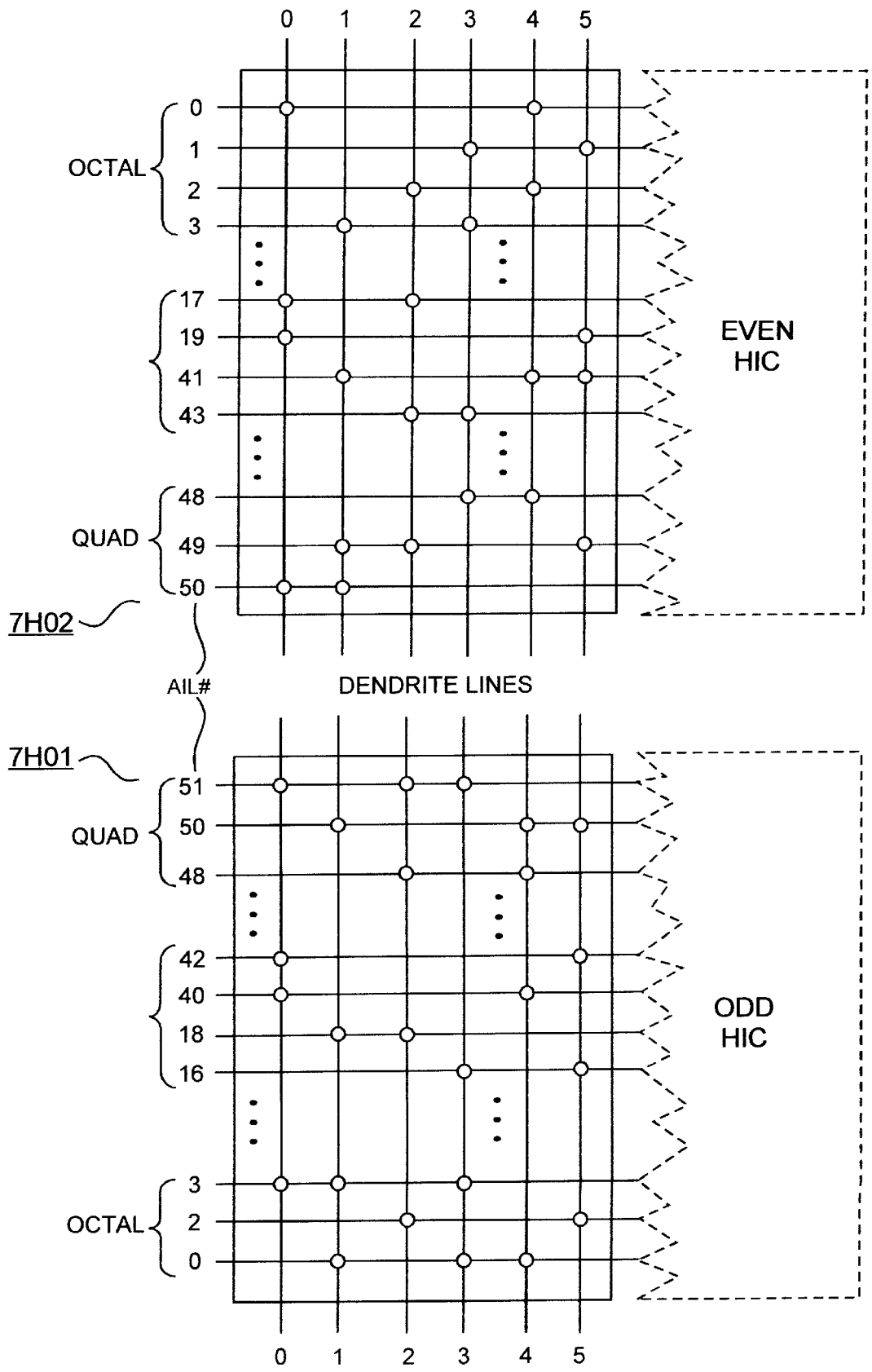
FIG. 7H illustrates an exemplary pattern of PIP's for a switchbox at a crossing of dendrite lines with adjacent, odd and even-numbered HIC's.

FIG. 7H illustrates an example of an embodiment 7H00 of PIP distributions for I/O switchboxes 7H01 and 7H02. I/O switchbox 7H01 services intersections of odd-numbered HIC's (1, 3, 5, etc.) with corresponding dendrite lines 0–5. I/O switchbox 7H02 services intersections of even-numbered HIC's (0, 2, 4, etc.) with corresponding dendrite lines 0–5. The illustrated AIL (adjacent interconnect line) numbers correspond to groups of 2×L, 4×L and 8×L lines. Other distributions of PIP's and interconnection with diversified interconnect resources are of course possible.

Figure 8:
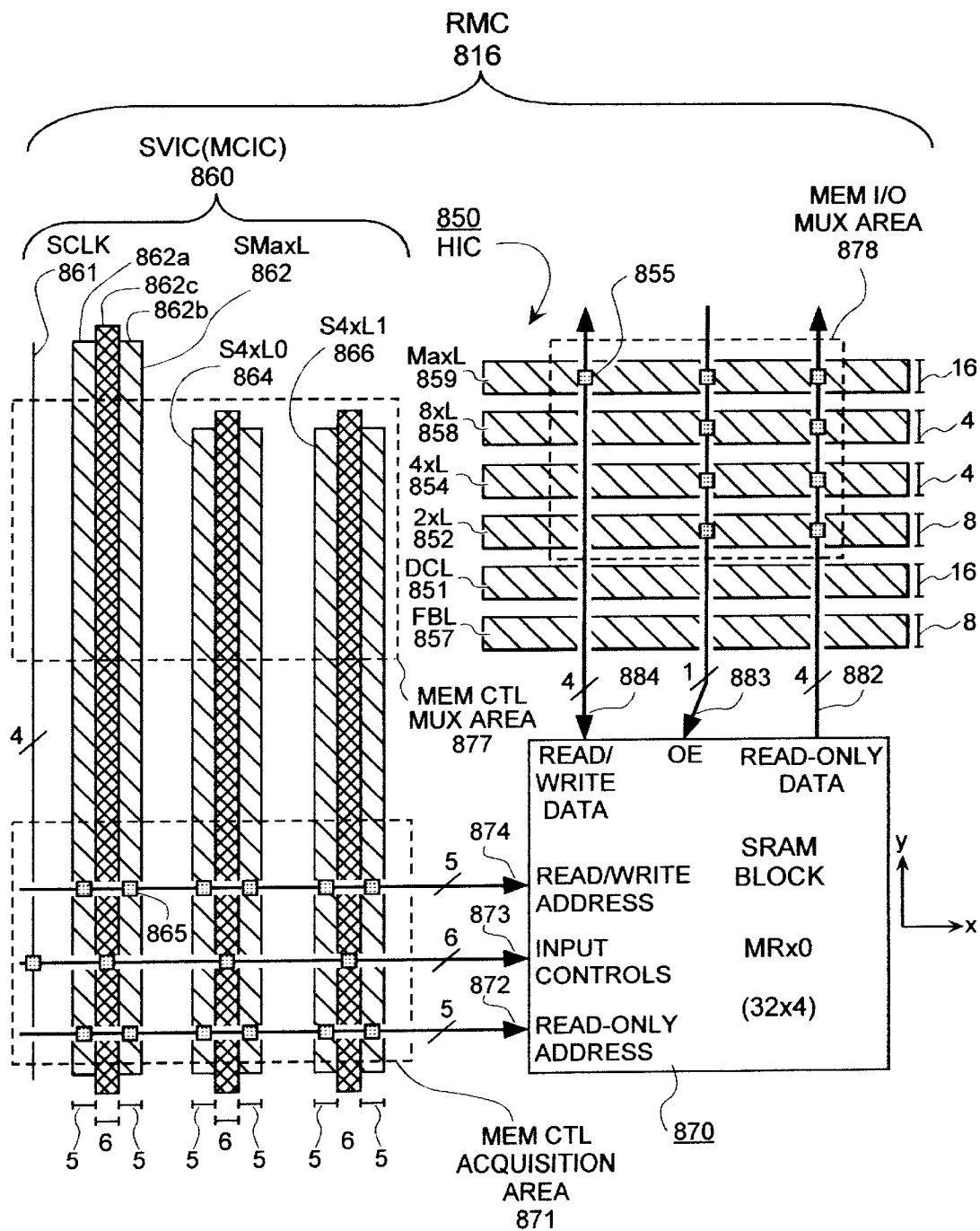
FIG. 8 is a further magnified illustration of one embodiment of FIG. 3, showing further details of a Right Memory Column (RMC), and in particular of a given SRAM block in accordance with the invention and its neighboring interconnect channels.

With the above descriptions now in place, we next refer to FIG. 8 for providing an integrated explanation of how the various interconnect resources, VGB's and IOB's can cooperate with the embedded memory. In FIG. 8, a right memory channel (RMC) is broadly shown at 816. The RMC 816 includes a special vertical interconnect channel (SVIC) as shown under the braces of 860 and a memory block as shown at 870. SVIC 860 may be alternatively referred to herein as Memory Controls-conveying Interconnect Channel (MCIC) 860.

A horizontal interconnect channel (HIC) that belongs to the general interconnect of the FPGA array is shown passing through at 850. Darkened squares such as at 855 are used to indicate general areas of possible interconnection (e.g., PIP connections) to various portions of the passing-through HIC. Memory I/O multiplexer area 878 (first dashed box) corresponds to area 478 of FIG. 3. Memory control multiplexer area 877 (second dashed box) corresponds to area 477 of FIG. 3. Memory control acquisition area 871 (third dashed box) corresponds to symbol 471 of FIG. 3.

Memory block 870 contains a multi-ported SRAM array organized as 32-by-4 bits (for a total of 128 bits). One of the ports is of a read-only type as indicated at 882. Another port is bidirectional and provides for both reading of nibble-wide data out of memory block 870 and for writing of nibble-wide data into memory block 870 as indicated at 884. Output enable terminal 883 cooperates with the read/write data port 884, as will be explained shortly. For sake of convenience, the read/write port 884 is also be referred to herein as the first port, or Port_1. The read-only data port 882 is referred to as the second port, or Port_2.

Two different address signals may be simultaneously applied to memory block 870 for respectively defining the target nibble (4 data bits) that are to pass through each of first and second data ports, 884 and 882. As such, a 5-bit wide first address-receiving port 874 is provided in block 870 for receiving address signals for the read/write data port 884 (Port_1). A second 5-bit wide address-input port 872 is provided for receiving independent address signals for association with the read-only data port 882 (Port_2). Additionally, a 6-bit wide controls-input port 873 is provided in block 870 for receiving various control signals from the adjacent SVIC 860 as will be detailed shortly. The respective combination of 5, 6, and 5 (address, control, address) lines adds up to a total of 16 such lines.

SVIC (MCIC) 860 contains a diversified set of special-function interconnect lines. A first set of four longlines are dedicated to carrying the CLK0–CLK3 clock signals of the FPGA array. This set of four clock lines is denoted as SCLK bus 861.

Another set of sixteen longlines is illustrated at 862 and identified as special maximum length lines (SMaxL). Like the other longlines of integrated circuit 100, the SMaxL lines 862 extend continuously and fully over a corresponding working dimension of the FPGA matrix. The SMaxL lines 862 are subdivided into respective groups of 5, 6 and 5 lines each as denoted by identifiers 862a, 862c and 862b. Configurable interconnections of these respective components 862a–c with crossing buses 872–874 are denoted by darkened squares such as at 865. It is seen from the darkened square icons of FIG. 8 that either of the 5-bit wide longline components 862a or 862b can supply a 5-bit wide address signal to either one or both of address-input ports 874 and 872. Similarly, the 6-bit wide vertical longline component 862c may be used for supplying all six of the control signals supplied to 6-bit wide port 873.

SVIC (MCIC) 860 further includes two sets of special, quad-length lines respectively denoted as S4×L0 and S4×L1. These sets of quad-lines are respectively illustrated at 864 and 866 as being each sixteen lines wide. In each set of quad lines, the set is further subdivided into respective components of five, six and five lines (5/6/5) in the same manner that wires-group 862 was. Again, darkened squares are used to indicate the provision of configurable interconnections to the respective ports 872, 873 and 874 of memory block 870. Unlike the staggered organization of the general quad-length lines (4×L lines) shown in FIG. 2, in one embodiment of the FPGA device 100 the special, quad-length lines in the two sets, S4×L0 (864) and S4×L1 (866) are not staggered and are not joined one to the next by switch boxes. This non-staggered organization allows for simultaneous broadcast to a group of as many as 4 adjacent SRAM blocks (4×4×32 bits of memory) of five bits of address signals for each respective address port (874,872) and/or six bits of control signals for each respective control port (873). Omission of switch boxes in the two special quad-length sets, S4×L0 (864) and S4×L1 (866), helps to reduce capacitive loading and thereby helps to speed the transmission of address and/or control signals to ports 872,873, 874 by way of S4×L0 (864) and S4×L1 (866).

Memory control acquisition area 871 (dashed box) is defined by the darkened square connections of SVIC 860 to ports 872, 873, 874 of block 870. The memory control acquisition area 871 may be configured by the FPGA user such that the five bits of the read-only address input port 872 may be acquired from the five-bit wide components of any one of line sets 862, 864 and 866. Similarly, the five-bit address signal of the read/write input port 874 may be acquired from any one of these vertical line subsets. The six control signals of input controls port 873 may be acquired partially from the SCLK bus 861 and/or fully from any one of the six-bit wide components of vertical line sets 862, 864 and 866.

FPGA-wide address or control signals that are common to a given embedded memory column 114/116 may be broadcast as such over longlines such as that of SVIC components 861 and 862. More localized address or control signals that are common to a given section of an embedded memory column 114/116 may be broadcast as such over S4×L components 864 and 866 of the SVIC.

HIC 850 crosses with SVIC 860 in the region of memory control multiplexer area 877. As seen in FIG. 8, HIC 850 also has a set of subcomponents. More specifically, there are sixteen longlines denoted at 859 as the MaxL set. There are four octal-length lines denoted at 858 as the 8×L set. There are four quad-length lines denoted at 854 as the 4×L set. There are eight double-length lines denoted at 852 as the 2×L set. Furthermore, there are sixteen direct-connect lines denoted at 851 as the DCL set. Moreover, there are eight feedback lines denoted at 857 as the FBL set. Nibble-wide data transmission is facilitated by the presentation of each of these diversified interconnect resources (851, 852, 854, 857-859) as a number of wires, where the number is an integer multiple of 4.

Within the dashed box of FIG. 8 that is designated as memory I/O multiplexer area 878, darkened squares are provided to show the general interconnections that may be formed (in accordance with one embodiment) between HIC 850 and the buses extending from ports 882, 883 and 884 of the memory block 870. As seen, in this embodiment, the read/write data port 884 (Port_1) is restricted to configurable connections only with the MaxL set 859. This restriction allows for run-time switching between read and write modes. It should be recalled from FIGS. 7A–7B that the longlines of the MaxL set 859 can be driven by tristate drivers of the adjacent SVGB's and/or IOB's. As will be seen in FIG. 9, the read/write data port 884 (Port_1) also has tristate drive capability. Data can thus be output onto the tristateable MaxL set 859 by a given bus master (SVGB or IOB) that wants to write data into the read/write data port 884 (Port_1) or output onto the tristateable MaxL set 859 by Port_1 itself when Port_1 (884) is in a read mode.

The read-only data port 882 (Port_2) can output data signals, in accordance with the illustrated interconnect possibilities, to any one or more of the MaxL set 859, the 8×L set 858, the 4×L set 854 and the 2×L set 852.

Output enable signals may be acquired by port 883 in accordance with the illustrated interconnect possibilities, from one of sets 859, 858, 854 and 852.

It is within the contemplation of the invention to have other patterns of interconnect coupling possibilities in multiplexer area 878. However, for one embodiment of SRAM block 870, the particular intercoupling possibilities shown in 878 is preferred for the following reasons. The read-only data port 882 (Port_2) tends to output read data at a faster rate than does the read/write data port 884 (Port_1). As such, it is particularly useful to be able to output this more-quickly accessed data (from Port_2) by way of the shorter-length (and thus faster) 2×L lines 852. A user-configurable multiplexer coupling is therefore provided from the read-only data port 882 to the 2×L lines set 852. Additional user-configurable multiplexer couplings are further provided to line sets 854, 858 and 859.

The writing of data into port 884 or the reading of data from port 884 tends to be a relatively slower process as compared to the reading of data from port 882. At the same time, it is desirable to be able to source data into port 884 from any column of the FPGA device 100 (FIG. 1) and/or from any column of IOB's (1–24, 49–72). User-configurable multiplexer connections 855 are therefore provided for bi-directional and tristateable transfer of data between the read/write data port 884 and the MaxL lines set 859. However, it is not desirable to have further user-configurable interconnections between read/write data port 884 and the other, not-tristateable line sets 858, 854, 852, 851 and 857 of HIC 850. Converting the other line sets 858, 854, 852, 851 and 857 of HIC 850 into tristateable lines would consume additional space in the integrated circuit 100 because the 2/4/8×L outputs (FIG. 4) of the CBB's would have to be converted into tristate drivers for this one purpose without providing substantial improvement in speed and performance. As such, in a preferred embodiment, the read/write data port 884 (Port_1) is couplable only to the adjacent MaxL lines set 859.

It will be seen later (in the embodiment of FIG. 9), that the OE port 883 may be used to time the outputting of time-multiplexed data from port 884. The output data may be pre-stored in a Port_1 read-register (not shown in FIG. 8). As such, high-speed coupling of control signals to port 883 may be desirable even if the Port_1 data portion 884 couples only to longlines 859. Data may be time-multiplexed onto longlines 859 at relatively high switching speed by using the high-speed enabling function of the OE port 883. Accordingly, as seen in FIG. 8, user-configurable multiplexer options are provided for coupling control signals to OE port 883 from the shorter (faster) line sets 852, 854 and 858 as well as from longer line set 859.

Figure 9:
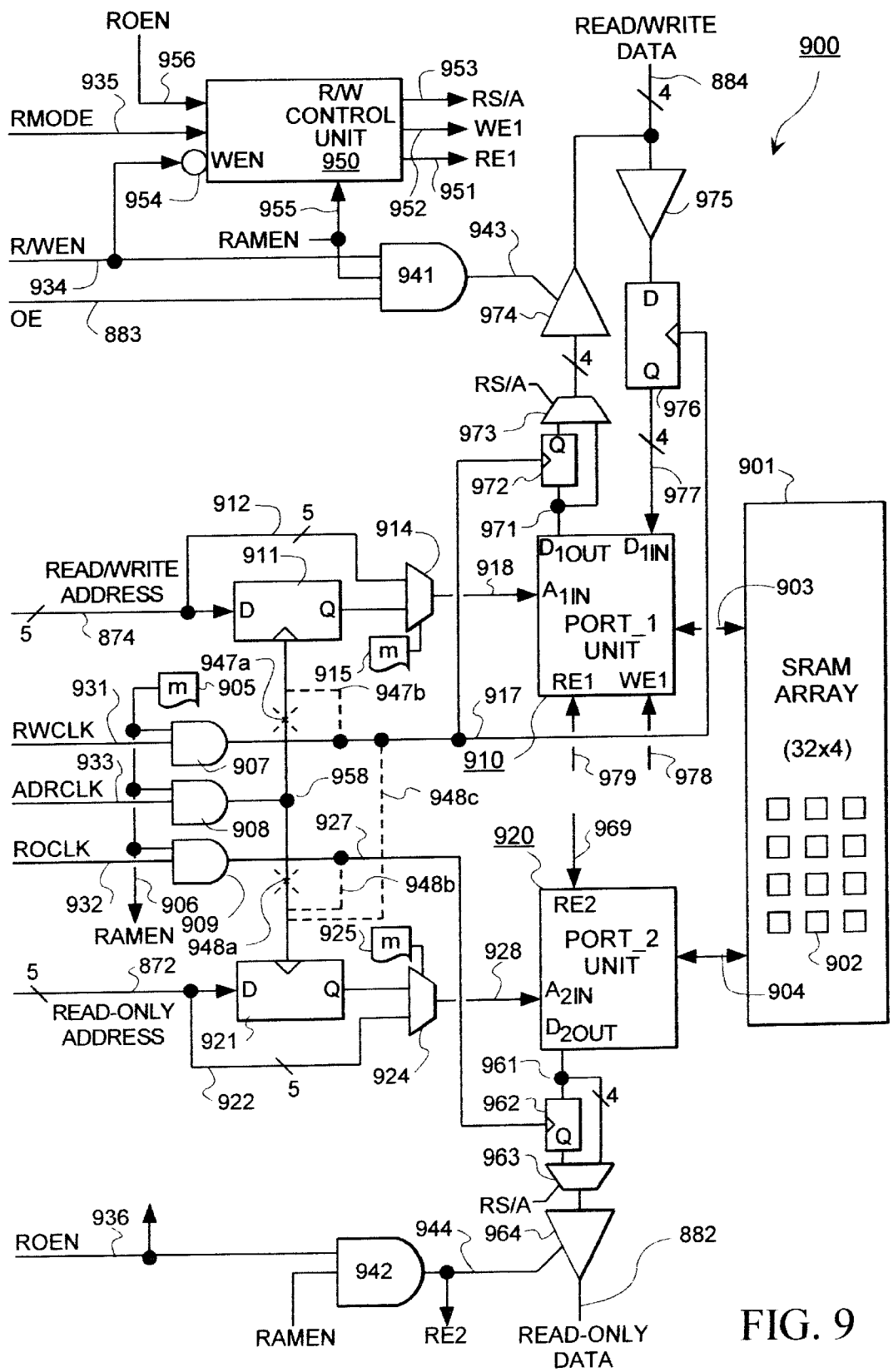
FIG. 9 is a further magnified illustration of one embodiment of FIG. 8, showing further details inside of a given SRAM block.

FIG. 9 shows a next level of details within an SRAM block such as 870 of FIG. 8. The internal structure of such an SRAM block is generally designated as 900 and includes a shared SRAM array 901. Repeated, dual-port memory cells are provided within array 901. Each such dual-port memory cell is referenced as 902.

In one embodiment of FPGA device 100 (FIG. 1), there are 128 dual-ported memory cells 902 within SRAM array 901. The data of these cells 902 may be simultaneously accessed by way of respective, bidirectional couplings 903 and 904. Couplings 903 and 904 carry both address and data signals for the correspondingly accessed cells.

A first configuration memory bit 905 of the FPGA device 100 is dedicated to a respective SRAM block 900 for allowing users to disable transition-sensitive inputs of block 900 in cases where block 900 is not being used. A logic '0' is stored in configuration memory bit 905 when block 900 is not used. A logic '1' signal in configuration memory bit 905 becomes an active RAM enabling signal 906 (RAMEN) that permits block 900 to be used.

A first port control unit 910 (Port_1 Unit) is provided for controlling operations of the read/write data port 884 and its corresponding address input port 874.

The supplied five-bit address signal 874 for Port_1 may be stored within a first address-holding register 911 of block 900 and/or it may be transmitted through bypass path 912 to a first data input of address multiplexer 914. A second data input of multiplexer 914 receives the Q output of the first address-storing register 911. Configuration memory bit 915 controls multiplexer 914 to select as the current address signal ($A_{1in}$) of Port_1, either the signal present at the first input (912) or at the second input (Q) of address-selecting multiplexer 914. The selected address signal 918 is then applied to the address input $A_{1in}$ of the Port_1 unit 910.

An address-strobing signal 958 may be applied to a clock input of address-storing register 911 for causing register 911 to latch onto the signal presented on line 874. The address-strobing signal 958 is produced by passing a rising edge of an address-validating clock signal (ADRCLK) through control-input terminal 933 and through an address-strobe enabling AND gate 908. The second input of AND gate 908 is connected to the RAMEN signal 906 so that the output of gate 908 is pulled low (to logic '0' when RAMEN is at logic '0'.

In addition to address-input port 918, the Port_1 unit 910 has a $D_{1out}$ port (971) from which data may be read out and a $D_{1in}$ port (977) into which data may be written. Port_1 unit 910 further includes a write-enable terminal 978 (WE1) onto which a logic '1' signal must be placed in order to move write data from the $D_{1in}$ port 977 into SRAM array 901 by way of coupling 903. Unit 910 further has a read-enable terminal 979 (RE1) onto which a logic '1' signal must be placed in order to move read data from array 901 to the $D_{1out}$ port 971 by way of coupling 903.

The $D_{1out}$ port 971 is 4-bits wide and is coupled to the D input port of a 4-bit wide, read-register 972. The Q output of register 972 couples to one selectable input of a synch controlling multiplexer 973. The $D_{1out}$ port 971 additionally couples to a second 4-bit wide selectable input of multiplexer 973. An RS/A control signal (Read Synch or Asynch control) is applied to the selection control terminal of the synch controlling multiplexer 973 for selecting one of its inputs as a signal to be output to tri-state output driver 974. The RS/A signal comes from a control output 953 of an R/W control unit 950. Another output terminal 952 of the R/W control unit produces the WE1 signal which couples to terminal 978. Yet another output terminal 951 produces the RE1 signal which couples to terminal 979.

The output enabling terminal of tri-state driver 974 is coupled to output 943 of a Port_1 read-enabling AND gate 941. AND gate 941 includes three input terminals respectively coupled to receive the RAMEN signal 906, the OE signal from line 883, and an R/WEN signal as provided on line 934.

Line 934 (R/WEN) is one of the six lines that form control port 873 (FIG. 8). The other five lines are respectively: 931 for receiving an RWCLK (read/write clock) signal, 932 for receiving an ROCLK (read-only clock) signal, 933 for receiving the already-mentioned ADRCLK signal, 935 for receiving an RMODE signal, and 936 for receiving an ROEN (read-only enable) signal.

The RWCLK (read/write clock) signal on line 931 passes through AND gate 907 when RAMEN is true to provide access-enabling strobes on line 917 for Port_1. Line 917 couples to a rising-edge sensitive, clock input of the read register 972 of Port_1. Register 972 acquires the $D_{1out}$ signal at its D input for storage upon the rising edge of each pulse presented on line 917.

The Port_1 access-enabling line 917 also connects to a rising-edge sensitive, clock input of a write-data storing register 976. Register 976 receives four bits of write-data at its D input port from write buffer (high input impedance amplifier) 975. The input of buffer 975 connects to the 4-bit wide read/write data port 884. The output (Q) of register 976 couples to the 4-bit wide $D_{1in}$ input of the Port_1 unit 910.

It is seen, therefore, that acquisition of memory write data through port 884 occurs in synchronism with the RWCLK signal 931. For writing to occur, an active write-enable signal WEN must further be applied to terminal 954 of the read/write control unit 950. WEN 954 is the binary inverse of the R/WEN signal on control line 934. The combination of R/WEN control line 934 and OE control line 883 is provided so that the read/write port (Port_1) may have at least three separate states, namely, high-impedance output (Hi-Z), active bistable output (reading), and data inputting (writing).

In a first alternate embodiment, the dashed line cut indicated by 947a and the dashed, alternate line connection indicated by 947b are made. This modifies the clocking of address register 911 such that register 911 is responsive to the RWCLK signal, where the latter signal also clocks the data-output register 972 and the data-input register 976. Address-storing register 911 is modified to latch its data (D) on a first of the rising and falling edges of the passed-through, RWCLK pulses while data-output register 972 is modified to latch its data ($D_{1out}$) on the second of the rising and falling edges of the passed-through, RWCLK pulses. Thus registers 911 and 972 latch in respective response to opposed edges of each RWCLK pulse. The pulse width of the passed-through RWCLK pulses (917) can then be adjusted in such a first alternate embodiment to provide different timing for the address-capture and output-data capture events. The pulse width of the passed-through RWCLK pulses (917) should, of course, be at least equal to if not greater than the address-strobe to read-valid latency of Port_1. Register 976 may latch on either edge of the passed-through RWCLK pulses (917). If write-register 976 is made to latch on the pulse edge opposite to that of read-register 972, write and read-back operations may be carried out in close time proximity to one another.

In yet a further or alternate embodiment, the dashed line cut indicated by 948a and the dashed, alternate line connection indicated by 947b are made. This modifies the clocking of address register 921 such that register 921 is responsive to the ROCLK signal, where the latter signal (927) also clocks the data-output register 962. Address-storing register 921 is modified to latch its data (D) on a first of the rising and falling edges of the passed-through, ROCLK pulses (927) while data-output register 962 is modified to latch its data ($D_{2out}$) on the second of the rising and falling edges of the passed-through, ROCLK pulses. Thus registers 921 and 962 latch in respective response to opposed edges of each ROCLK pulse. The pulse width of the passed-through ROCLK pulses (927) can then be adjusted in such a second embodiment to provide different timing for the address-capture and output-data capture events of Port_2. The pulse width of the passed-through ROCLK pulses (927) should, of course, be at least equal to if not greater than the address-strobe to read-valid latency of Port_2.

If both of modifications 947a,b and 948a,b are made, then the ADRCLK control signal 933 and its associated hardware (e.g., gate 908 of FIG. 9) may be eliminated to thereby provide a more compact device.

In yet another variation, dashed connection 948c is made in combination with modifications 947a,b and 948a. Modification 948b is not made. This leaves register 962 as being responsive to the ROCLK signal 927 while registers 921, 911, 972 and 976 are all clocked by one or another of the edges of the RWCLK pulses.

In yet another alternate embodiment, line 933, gate 908 and line 958 are replicated. Cut 948a is made and the clock input of register 921 is instead connected to the replicated version of line 958. These modifications define two separate, address-validating strobes (each being RAMEN-enabled), where one is dedicated to the Port_1 address-storing register 911 and the other is dedicated to the Port_2 address-storing register 921.

Referring to FIG. 10, one implementation 1077 of a memory control multiplexer area, such as 877 of FIG. 8, is shown. Numbers below write column 1001 (AIL#) represent the adjacent interconnect line numbers of the corresponding HIC 850. The same AIL# numbers are seen in other figures herein. At the left side of FIG. 10, the different kinds of horizontal interconnect lines are identified as groups of four lines each with the following identifications: MaxL0 (859a), MaxL1 (859b), MaxL2 (859c), 4×L0 (854a), 8×L (858), 2×L0 (852a) and 2×L1 (852b). The dedicated, horizontal clock lines CLK2 and CLK3 are also shown at 853. Horizontal clock lines 853 are hard wired to two of the SCLK lines in bus 861, as shown. There is also a MaxL3 set in HIC 850, which MaxL3 set is not shown in FIG. 10 because no connections are provided between the MaxL3 set and SVIC 860 of the illustrated embodiment.

The lines of SVIC 860 are shown in FIG. 10 under the same designations as used in FIG. 8. Each of line groups 862, 864 and 866 is subdivided into respective components of five address lines, six control lines and five further address lines. Bit significance in each of the five-lines wide address-carrying component 862a, 862b, 864a, 864b, 866a and 866b, progresses from left to right, as follows: 0, 3, 1, 4, 2. Each SVIC address line designated as having a bit significance of 0 carries an address bit of least significance (LSaB). Conversely, each SVIC address line designated as 4 carries the most significant (MSaB) of the five address bits carried by its corresponding SVIC component 862a–866b. This significance distribution is shown, for example, at 1005.

Fully-hollowed circles such as shown at 1007 represent bidirectional PIP'S. Half-hollowed, half-shaded circles such as within dashed box 1010 each represent a unidirectional PIP that, when activated, drives a corresponding signal from a given line of HIC 850 onto an intersecting vertical line within SVIC section 862.

Dashed box 1010 identifies one group of five PIP's which can be individually activated so as to transfer a 5-bit address signal from respective HIC groups, MaxL0, MaxL1, MaxL2 and 4×L0, onto SVIC component 862b. Note that a more significant address bit (MSaB) of group 1010 can be driven by a line in the 4×L0 set 854a. Comparatively less significant address bits (LSaB) of group 1010 can be driven by lines in the MaxL sets 859a–859c. This arrangement allows the less significant address bits to be broadcast by the MaxL longlines while the MSaB is separately toggled in accordance with a local signal on the corresponding 4×L0 line. In dashed box 1010, the 2ND set of MaxL lines (AIL's #9, #25, #33) may drive address bits 0, 1 and 3 while BOT AIL #35 may drive address bit 2 of SMaxL component 862b.

In adjacent SMaxL component 862a, the TOP set of MaxL lines (AIL's #8, #24, #32) may drive address bits 0, 1 and 3 while BOT AIL #27 may drive address bit 2.

Dashed box 1020 highlights a connection pattern that is inverse to that of box 1010. In dashed box 1020, the 2×L0 and 2×L1 line groups 852a–852b may drive the LSaB lines 0, 1, 2 while two longer horizontal lines in 8×L line group 858 may provide the MSaB's 3–4. The longer 8×L lines may thus broadcast the upper two address bits of dashed box 1020 while the shorter 2×L lines may separately carry different lower-order address bits.

Because each PIP of FIG. 10 is individually programmable during configuration time, users may configure any desired combination of signal transfers from HIC 850 to SVIC 860 as made possible by the illustrated distribution of PIP's. Dashed box 1030 shows another possibility wherein a first group of three lines from HIC set 4×L0 (854a) is combined with another set of two lines from HIC set 8×L (858) to define the five unique address bits driven onto S4×L0 component 864a of the SVIC. LSaB's 0–1 may be driven by 8×L lines while MSaB's 2–4 may be driven by 4×L lines.

Dashed box 1040 shows yet another possibility wherein all five address bits of SVIC component 864b are derived from HIC sets 2×L0 and 2×L1.

As further seen in FIG. 10, SVIC control component 862c may acquire respective control signals from either one or both of the HIC longlines 859a–859c and the shorter HIC lines 858, 854 and 852. On the other hand, SVIC control components 864c and 866c may not acquire control signals from the HIC longlines, but rather only from the 8×L and shorter lines by way of bidirectional PIP's. More specifically, in control component 862c of the SVIC, the 3RD set of MaxL lines (AIL's #10, #26, #34) may provide three of the control signals while BOT AIL #11 provides a fourth. The partially-populated PIP's pattern of FIG. 10 of course repeats at each intersection of SVIC 860 with a HIC so that address and control signals may be sourced from different HIC's.

Figure 11A:
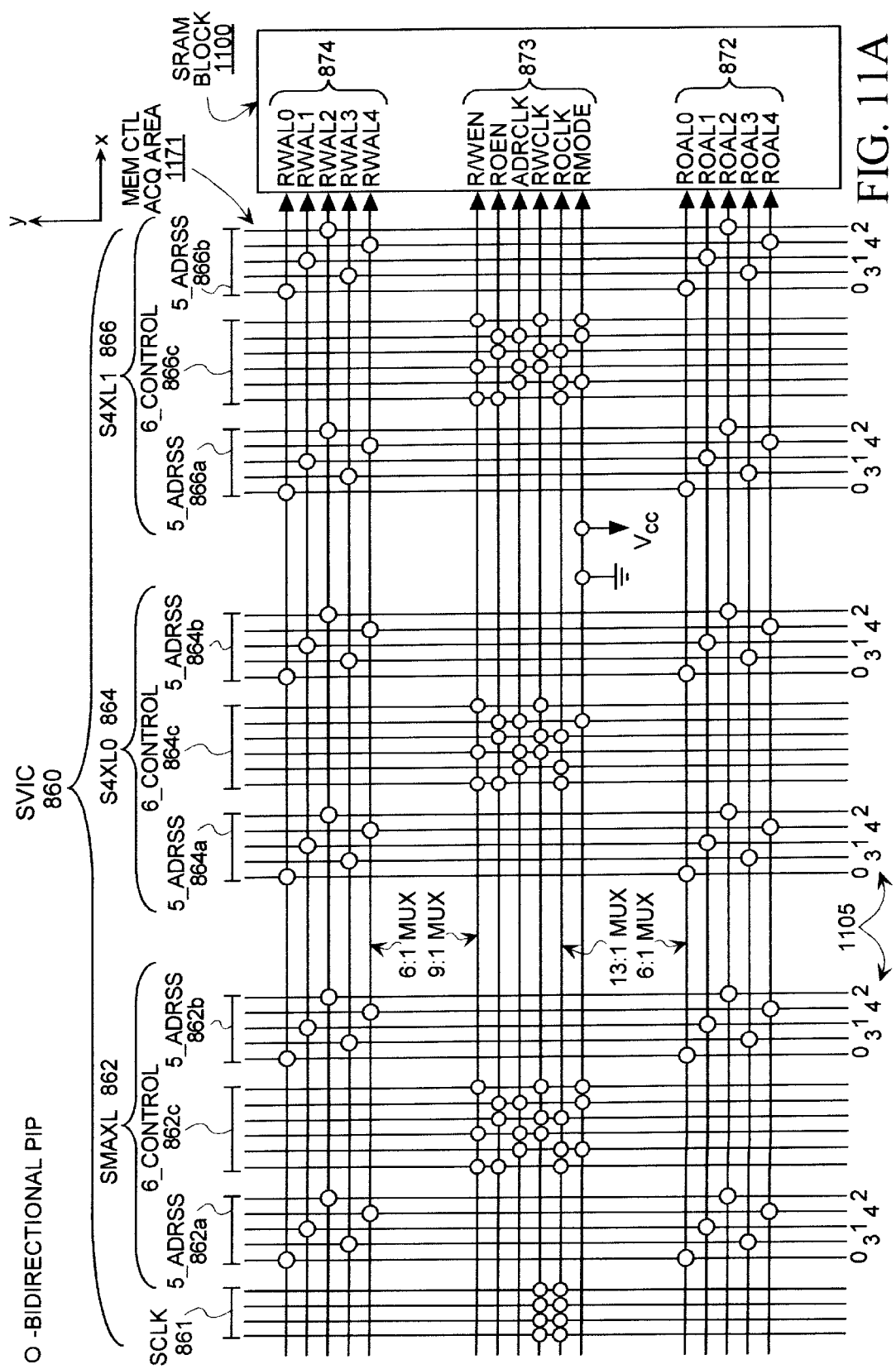
FIGS. 11A–11B illustrate exemplary patterns of PIP's for a controls-transfer multiplexer area at a crossing of SVIC lines with controls-acquiring terminals of an SRAM block.

Referring to FIG. 11A, there is shown one implementation of memory control acquisition area 1171 corresponding to area 871 of FIG. 8. FIG. 11A may be placed directly below and in alignment with FIG. 10 to see the continuation of the SVIC bus 860 from FIG. 10 into FIG. 11A.

The SRAM block shown at 1100 in FIG. 11A corresponds in one embodiment, to the structure 900 shown in FIG. 9. Signals of control port 873 are identified with the same names as those used on control lines 931–935 of FIG. 9. The five address signals of the Port_1 address bus 874 are respectively identified as RWAL0 through RWAL4, the last being the most significant (MSaB). Similarly, address signals of the Port_2 address bus 872 are respectively identified as ROAL0 through ROAL4, where the last is the most significant.

As seen at 1105, the bit significance assigned to each of the address components of SVIC 860 correspond with the bit significance of the address ports in SRAM block 1100 due to the placement of the PIP's of FIG. 11A along each of respective address-carrying components 862a, 862b, 864a, 864b, 866a and 866b. Each address input line such as RWAL0 defines a 6-to-1 multiplexer for acquiring a respective address signal.

Except for the RWCLK and ROCLK lines, the other four control acquiring lines of port 873 each define a 9-to-1 control acquiring multiplexer. Each of the control-sourcing vertical lines in memory control acquisition area 1171 is loaded with a respective three PIP's (except for 2 lines in component 864c). Each of the vertical address lines and the SCLK lines is loaded within area 1171 with the respective two PIP's. Clock-acquiring lines RWCLK and ROCLK each define 13-to-1 multiplexers. The RMODE input line may be user-configured to remain tied to ground (logic '0') or to Vcc (logic '1') instead of being dynamically changeable on the fly.

It is, of course, understood that the PIP distribution shown in memory control acquisition area 1171 of FIG. 11A is but one of many possible variations. Other arrangements are contemplated, particularly those that load each of the horizontal, control/address acquiring line with a corresponding same number of PIP's and that further loads each vertical control/address sourcing line with a same number of PIP's.

Figure 11B:
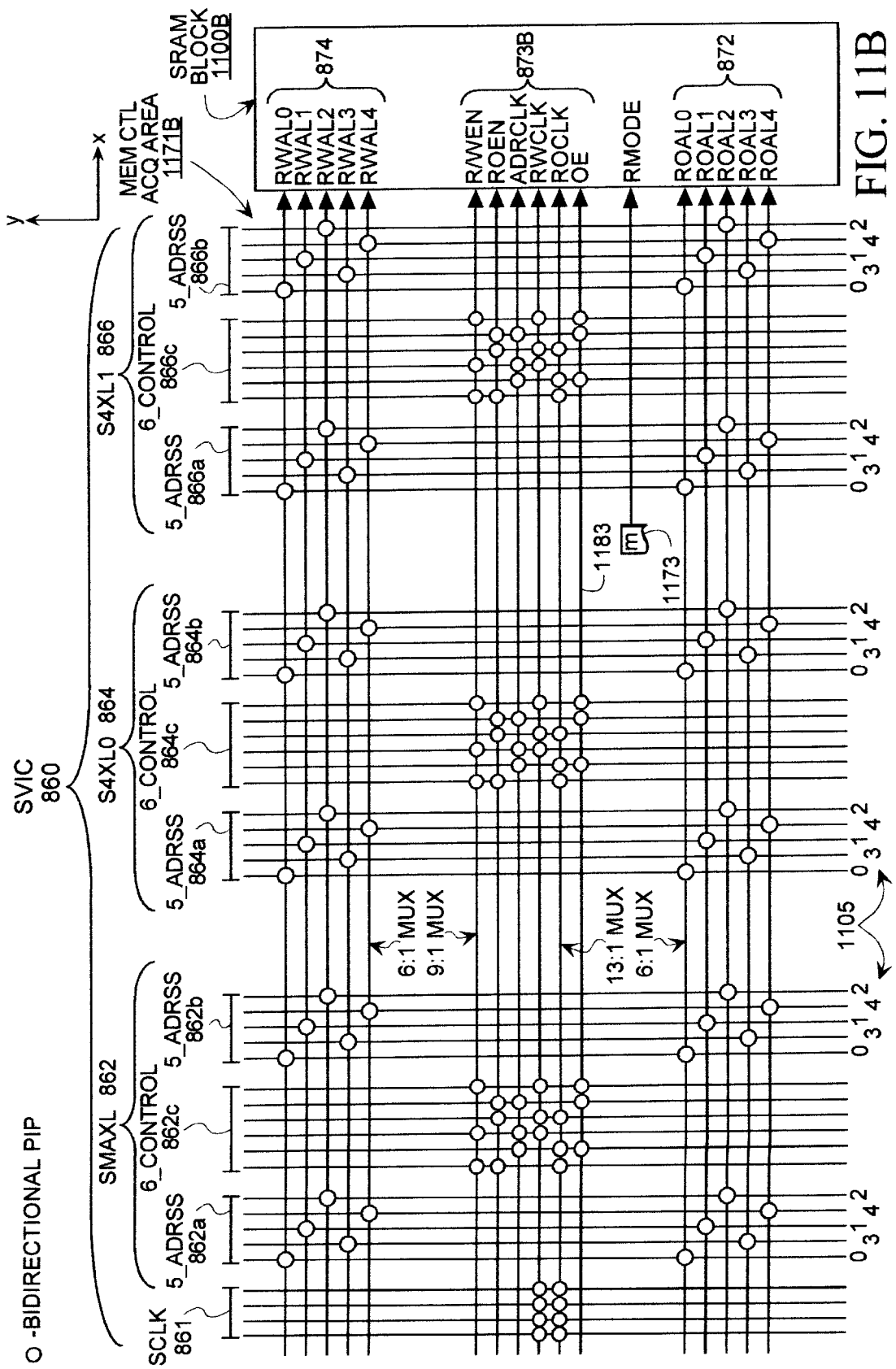

FIG. 11B illustrates a second implementation of memory control acquisition area 1171B corresponding to area 871 of FIG. 8. The SRAM block shown at 1100B corresponds in one embodiment, to the structure 900 shown in FIG. 9 except that the OE signal (883 in FIG. 9) is acquired by way of line 1183 from the SVIC instead of by way of area 878 (FIG. 8) from an adjacent HIC. The RMODE signal is provided from additional configuration memory portion 1173 instead of by way of SVIC 860. This means that RMODE cannot be changed on the fly as in the case of FIG. 11A. On the other hand, the OE signal (1183) can be broadcast vertically down SVIC 860 for simultaneous acquisition by multiple SRAM blocks of a same memory channel (LMC or RMC) via their respective lines 1183. Other signals of control port 873B are identified with the same names as those used in port 873 of FIG. 11A.

Figure 12:
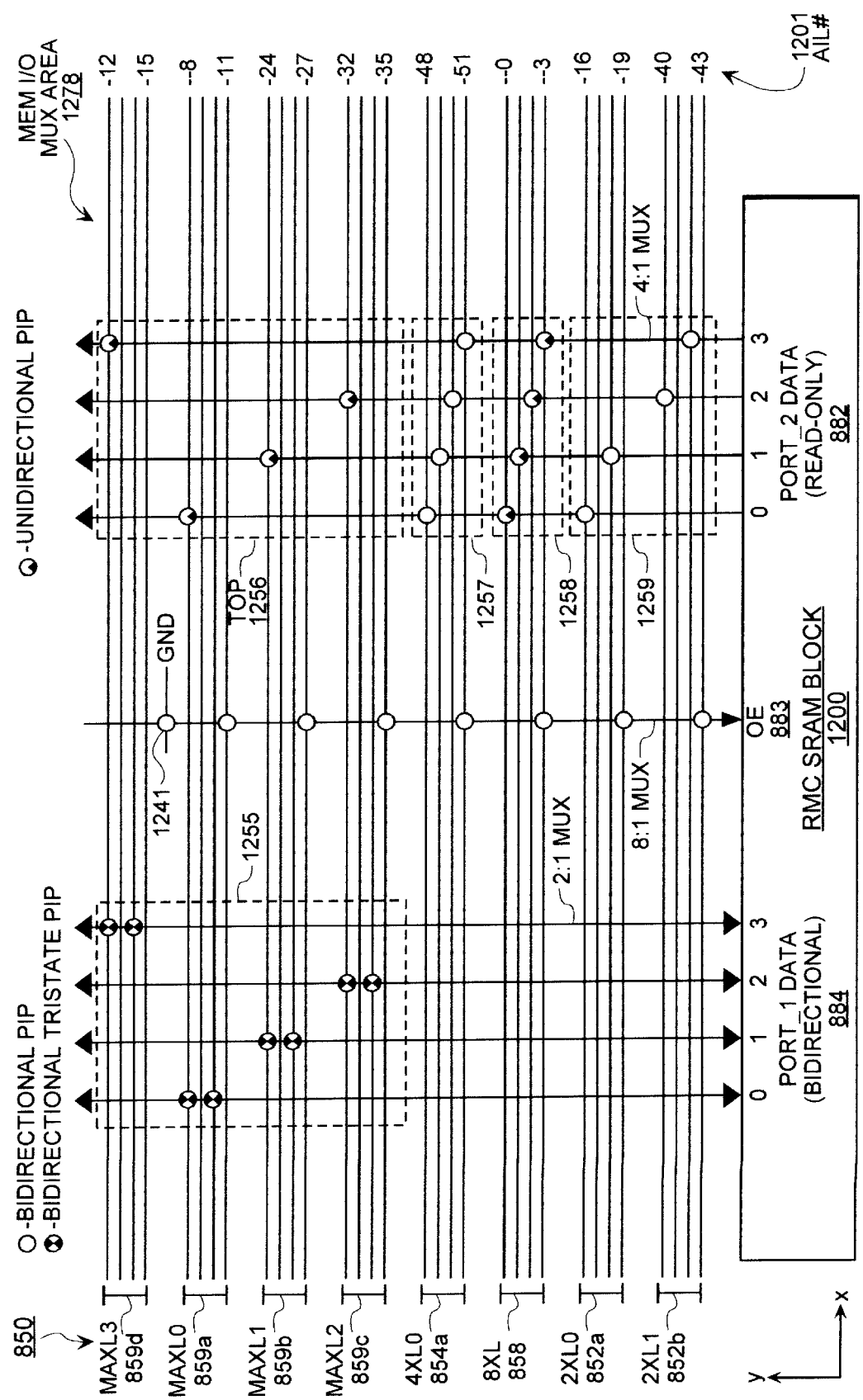
FIGS. 12–13 illustrate exemplary patterns of PIP's for data-transfer multiplexer areas at crossings of right and left memory columns with HIC lines.

Referring to FIG. 12, there is shown one implementation 1278 of a memory I/O multiplexer area corresponding to area 878 of FIG. 8. SRAM block 1200 corresponds in one embodiment, to an implementation such as 900 (FIG. 9) in a write memory channel (RMC). Of course, if the embodiment of FIG. 11B is used, the OE line 883 and its respective connections would be removed from FIG. 12 (and also from next-described FIG. 13).

Dashed box 1255 surrounds a first set of user-configurable PIP's that permit respective coupling of the Port_1 data bits 0–3 (the last being the MSB) to respective longline sets MaxL0 (859a), MaxL1 (859b), MaxL2 (859c) and MaxL3 (859d), and more specifically to lines of the TOP set (AIL's #8, #24, #32 and #12) and/or of the 3RD set (AIL's #10, #26, #34 and #14) of the adjacent HIC. Each of the bidirectional Port_1 data lines of area 1278 defines a 2-to-1 multiplexer for purposes of input (writing data) and a 2-to-1 demultiplexer for purposes of output (reading data). In one embodiment, bidirectional tristateable PIP's are used as indicated by the double-V in-a-circle icons of area 1255. In the latter case, the PIP_EN line of such tristateable PIP's is driven by read-enabling line 943 of FIG. 9. Of course, other implementations of bidirectional PIP's may be alternatively used in area 1255.

OE line 883 (if present, as in the embodiment of FIG. 11A) defines an 8-to-1 multiplexer with respective PIP's coupled to each of the following HIC line sets: MaxL0 (859a-BOT), MaxL1 (859b-BOT), MaxL2 (859c-BOT), 4×L (854a), 8×L (858), 2×L0 (852a) and 2×L1 (852b). In this particular embodiment there is no PIP for connecting OE line 883 to the MaxL3 (859d) longline set. There is a PIP 1241, however, for configurably forcing OE line 883 to logic '0' (GND) and for thereby disabling the Port_1 data bus 884 from outputting read data.

Dashed box 1256 surrounds user-configurable PIP's that permit coupling of the Port_2 output data 882 to respective longline sets MaxL1 through MaxL3. More specifically, data bit 0 of Port_2 can couple to TOP longline #8 of MaxL0, while respective other data bits 1–3 of the same Port_2 can respectively couple to TOP AIL's #24 (MaxL1), #32 (MaxL2) and #12 (MaxL3).

Dashed box 1257 contains four user-configurable PIP's for enabling coupling of the Port_2 data 882 onto respective four lines of the 4×L HIC set 854a.

Dashed box 1258 similarly contains four PIP's for providing user-configurable coupling of Port_2 data onto respective four lines of the 8×L HIC set 858.

Dashed box 1259 contains a distributed set of PIP's for providing user-configurable coupling of Port_2 data onto the 2×L0 (852a) and 2×L1 (852b) HIC sets.

In one embodiment, unidirectional tristateable PIP's are used for outputting data of Port_2 onto longlines as indicated by the single-V in-a-circle icons of TOP area 1256. In the latter case, the PIP_EN line of such tristateable PIP's is driven by read-enabling line 944 of FIG. 9. Of course, other implementations of bidirectional PIP's may be alternatively used in area 1256. Use of tristateable PIP's in box 1258 is also optional and such drives for the 8×L lines may be replaced with smaller, transmission gate implementations.

Note that within the memory-I/O area 1278, each unidirectional line of the Port_2 data bus 882 defines a 4-to-1 demultiplexer. Thus the capacitive loading onto each of the lines in bus 882 is essentially the same.

Figure 13:
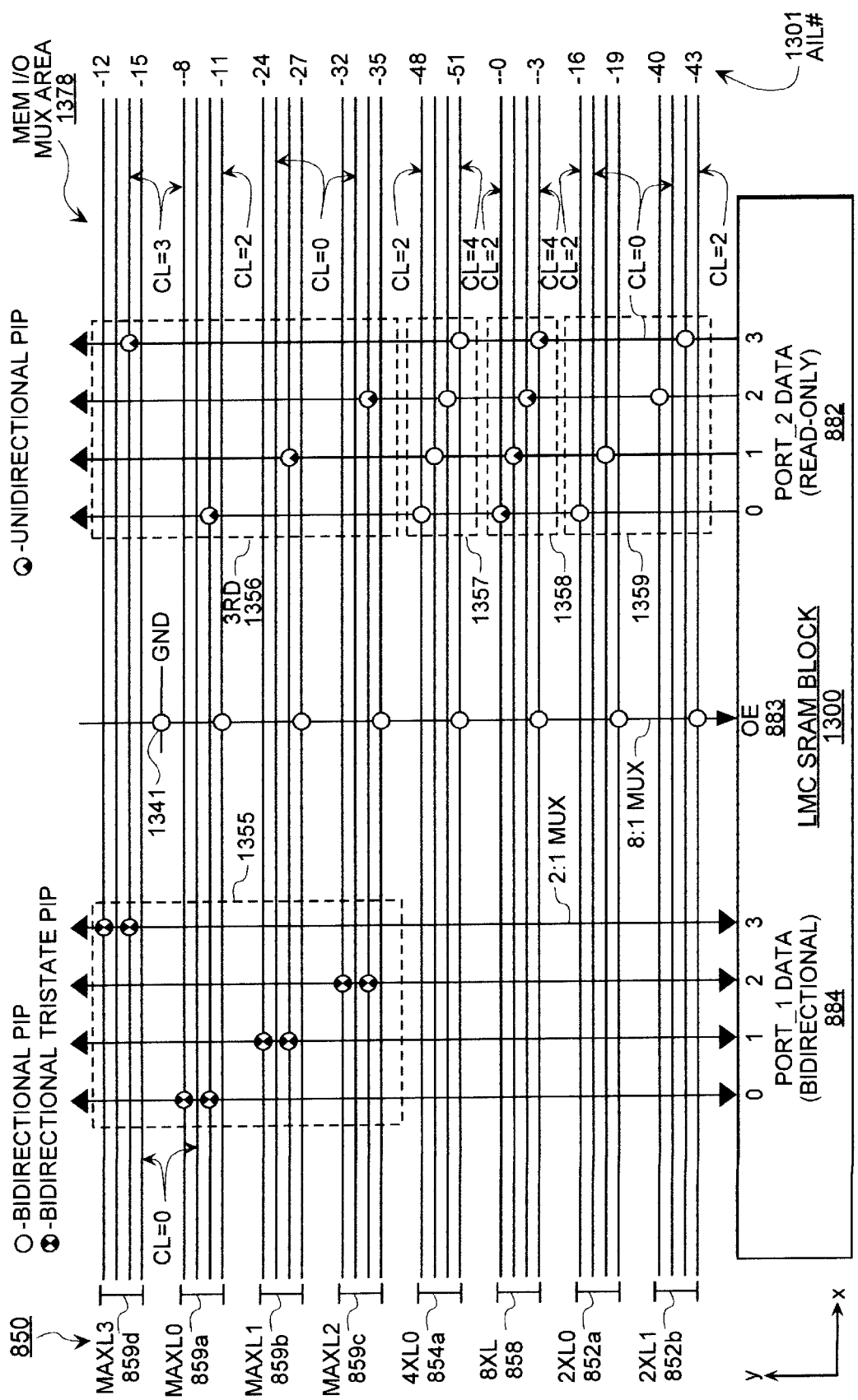

FIG. 13 shows the corresponding memory I/O multiplexer area 1378 in the left memory channel (LMC). Like reference numbers in the "1300" century series are used in FIG. 13 for elements having like counterparts numbered in the "1200" century series of FIG. 12. As such, the description of FIG. 12 is generally incorporated herein for FIG. 13.

One difference in FIG. 13 occurs within dashed box area 1356. Here, each of the PIP's is shifted down by two longlines as compared to the PIP's of TOP area 1256 of FIG. 12. Thus the PIP's of area 1356 provide configurable connectivity to the 3RD set (AIL's #10, #26, #34 and #14) of the adjacent HIC.

When FIGS. 12 and 13 are put side by side and considered in combination for the number of additional PIP's that are loaded onto each of the HIC lines as a result of combined areas 1278 and 1378, it is seen that lines such as AIL's #13, #15 and #9 bear no additional loading as a result of combined areas 1278 and 1378. This combined additional loading by areas 1278 and 1378 is designated in FIG. 13 as CL=0 (no additional, combined loading). Longlines such as #14 and #8 have a combined additional loading of 3 PIP's (CL=3) as a result of combined areas 1278 and 1378. Note that the CL=3 configuration of TOP and 3RD sets of longlines permit cascading of data from the Port_2 data output 882 of either SRAM block (1200 or 1300) for writing into the Port_1 data bus 884 of the SRAM block of the opposed memory column (to 1300 and 1200, respectively).

Longlines that are respectively used for OE control have an additional loading factor of 2 PIP's (CL=2). These longlines include BOT AIL's #11, #27 and #35.

Quad-length lines #48, #49 and #50 bear an additional load of CL=2. Quad-length line #51 has an additional load of CL=4. Octal-length lines #0, #1 and #2 similarly have an additional loading of CL=2 while quad-length line #3 has an additional loading of CL=4.

Double-length horizontal lines #16, #18, #19, #40, #42 and #43 each have an additional loading of CL=2. Double-length lines #17 and #41 have no additional loading (CL=0) due to combined areas 1278 and 1378. It is understood, of course, that variations on the teachings of FIGS. 12 and 13 may be used in accordance with the invention for corresponding loadings on the HIC lines and the data acquiring lines.

Figure 14A:
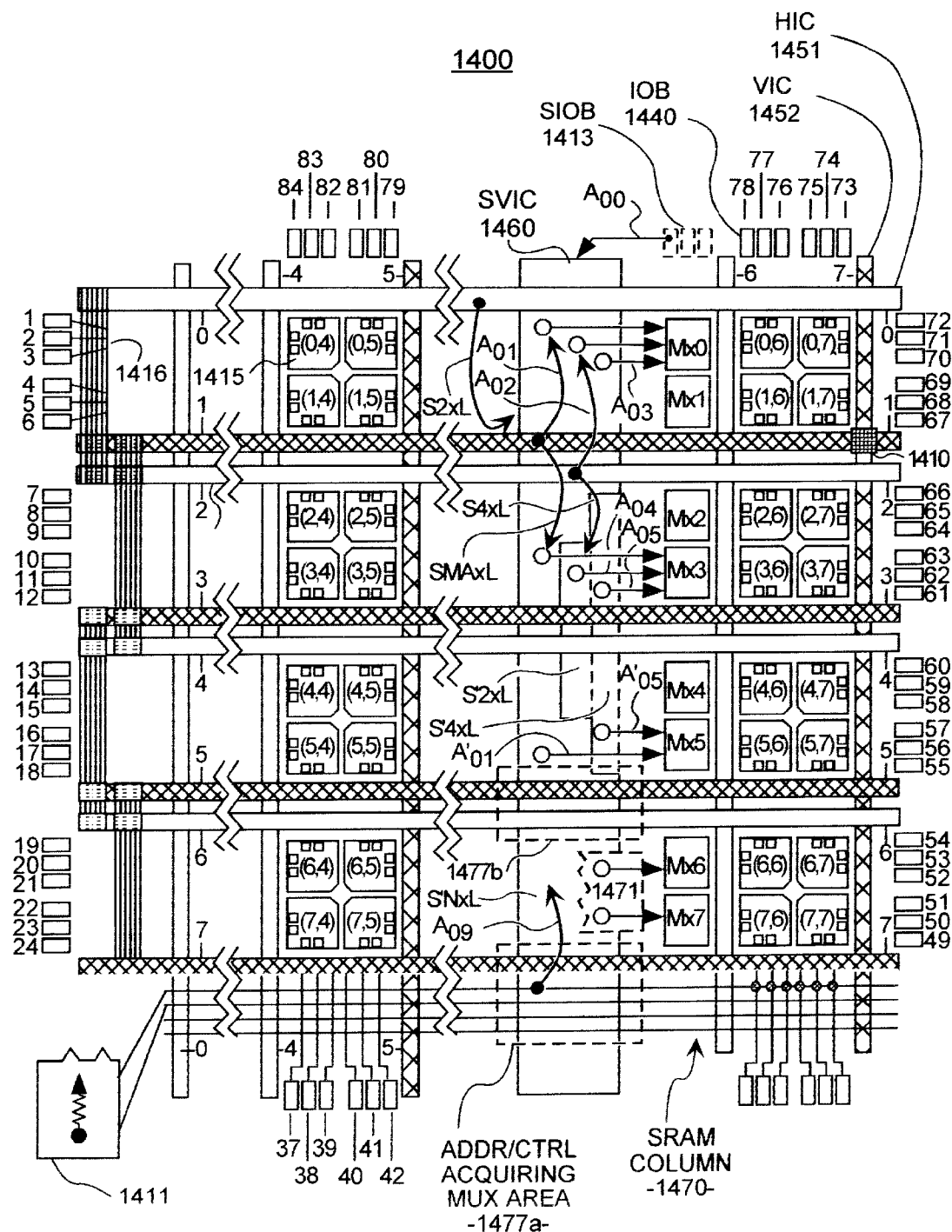
FIG. 14A is a block diagram of a first embodiment of FPGA devices, including those that conform with FIGS. 8–9, wherein respective flows may be seen for respective address, control and signals.

FIG. 14A illustrates a first monolithic system 1400 in accordance with the invention. System 1400 has both a column 1470 of SRAM blocks (M×0, M×1, M×2, . . . , M×n; where n>2) and a substantially adjacent, vertical interconnect channel (SVIC) 1460. SVIC 1460 is used for acquiring address and/or control signals from other interconnect resources (e.g., from crossing HIC's) and for transmitting the acquired signals to the SRAM blocks M×0–M×n on a broadcast or more localized (narrowcast) basis. SVIC 1460 may be alternatively referred to herein as a Memory Controls-conveying Interconnect Channel (MCIC) 1460.

In one specific class of embodiments, SVIC 1460 has signal broadcast and narrowcast resources substantially similar to those of SVIC (MCIC) 860 at 861–866 of FIG. 8. In an overlapping or otherwise extensible class of embodiments, SVIC 1460 couples to address/control acquiring resources 1477 substantially similar to those at 877, 1077 of respective FIGS. 8 and 10. Further, in an overlapping or otherwise extensible class of embodiments, SVIC 1460 couples to address/control forwarding resources 1471 substantially similar to those at 871, 1171 of respective FIGS. 8 and 11.

However, in more general embodiments, SVIC 1460 may be seen as having a diversified set of signal transmitting resources that may include comparatively long lines such as SMaxL lines (not individually shown) for broadcasting address and/or control signals to substantially all the SRAM blocks (M×0–M×n) in the adjacent column 1470. Such comparatively long lines are represented schematically in FIG. 14A by the hatched and long, vertical backbone at the left side of the symbol 1460 used in FIG. 14A to represent the special vertical interconnect channel (SVIC).

Additionally, in more general embodiments, the diversified signal transmitting resources of SVIC 1460 may further include comparatively shorter lines such as S2×L lines, S4×L lines and more generally, S'N×L lines for broadcasting address and/or control signals to a subset of N of the SRAM blocks; where N is an integer greater than one but less than the number of SRAM blocks of its respective column. N is preferably selected from a series formed by powers of two (e.g., 2, 4, 8, 16, etc.). Such comparatively shorter transmission lines are represented in FIG. 14A by the shorter, hatched or unhatched, vertically-extending portions of the SVIC symbol 1460, shown to the right of its long, vertical backbone. For example, the unshaded section labeled S'4×L represents one or more quad-length transmission lines that extend continuously adjacent to the four SRAM blocks, M×3–M×5. By way of further example, the unshaded section labeled S'2×L represents one or more double-length transmission lines that extend continuously along the two SRAM blocks, M×3–M×4. The diversified resources can be staggered or unstaggered relative to one another. In the specific embodiments represented by 860 of FIG. 8 they are unstaggered.

Yet further in the more general embodiments, the address/control acquiring resources 1477 (represented by dashed boxes 1477a, 1477b as examples) provide users with the ability to programmably select for acquisition onto SVIC 1460, general interconnect signals obtained from orthogonal lines that cross with SVIC 1460. The address/control acquiring resources 1477 are preferably formed with partially-populated PIP arrays rather than fully-populated crossbar arrays. This helps to reduce capacitive loading on the crossing lines.

Yet further in the more general embodiments, the address/control forwarding resources 1471 (represented by a like-labeled, dashed box 1471 as an example) provide users with the ability to programmably select which on-SVIC signals will be transferred to adjacent address/control input sections of adjacent SRAM blocks (M×0–M×n). Thus the example illustrated by dashed box 1471 can selectively transfers signals from its overlapped, generic S'N×L lines or SMaxL lines of the SVIC 1460 to blocks M×6 and M×7. Like means are understood to exist adjacent to each further duet or other subset of the SRAM blocks. The address/control forwarding resources 1471 are preferably formed with partially-populated PIP arrays rather than fully-populated crossbar arrays. This helps to reduce capacitive loading on the crossing lines.

The data bits that are either output by each SRAM block (M×0–M×n) during a read operation or are input by each SRAM block (M×0–M×n) during a write operation may be transferred by way of an adjacent HIC to or from a corresponding data sink or source such a VGB or an IOB. The VGB at 1415 for example may serve as a data sink (consumer) or source (originator) for data exchanged with SRAM block M×0 by way of HIC 1451.

The address bits that are acquired by each SRAM block (M×0–M×n) may come all from a single type of SVIC lines, such as all from SMaxL lines or all from S4×L lines; or some may come from one type (e.g., more significant bits coming from SMaxL lines) while others of the bits may come from a different type (e.g., less significant bits coming from S2×L lines), this being defined by user-programming of the configuration memory of the FPGA array.

By way of a more concrete example, the full address signal of SRAM block M×0 may be provided in one configuration as a set of parallel bits including a most significant bit (MSB) named $A_{01}$ and less significant bits named $A_{02}$ and $A_{03}$. The most significant $A_{01}$ bit may be selectively acquired from the HIC(1) general channel as indicated by the circle-shaped middle of the acquisition path denoted as '$A_{01}$', then passed onto and transmitted along an SMaxL line of SVIC 1460, and finally forwarded to SRAM block M×0 by way of a corresponding address/control forwarding resource (1471, which is represented as a first PIP at the corresponding, upper arrow end of acquisition path '$A_{01}$'). The same SMaxL line of SVIC 1460 may additionally convey the most significant $A_{01}$ bit to other SRAM blocks such as M×3 and M×5. This is represented in FIG. 14A by the lower, arrow end of acquisition path '$A_{01}$'. Alternatively, a different user-configuration of the same FPGA device 1400 may cause M×5 to pick up its most significant bit $A'_{01}$ from a SMaxL line other than the one that carries the MSB of M×0. When each, so-forwarded MSB flips, all the SRAM blocks that are configured to respond to that MSB (e.g., M×0–M×5), may simultaneously begin reading from or writing to a new address space, which space is defined by the flipped MSB (e.g., $A_{01}$ or $A'_{01}$).

The next less significant bit, $A_{02}$ of block M×0 may be selectively acquired from the HIC(2) general channel as indicated by the circle-shaped middle of the acquisition path denoted as '$A_{02}$' and also as 'S4×L', then passed onto and transmitted along the corresponding S4×L line of SVIC 1460, and finally forwarded to SRAM block M×0 by way of a corresponding address/control forwarding resource (1471, represented as a second PIP at the corresponding, upper arrow end of acquisition path '$A_{02}$'). The same S4×L line of SVIC 1460 may additionally convey the less significant $A_{02}$ bit to other SRAM blocks such as M×1. This is represented in FIG. 14A by the lower, arrow end of acquisition path '$A_{02}$'.

The even less significant bit, $A_{03}$ of block M×0 may be selectively acquired from the HIC(0) general channel as indicated by the circle-shaped upper end of the acquisition path denoted as 'S2×L', then passed onto and transmitted such a S2×L (or longer) line of SVIC 1460, and finally forwarded to SRAM block M×0 by way of a corresponding address/control forwarding resource (1471, represented as a third PIP at corresponding site in the figure). The same S2×L (or other) line of SVIC 1460 may additionally convey the even less significant $A_{03}$ bit to other SRAM blocks such as M×1. Due to space limitations in FIG. 14A, the S2×L (or longer) line of SVIC 1460 which conveys $A_{03}$ is shown outside the SVIC although it is understood to be part of SVIC 1460.

For this given example concerning address bits, $A_{01}$, $A_{02}$ and $A_{03}$, note that either a first VGB such as one of VGB(1,4) and VGB(1,7); or a first IOB such as one of IOB(6), IOB(7), IOB(72) and IOB(61) can be the source of the most significant $A_{01}$ bit that appears on HIC(1). The IOB's may, of course, utilize their respective dendrite structures such as the one illustrated at 1416 to transfer the $A_{01}$ bit onto HIC(1). The VGB's may produce the $A_{01}$ bit as part of a result signal produced by adders or counters implemented within those VGB's. In contrast, the IOB's may produce the $A_{01}$ bit from an externally computed and supplied signal.

Alternatively, any one of a plurality of general switchboxes on HIC(1), such as the exemplary channels-interconnecting switchbox shown at 1410 (near IOB 67), can be the source of the most significant $A_{01}$ bit. If a peripheral switchbox such as 1410 is used, a NOR line within the right-side peripheral VIC 1452 may be an originator of that most significant $A_{01}$ bit. This means that the $A_{01}$ bit may flip in response to a wired NOR function performed by such a NOR line within peripheral VIC 1452.

Alternatively, in one embodiment, a horizontal NOR line within the bottom-side peripheral HIC (number 7 in this example) may be an originator of that most significant address bit. In such a later case, the signal acquiring multiplexer area 1477a would include one or more PIP's for transferring horizontal NOR line results to further vertical lines in SVIC 1460. The corresponding address bit (denoted as $A_{09}$ in the illustrated example) may be caused to flip in response to a wired NOR function performed by a programmably-selected NOR line within peripheral HIC(7). Alternatively, the same line may function essentially as a horizontal MaxL line, as is indicated by symbol 1411. See 7D11 of FIG. 7D.

In further consideration of this given example concerning address bits, $A_{01}$, $A_{02}$ and $A_{03}$, note that because $A_{02}$ comes from HIC(2), either a first VGB such as one of VGB(2,5) and VGB(2,6); or a first IOB such as one of IOB(1), IOB(12), IOB(66) and IOB(67) can be the source of the $A_{02}$ bit that appears on HIC(2). Also, a general switchbox (not shown) along HIC(2) may serve as the source. In the case of VGB(2,5), it may be part of an adder or counter chain that further includes VGB(1,5) where VGB(1,5) provides the more significant $A_{01}$ bit.

While the above description has focused on the acquisition of address bits for SRAM column 1470, substantially similar structures and methods may be provided and used for the acquisition of control bits for SRAM column 1470. The SRAM blocks (M×0–M×n) may be single or multi-ported as desired. In the case where multi-ported SRAM blocks are used, such as in the example of FIG. 8, the SVIC 1460 should preferably include a symmetrically balanced set of vertical lines for simultaneously and equivalently delivering independent or overlapping address signals to each of the multiple ports of each SRAM block (M×0–M×n). Control-carrying lines may be shared by multiple ports so as to reduce the number of wires included in SVIC 1460.

If high-speed response to external signals is desired, the optional SIOB's such as at 1413 may be provided in FPGA device 1400. In such an embodiment, address signals (represented as $A_{00}$) and/or control signal may be routed immediately from SIOB's 1413 to programmably-selected lines of SVIC 1460 rather than being transferred through an intervening HIC.

Figure 14B:
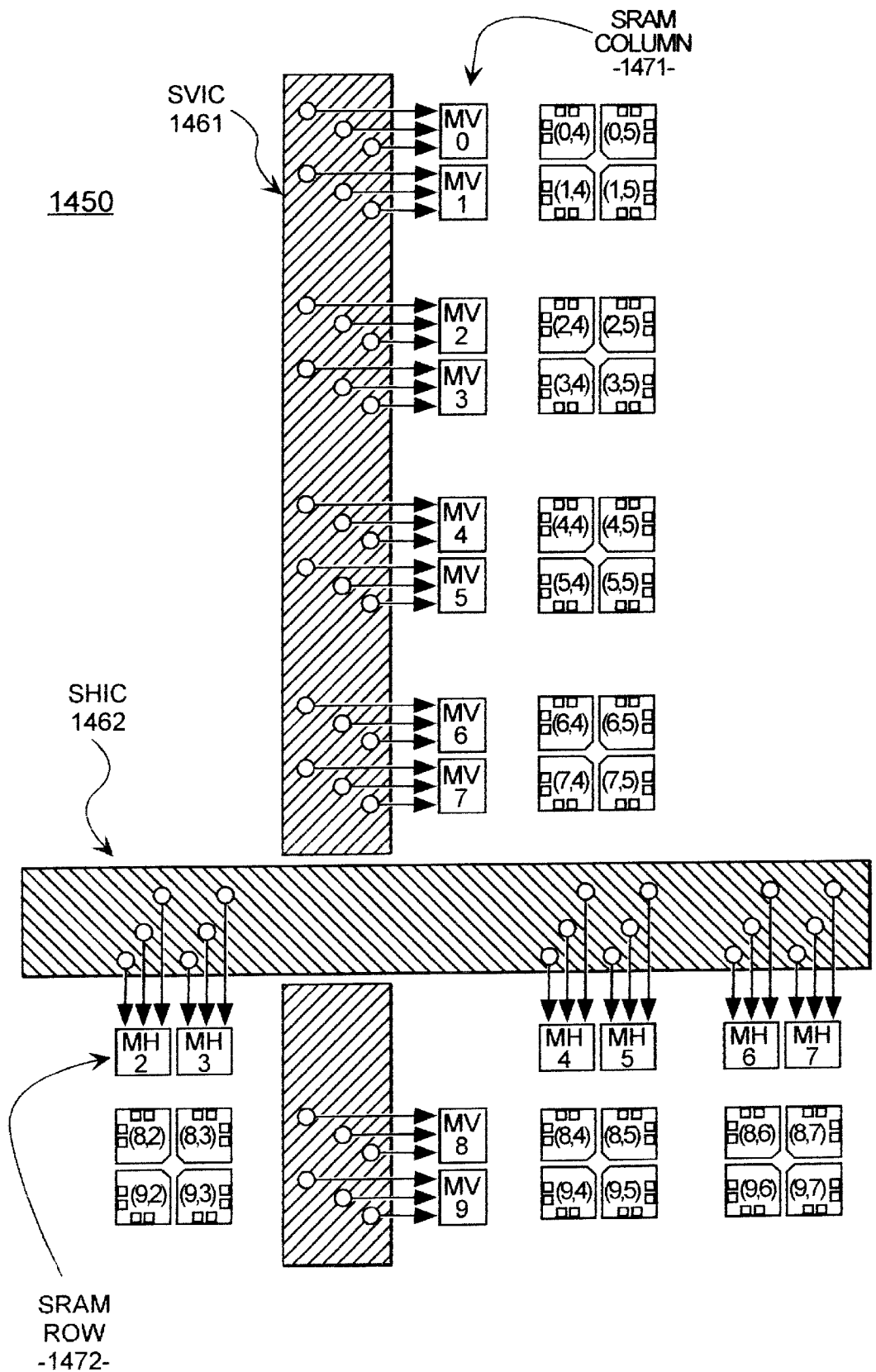
FIG. 14B is a block diagram of a second embodiment of FPGA devices having both vertically and horizontally-extending SRAM block arrays.

Referring to FIG. 14B, a second monolithic, integrated circuit system 1450 in accordance with the invention is shown. System 1450 comprises at least one column 1471 of SRAM blocks (MV0, MV1, MV2, . . . , MVn; where n>2) and at least one row 1472 of SRAM blocks (MH0, MH1, MH2, . . . , MHn'; where n'≧2). System 1450 further comprises for each column (e.g., 1471) of SRAM blocks, a substantially adjacent, vertical interconnect channel (SVIC) 1461. System 1450 yet further comprises for each row (e.g., 1472) of SRAM blocks, a substantially adjacent, horizontal interconnect channel (SHIC) 1462. Each SVIC (e.g., only one shown at 1461) is used for acquiring address and/or control signals from other interconnect resources (e.g., from crossing HIC's) and for transmitting the acquired signals to the SRAM blocks MV0–MVn of the corresponding memory column (e.g., only one shown at 1471) on a broadcast or more localized (narrowcast) basis. Similarly, each SHIC (e.g., only one shown at 1462) is used for acquiring address and/or control signals from other interconnect resources (e.g., from crossing VIC's) and for transmitting the acquired signals to the SRAM blocks MH0–MHn' of the corresponding memory row (e.g., only one shown at 1472) on a broadcast or more localized (narrowcast) basis.

As seen in FIG. 14B near VGB(8,4), the memory blocks at crosspoints of the SVIC's and SHIC's do not need to overlap. SRAM blocks MV8 and MV9 of column 1471 face the left sides of VGB(8,4) and VGB(9,4). SRAM blocks MH4 and MH5 of row 1472 face the top sides of VGB(8,4) and VGB(8,5). Other aspects of second monolithic, integrated circuit system 1450 follow those of the above described system 1400 (FIG. 14A) and therefore do not have to be repeated here again. One difference however is that the second system 1450 can better support VGB arrays in which carry signals (see element 421b of FIG. 3) can propagate horizontally as well as vertically form VGB to VGB. In the latter, horizontal-propagation supporting system, address counters may be built from rows (horizontal arrays) of VGB's as easily as from columns (vertical arrays) of VGB's. The resulting counter output bits may then be coupled to adjacent VIC's (e.g., 160 of FIG. 1) for acquisition by the orthogonally-crossing SHIC 1462 of FIG. 14B. Thus, the embodiment 1450 of FIG. 14B allows for a more symmetrical distribution of place and route elements. The place and route elements may be equally distributed to extend in the vertical or horizontal direction.

Figure 15A:
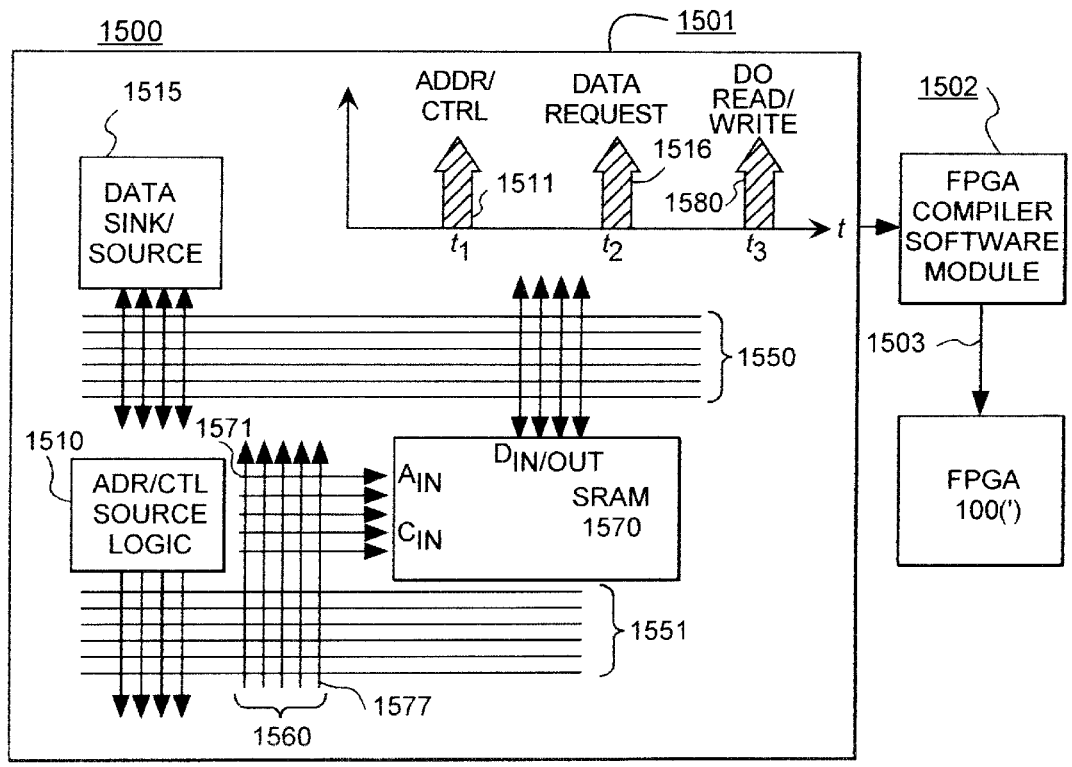
FIGS. 15A–15B show a structure and flow chart for FPGA-configuration software that takes advantage of the ability to configurably route respective address/control signals and data signals in FPGA devices that conform to the present invention.
Figure 15B:
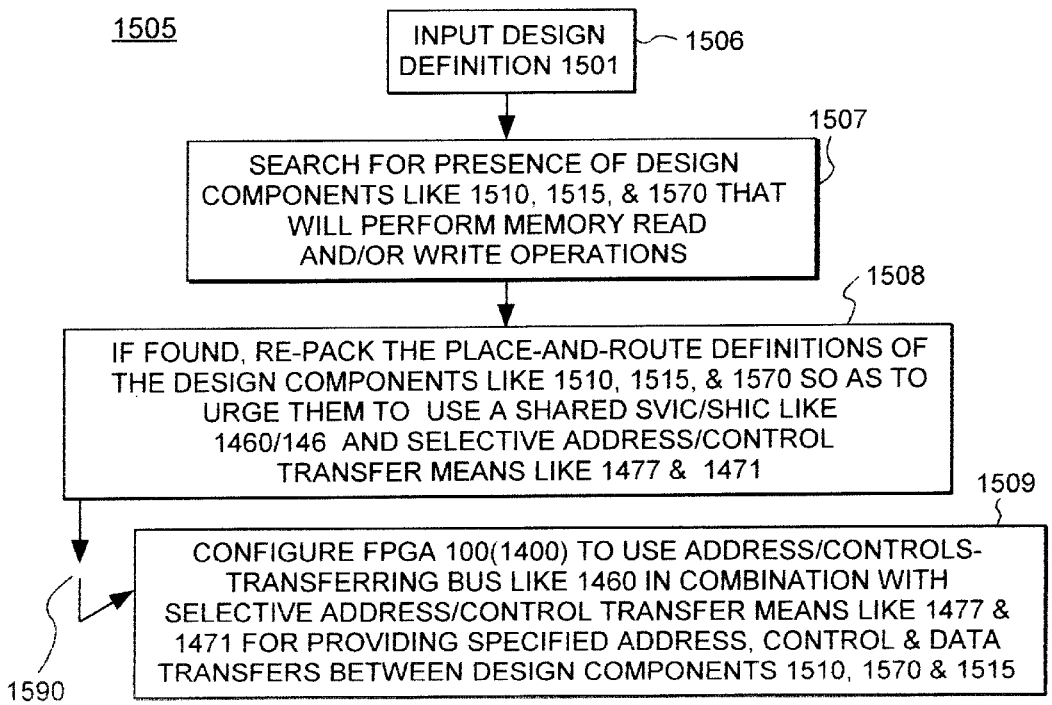

Referring to FIGS. 15A–15B, shown there are an FPGA configuring process and a flow chart of a software process for causing one or more of the operations of FIGS. 14A–14B to occur when a Variable Grain Architecture FPGA array of the invention is configured.

More specifically, FIG. 15A is a schematic diagram of an FPGA configuring process 1500 wherein a predefined design definition 1501 is supplied to an FPGA compiling software module 1502. Module 1502 processes the supplied information 1501 and produces an FPGA-configuring bitstream 1503. Bitstream 1503 is supplied to an FPGA such as 100 or 1400/1450 of respective FIGS. 1 and 14A,B for accordingly configuring the FPGA.

The design definition 1501 may include a SRAM module 1570, an address/control-signal sourcing module 1510 and a data-I/O module 1515.

Although it may appear from the drawing that modules 1510, 1515 and 1570 are pre-ordained to respectively correspond to elements 1410 (address and/or control source), 1415 (data sink and/or source) and 1470 (SRAM blocks) of FIG. 14A, that is not inherently true. The design definition 1501 may be expressed in a variety of ways which do not pre-ordain such an outcome.

Modern circuit designs typically start with a Very High-level Descriptor Language (VHDL) or the like for defining the behavior of a to-be-implemented design at a level that is significantly higher than a gate-level or transistor level description. High level design definitions are often entered by designers into computer-implemented programs that are commonly referred to by names such as VHDL synthesis tools. The output of the VHDL synthesis tools may be in the form of one or more computer files that constitute VHDL descriptions of the to-be-implemented design. VHDL description files may include one or more different kinds of constructs including VHDL Boolean constructs that define part or all of the design. The complexity of the Boolean functions can span a spectrum having very simple ones (e.g., those having 1–3 input terms) at one end to very complex ones at the other end. The high level definitions generally do not specify implementational details. That job, if an FPGA is to be used for implementation, is left to the FPGA compiler software module 1502.

In the illustrated design definition 1501, there is a specification for the address/control-source module 1510 to compute and/or supply one or more of a valid address signal and control signal to an address/control input section ($A_{in}/C_{in}$) of the SRAM module 1570 at some general first time point $t_1$. This presentation of a valid address and/or control signal is symbolically represented in FIG. 15A by presentation step symbol 1511.

Further in the illustrated design definition 1501, there is a specification for the data input/output module 1515 to request reading or writing of a valid data signal respectively from or to a data input/output ($D_{in/out}$) part of the SRAM module 1570 at some second general time point, $t_2$. This request for a data exchange is symbolically represented in FIG. 15A by data-requesting step symbol 1516. The second time point, $t_2$ can be before, after or coincident with the first time point, $t_1$. FIG. 15A shows $t_2$ following $t_1$ merely for sake of example.

Yet further in the illustrated design definition 1501, there is a specification for a memory read or memory write operation to occur at some third general time point, $t_3$ based on the presentation of valid address, control and exchange request signals in respective steps 1511 and 15161. This execution of a memory read or memory write operation is symbolically represented in FIG. 15A by execution step symbol 1580.

It should be apparent from the way the elements in area 1501 were drawn that, ultimately, the address and/or control sourcing module 1510 will present address and/or control signals onto HIC bus 1551 and that these will then be transferred onto SVIC bus 1560 by way of first cross-over means 1577 for presentation to the address/control input section ($A_{in}/C_{in}$) of the SRAM module 1570 by way of second cross-over means 1571, this occurring at a first time point corresponding to $t_1$. Also, when the design 1501 is ultimately implemented, the data I/O module 1515 will exchange data signals with the data input/output ($D_{in/out}$) part of the SRAM module 1570 by way of HIC bus 1550 at time points corresponding to $t_2$ and $t_3$. However the road to this ultimate goal is not embarked upon until the FPGA compiling software module 1502 inputs the design definition 1501 and module 1502 further processes it as will now be described.

FIG. 15B illustrates a flow chart 1505 of a process that attempts to realize the above-described concepts of FIGS. 14A, 14B. A design definition such as 1501 is input at step 1507 into the FPGA compiler software module 1502. Numerous processing steps may take place within software module 1502.

Step 1507 is one of those steps in which the software module 1502 searches through the input design definition (e.g., 1501) for the presence of design components like 1570, 1510 and 1515 that will perform memory read and/or write operations. The search criteria may optionally require the searched-for design components to operate in a nibble-wide or word-wide parallel mode so that they may share one synchronizing clock edge for validating plural address or data bits.

At step 1508, if two or more design components like 1570, 1510 and 1515 are found to satisfy the search criteria, the place-and-route definitions of those design components are repacked so as to urge those definitions toward ultimately ending up using an SRAM array like 1470 of FIG. 14A (or 1471, 1472 of FIG. 14B) in combination with an address/controls-transferring bus like 1460 of FIG. 14A (or 1461, 1462 of FIG. 14B) and in further combination with programmably selective, address/control transfer means like 1477a–b and 1471 of FIG. 14A.

It is understood by those skilled in the art of FPGA configuration that many design factors may pull the design components like 1570, 1510 & 1515 away from or into operative placement next to shared buses corresponding with HIC's 1550 and 1551, where HIC 1550 is operatively adjacent to the data input/output ($D_{in/out}$) part of the SRAM module 1570. Some overriding design considerations may push them apart from such an optimal arrangement. The urging factor produced in step 1508 may therefore be just one of numerous place and route weighting factors that pull one way or another to position the placed components in such cooperative alignment.

Dashed path 1590 represents many other processes within the software module 1502 wherein the original design definition 1501 is transformed by steps such as design-partitioning, partition-placements and interplacement routings to create a configuration file for the target FPGA 100 or 1400. Step 1509 assumes that at least one set of design components like 1570, 1510 & 1515 were found and were ultimately partitioned and placed together with minimal-time routing resources such as 1550, 1551 and 1577 so as to allow for the optimized use of an address/controls-transferring bus like 1460 of FIG. 14. In that case, at step 1509 the target FPGA 100(1400/1450) is configured to use a controls-transferring bus like 1460 of FIG. 14A (or 1461, 1462 of FIG. 14B) in further combination with one or more address/control acquisition and transfer means like 1477a, 1477b and 1471 of FIG. 14A for providing the specified address and control signal transfers that take place between design components like 1510 and 1570 in cooperation with the data exchange carried out by data sink/source module 1515.

The above disclosure is to be taken as illustrative of the invention, not as limiting its scope or spirit. Numerous modifications and variations will become apparent to those skilled in the art after studying the above disclosure.

Given the above disclosure of general concepts, principles and specific embodiments, the scope of protection sought is to be defined by the claims appended hereto.

What is claimed is:

1. A field programmable gate array (FPGA) device comprising:
   (a) a first plurality P1 of repeated logic units wherein:
       (a.1) each said logic unit is user-configurable to acquire and process at least a second plurality P2 of input logic bits and to responsively produce result data having at least a third plurality P3 of output logic bits,
       (a.2) said logic units are distributed among a plurality of horizontal rows and vertical columns, with each row of the plurality of rows having a fourth plurality P4 of said logic units and each column of the plurality of rows having a fifth plurality P5 of said logic units;
   (b) a sixth plurality P6 of horizontal interconnect channels (HIC's) correspondingly distributed adjacent to said horizontal rows of logic units, wherein:
       (b.1) each said horizontal interconnect channel (HIC) includes at least P3 interconnect lines, and
       (b.2) each said horizontal row of P4 logic units is configurably couplable to at least a corresponding one of the P6 HIC's at least for acquiring input logic bits from the corresponding HIC or at least for outputting result data to the corresponding HIC;
   (c) a seventh plurality P7 of vertical interconnect channels (VIC's) correspondingly distributed adjacent to said vertical columns of logic units, wherein:
       (c.1) each said vertical interconnect channel (VIC) includes at least P3 interconnect lines, and
       (c.2) each said vertical column of P5 logic units is configurably couplable to at least a corresponding one of the P7 VIC's at least for acquiring input logic bits from the corresponding VIC or at least for outputting result data to the corresponding VIC;
   (d) an embedded memory subsystem, wherein said embedded memory subsystem includes:
       (d.1) an eighth plurality P8 of memory blocks, and wherein:
           (d.1a) each said memory block is embedded within one of said rows of logic units and is configurably couplable to the corresponding HIC of said row for transferring storage data by way of the corresponding HIC of that row of P4 logic units;
           (d.1b) each of said memory blocks includes at least a first address-inputting section and/or a first control-inputting section for receiving respective address and control signals to which the memory block can respond; and
           (d.1c) at least a first subset of said memory blocks defines a respective first, vertically-extending column; and
   (e) a first memory controls-conveying interconnect channel (MCIC) extending adjacent to said first, vertically-extending column of memory blocks for acquiring at least one of memory address and memory control signals from other interconnect resources and for broadcasting and/or narrowcasting the acquired signals respectively to all or a programmably-defined subset of the memory blocks in the first, vertically-extending column of memory blocks.

2. A field programmable gate array device according to claim 1 wherein:
   (c.1c) each said memory block is organized as a ninth plurality P9 of addressable sets of storage data bits, where each addressable set of storage data bits includes at least P3 bits, said P3 number corresponding to the P3 number of output logic bits producible by each said logic unit.

3. A field programmable gate array device according to claim 2 wherein:
   (c.1c1) each of P2 and P3 is an integer equal to or greater than 4.

4. A field programmable gate array device according to claim 1 wherein:
   (a.3) groups of said logic units are further wedged together such that each group of logic units defines a logic superstructure; and
   (c.1c) groups of said memory blocks are also wedged together such that each group of memory blocks defines a memory superstructure that is configurably-couplable to a corresponding logic superstructure.

5. A field programmable gate array device according to claim 1 wherein:
   (c.1b1) there are at least two of said columns of embedded memory; and
   (c.2a) there are at least two of said Memory Controls-conveying Interconnect Channels (MCIC's), and each respective MCIC is for supplying address and/or control signals to a respective one of the at least two columns of embedded memory.

6. A field programmable gate array device according to claim 5 wherein:
   (c.1c) each said memory block has at least first and second data ports each for outputting storage data;
   (c.1d) each said memory block has at least first and second address ports each for receiving address signals identifying the storage data to be output by a corresponding one of the at least first and second data ports; and
   (c.1e) each MCIC includes first and second address-carrying components along which independent address signals may be respectively carried for application to respective ones of the first and second address ports of each memory block.

7. In a field programmable gate array device (FPGA) having a user-configurable interconnect network that includes a plurality of horizontal and vertical interconnect channels each with a diversified set of long-haul interconnect lines and shorter-haul interconnect lines, an embedded memory subsystem comprising:
   (a) a plurality of multi-ported memory blocks each arranged adjacent to a horizontal interconnect channel (HIC) of the interconnect network;
   wherein:
       (a.1) each multi-ported memory block includes a first, independently-addressable data port and a second, independently-addressable data port;
       (a.2) at least one group of said multi-ported memory blocks defines a respective first vertical memory column; and
   (b) a first Memory Controls-conveying Interconnect Channel (MCIC) extending adjacent to said first vertical memory column for acquiring at least one of memory address and memory control signals from other interconnect resources and for selectively broadcasting or narrowcasting one or more of the acquired signals respectively to all or a programmably-defined subset of the memory blocks in the first vertical memory column.

8. In an FPGA device having a plurality of variable grain, configurable logic blocks (VGB's) and interconnect resources including lines of diversified continuous lengths for interconnecting said VGB's, an embedded memory subsystem comprising:

(a) a plurality of memory blocks wherein each memory block includes at least a first address and control signals inputting section for receiving respective first address and control signals to which the memory block responds; and (b) a first Memory Controls-conveying Interconnect Channel (MCIC) extending adjacent to said plurality of memory blocks, said first MCIC being for acquiring at least one of memory address and memory control signals from other interconnect resources of the FPGA device and for selectively broadcasting or narrowcasting one or more of the acquired signals respectively to all or a programmably-defined subset of the memory blocks.

9. In an FPGA device having a configuration memory, a plurality of configurable logic blocks (CLB's) and general interconnect resources for interconnecting said CLB's in accordance with routing instructions stored in said configuration memory, an embedded memory subsystem comprising:

(a) a plurality of memory blocks wherein each memory block includes at least a first address inputting section and a controls inputting section for receiving respective first address signals and control signals to which the memory block responds; and (b) a first Memory Controls-conveying Interconnect Channel (MCIC) coupled to said plurality of memory blocks, said first MCIC being for selectively acquiring, in accordance with acquisition instructions stored in said configuration memory, at least one of memory address and memory control signals from other interconnect resources of the FPGA device and for selectively broadcasting or narrowcasting, in accordance with transfer instructions stored in said configuration memory, one or more of the acquired signals respectively to all or a programmably-defined subset of the memory blocks.

10. A method for use in an FPGA device having a configuration memory, a plurality of variable grain blocks (VGB's), diversified interconnect resources, and an embedded memory subsystem comprising a plurality of memory blocks situated for configurable coupling to the diversified interconnect resources, where the memory blocks each have at least one address input port and at least one data port, said method comprising the steps of:

(a) outputting a first address signal for conveyance by at least part of said interconnect resources;

(b) selectively acquiring the conveyed first address signal onto a Memory Controls-conveying Interconnect Channel (MCIC) that extends adjacent to at least a first plurality of the memory blocks; and (c) broadcasting or narrowcasting, in accordance with transfer instructions stored in said configuration memory, one or more of the acquired signals respectively to all or a programmably-defined subset of the memory blocks adjacent to the MCIC.

11. The method of claim 10 wherein said step (a) of outputting the first address signal includes the substep of:

(a.1) transmitting the first address signal through a channels-interconnecting switchbox onto an interconnect channel that extends orthogonally across the MCIC.

12. The method of claim 10 wherein said step (a) of outputting the first address signal includes the substep of:

(a.1) transmitting the first address signal from a VGB onto an interconnect channel that extends adjacent to the signal-sourcing VGB and further extends orthogonally across the MCIC.

13. The method of claim 10 wherein said step (a) of outputting the first address signal includes the substep of:

(a.1) transmitting the first address signal from an IOB onto an interconnect channel that extends from the signal-sourcing IOB to cross orthogonally with the MCIC.

14. The method of claim 10 wherein said step (a) of outputting the first address signal includes the substep of:

(a.1) transmitting the first address signal from a NOR-line of an interconnect channel that extends by a plurality of IOB's participating in a NOR function of the NOR-line, said NOR-line extending to cross orthogonally with the MCIC.

15. The method of claim 10 wherein said step (a) of outputting the first address signal includes the substeps of:

(a.1) transmitting the first address signal through a first of plural tristate drivers, where each of the tristate drivers has an output enabling terminal;

(a.2) providing an address-changing control signal that deactivates the output enabling terminal of the first tristate driver and enables the second of the tristate drivers.

16. A method for configuring an FPGA device having plural variable grain blocks (VGB's), configurable interconnect resources, and an embedded memory subsystem comprising one or more memory blocks situated for configurable coupling via the configurable interconnect resources to the VGB's, where the memory blocks each have at least one address input port for receiving supplied address bits, said method comprising the steps of:

(a) defining a first route through said interconnect resources from an address signal sourcing circuit of the FPGA device to the at least one address input port where said first route includes a Memory Controls-conveying Interconnect Channel (MCIC); and (b) defining a second route through said interconnect resources between a data input/output circuit of the FPGA device and a data input/output port of the memory block.

17. A method for producing configuration signals for configuring an FPGA device having plural variable grain blocks (VGB's), configurable interconnect resources, and an embedded memory subsystem comprising one or more memory blocks situated for configurable coupling via the configurable interconnect resources to the VGB's, where the memory blocks are each situated adjacent to at least one Memory Controls-conveying Interconnect Channel (MCIC) for receiving supplied address and/or control bits from the MCIC, said method comprising the steps of:

(a) inputting a design definition;

(b) searching the input design definition for the presence of one or more memory modules, address-sourcing modules, and data-using modules that will cooperate to perform a memory read or memory write operation; and (c) encouraging the creation in the configured FPGA of a shared signal route that transmits a shared address signal to the address input ports of plural memory blocks.

* * * * *